(12) United States Patent
Nikawa

(10) Patent No.: US 6,610,918 B2
(45) Date of Patent: Aug. 26, 2003

(54) DEVICE AND METHOD FOR NONDESTRUCTIVE INSPECTION ON SEMICONDUCTOR DEVICE

(75) Inventor: Kiyoshi Nikawa, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/095,858

(22) Filed: Mar. 12, 2002

(65) Prior Publication Data
US 2002/0105577 A1 Aug. 8, 2002

Related U.S. Application Data

(62) Division of application No. 09/407,221, filed on Sep. 24, 1999.

(30) Foreign Application Priority Data

Sep. 28, 1998 (JP) ............................................. 10-272788
Mar. 15, 1999 (JP) ............................................. 11-067744
May 13, 1999 (JP) ............................................. 11-133283

(51) Int. Cl.$^7$ ................................................ H01L 35/28
(52) U.S. Cl. ...................................................... 136/225
(58) Field of Search ..................... 438/14, 158; 136/212, 136/211; 257/735

(56) References Cited

U.S. PATENT DOCUMENTS

| 4,265,117 A | 5/1981 | Thoma et al. |
| 4,796,432 A | 1/1989 | Fixsen et al. |
| 5,055,140 A | 10/1991 | Kumada et al. |
| 5,156,688 A | * 10/1992 | Buhler ........................ 136/211 |
| 5,422,498 A | 6/1995 | Nikawa et al. |
| 5,698,852 A | 12/1997 | Tanaka et al. |
| 5,708,371 A | 1/1998 | Koyama |
| 5,772,325 A | 6/1998 | Hopson et al. |

FOREIGN PATENT DOCUMENTS

| DE | 196 52 789 A1 | 6/1981 |
| DE | 19725679 A1 | 1/1999 |

(List continued on next page.)

OTHER PUBLICATIONS

Nondestructive Wafer Inspection Utilizing SQUIDS, Schurig, et al., Proceeding of the Seventh International Conference o Defect Recognition And Image processing in semiconductors, pp. 149–152 XP0011006353, 1998, Bristol, UK Institute of physics Publishing, UK.

(List continued on next page.)

Primary Examiner—John F. Niebling
Assistant Examiner—Andre' C Stevenson
(74) Attorney, Agent, or Firm—Scully, Scott, Murphy & Presser

(57) ABSTRACT

A nondestructive inspection device (or method) is basically configured such that a laser beam (1300 nm) is irradiated on a surface (or back) of a semiconductor device chip to scan. Due to irradiation of the laser beam, a defect position is heated to cause a thermoelectromotive current, which induces a magnetic field. A magnetic field detector such as SQUID detects a strength of the magnetic field, based on which a scan magnetic field image is produced. A display device superimposes the scan magnetic field image on a scan laser microphotograph on a screen, so it is possible to perform defect inspection on the semiconductor device chip. Incidentally, a semiconductor device wafer is constructed to include a thermoelectromotive force generator and its wires, which are electrically connected to first-layer wires. By irradiation of the laser beam on the thermoelectromotive force generator, it is possible to detect a short-circuit defect, which lies between the first-layer wires. Further, it is possible to perform nondestructive inspection on a semiconductor integrated circuit, which is in an intermediate stage of manufacture before formation of bonding pads and which includes a closed circuit configured by a first-layer wire, including a thermoelectromotive force generating defect, a circuit via and an inspection via as well as a metal film, which is formed in a relatively broad range of a surface area and is used to form a second-layer wire.

19 Claims, 25 Drawing Sheets

FOREIGN PATENT DOCUMENTS

| | | |
|---|---:|---:|
| EP | 0 694 961 A1 | 1/1996 |
| JP | Hei 2-284439 | 11/1990 |
| JP | 04064625 | 3/1992 |
| JP | Hei 4-312942 | 11/1992 |
| JP | Hei 4-369849 | 12/1992 |
| JP | Hei 5-47929 | 2/1993 |
| JP | Hei 5-136240 | 6/1993 |
| JP | Hei 5-243535 | 9/1993 |
| JP | Hei 7-14898 | 7/1995 |
| JP | 07-167924 | 7/1995 |
| JP | Hei 8-255818 | 10/1996 |
| JP | Hei 8-316281 | 11/1996 |
| JP | Hei 10-170612 | 6/1998 |
| TW | 79152 | 7/1996 |

OTHER PUBLICATIONS

"OBIC Analysis Technique by Thermo Electro–motive Force", by Tohru Koyama, et al., ULSI Laboratory, Mitsubishi Electric Corp., pp. 2–7.

Derwent Publications Ltd., XP00200885, "Interval convertor deform temperature", *Phys. Measurements Res. Inst.*, dated Jul. 20, 1998.

Patent Abstracts of Japan Publication No.: 56070642, "Semiconductor Device", dated Dec. 6, 1981.

Derwent Publications Ltd., XP00200885, "Interval convertor deform temperature", *Phys. Measurements Res. Inst.*, dated Jul. 20, 1998.

Patent Abstracts of Japan Publication No.: 56070642, "Semiconductor Device", dated Dec. 6, 1981.

* cited by examiner

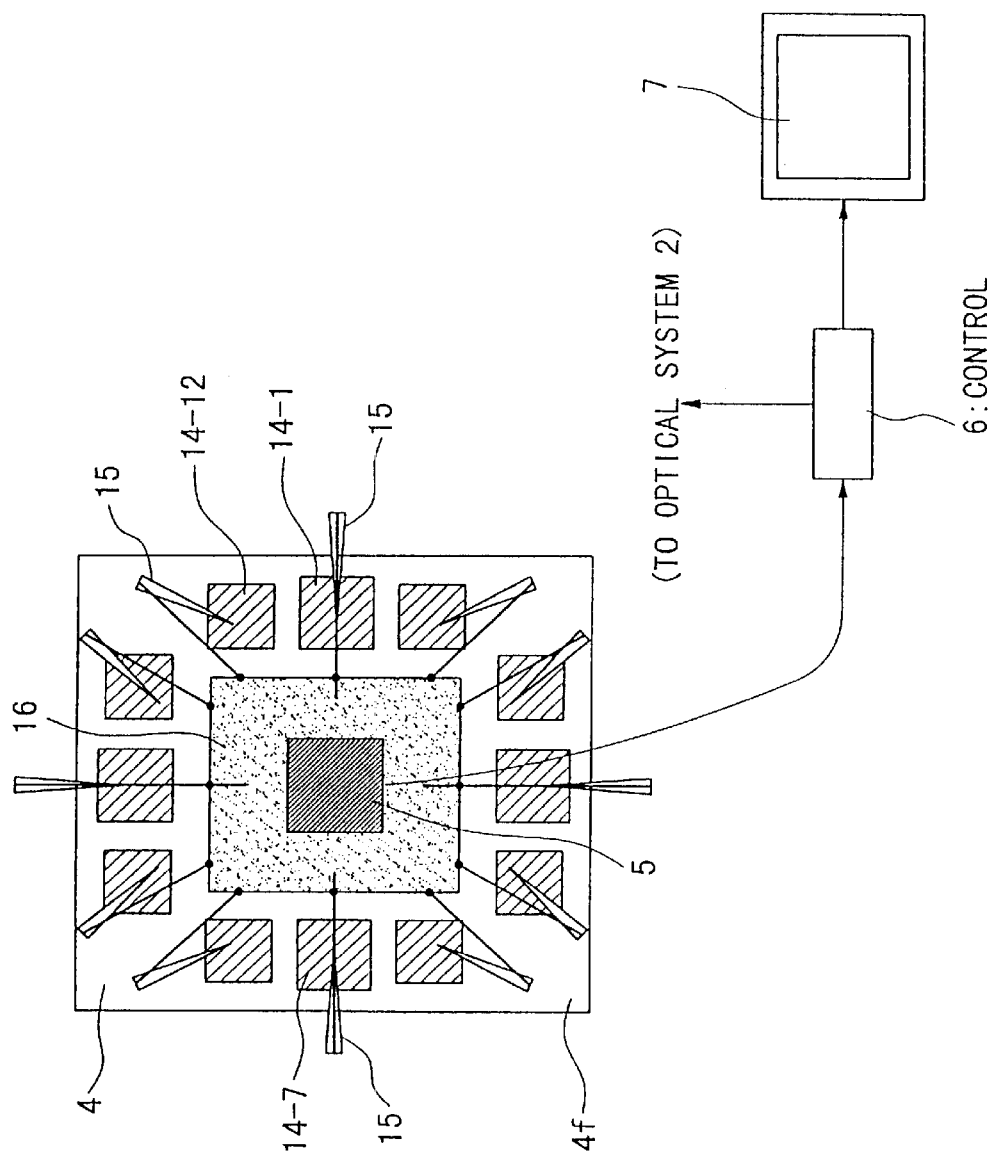

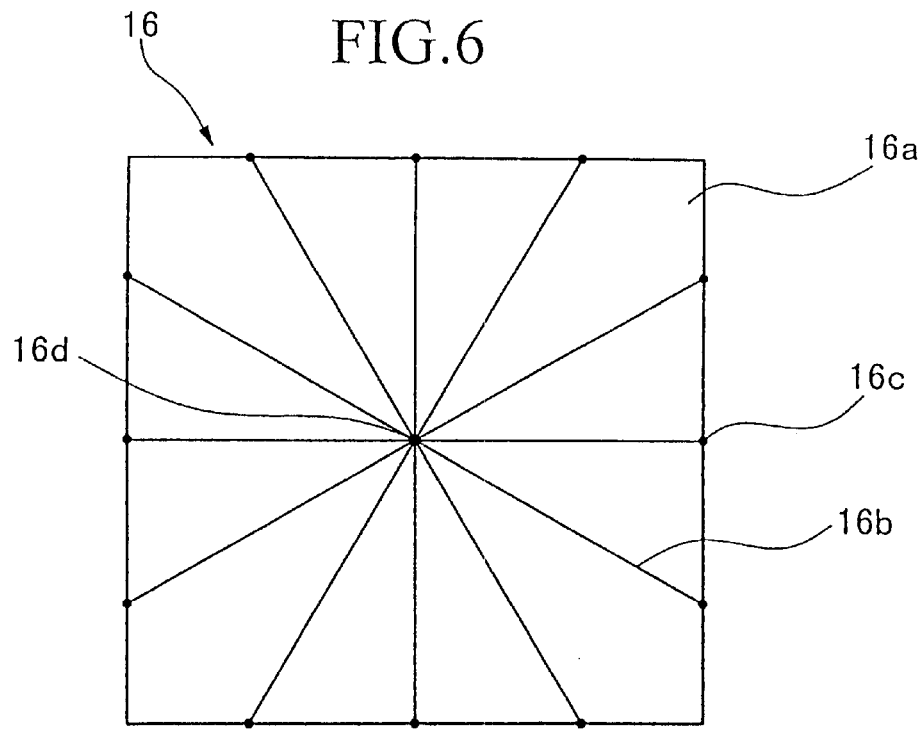
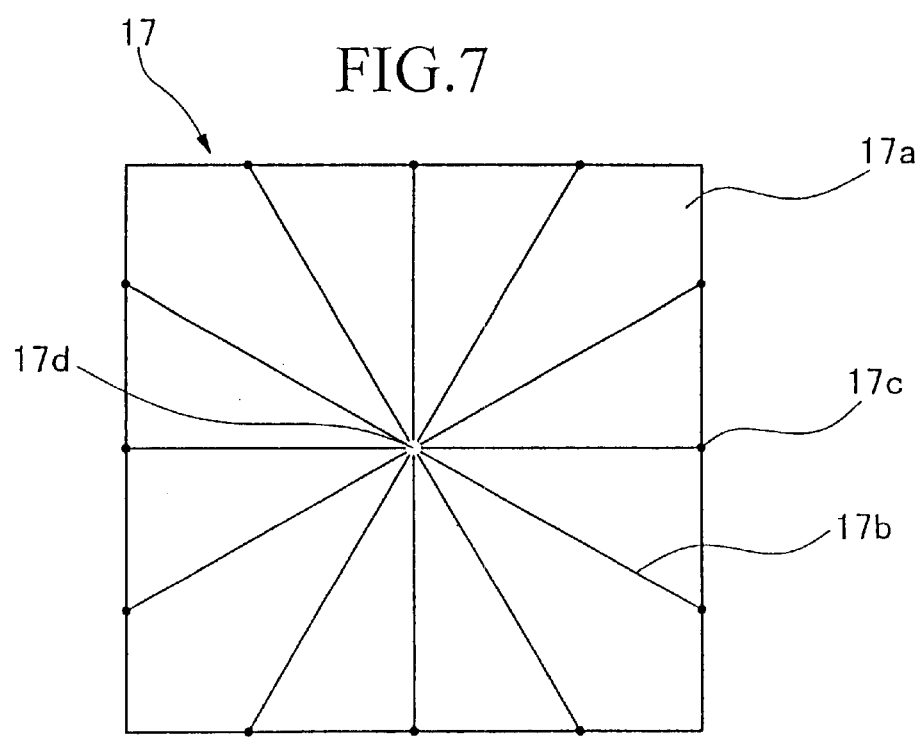

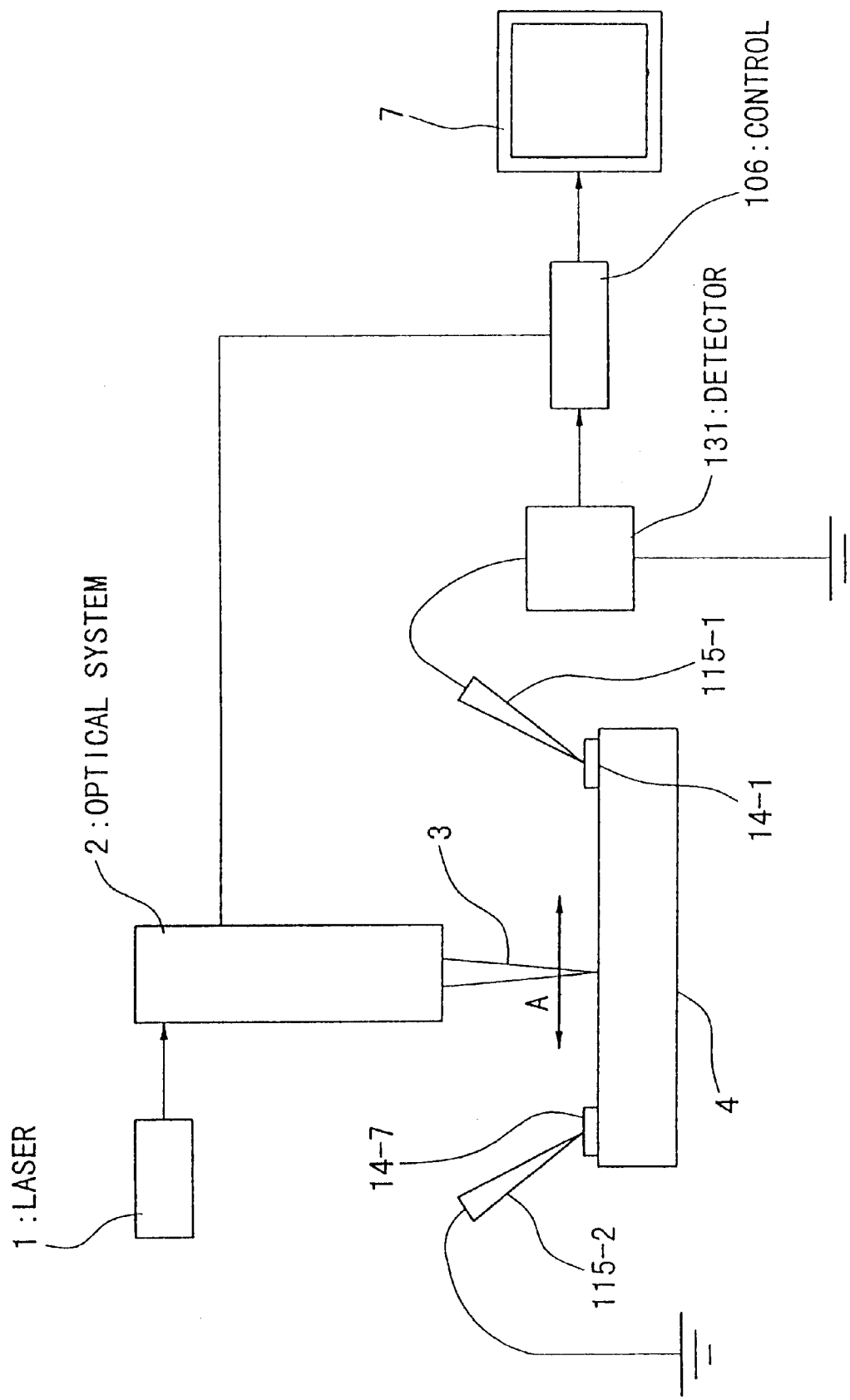

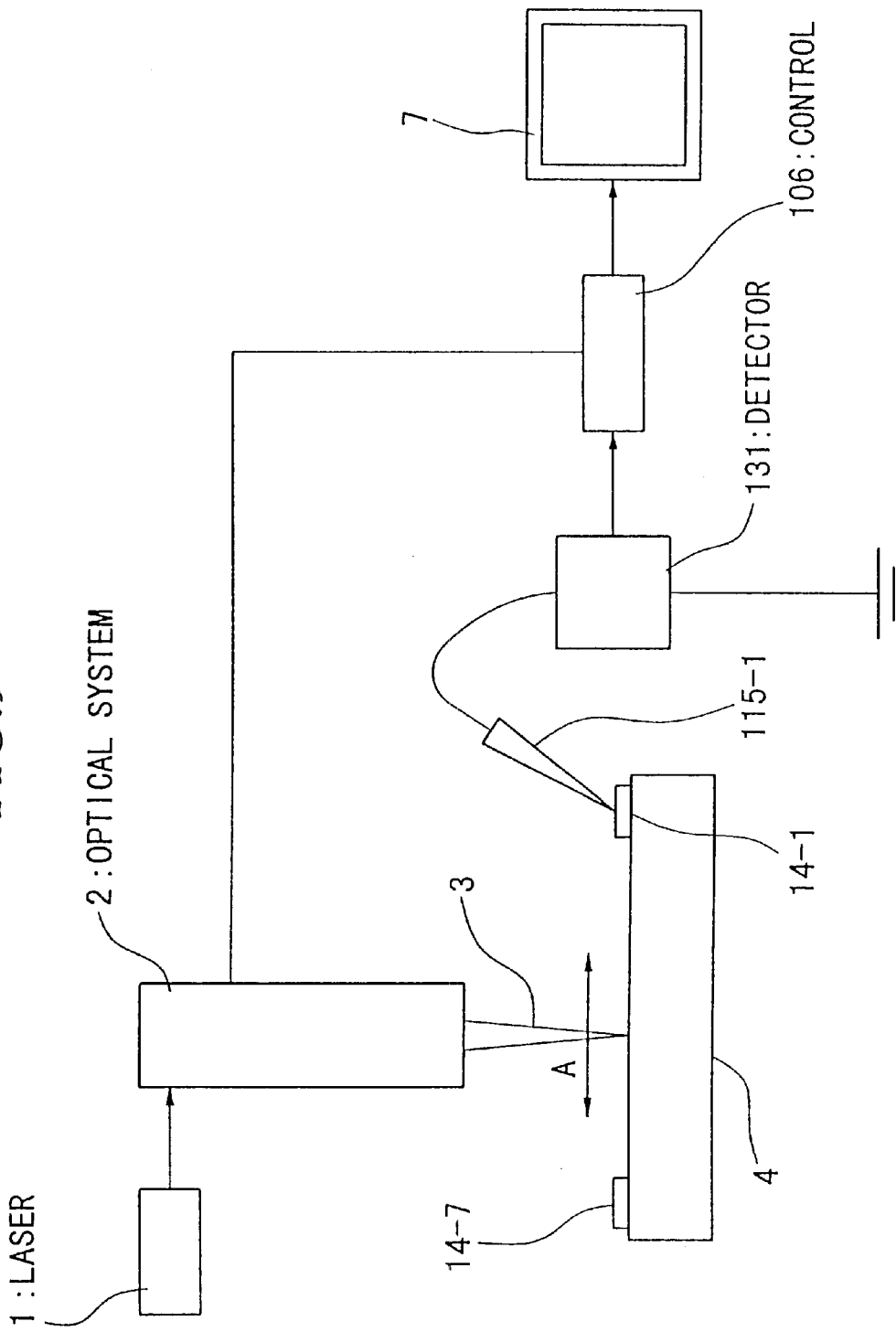

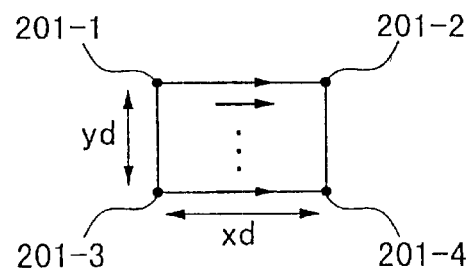
FIG.11A
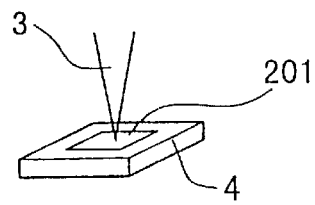
FIG.11B
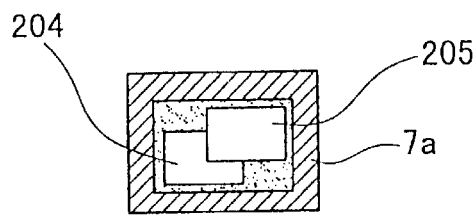
FIG.11C
FIG.11D
FIG.11E
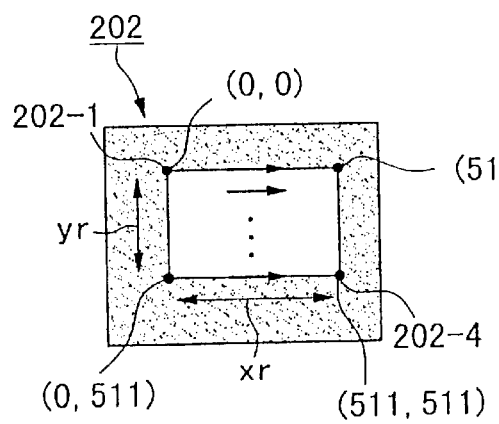
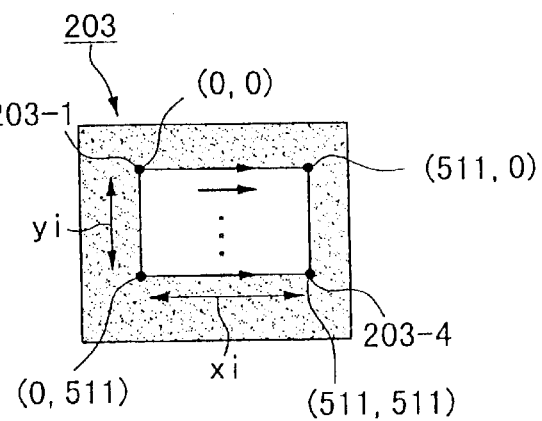

DEVICE AND METHOD FOR NONDESTRUCTIVE INSPECTION ON SEMICONDUCTOR DEVICE

CROSS REFERENCE TO RELATED APPLICATION

The present application is a divisional of copending application Ser. No. 09/407,221, filed on Sep. 24, 1999.

BACKGROUND OF THE INVENTION

1. Field of the Invention

This invention relates to devices and methods for performing nondestructive inspection on chips of semiconductor devices, and particularly to nondestructive inspection for detecting defects which are electrically active. This invention also relates to semiconductor devices, which are suited to the nondestructive inspection, and manufacturing methods of the semiconductor devices.

This application is based on Patent Application No. Hei 10-272788, Patent Application No. Hei 11-67744 and Patent Application No. Hei 11-133283 all filed in Japan, the contents of which are incorporated herein by reference.

2. Description of the Related Art

Conventionally, the nondestructive inspection techniques are disclosed by the known papers such as the paper entitled "OBIC Analysis Technique By Thermo Electro-motive Force", which is provided as the material for 132 meeting on study of 132 committee of Japan Academy Promotion Foundation with regard to industrial application of charged particle beams. Herein, "OBIC" is an abbreviation for "Optical Beam Induced Conductivity". The nondestructive inspection technique of this kind is used to nondestructively detect defect positions of wiring system in processes for defect analysis and fault analysis of semiconductor devices.

In addition, a variety of papers describe inspection of semiconductor devices and its related technologies using lasers. For example, the paper of Japanese Patent Application, First Publication No. Hei 7-14898 discloses OBIC analysis for semiconductor device wafers.

The paper of Japanese Patent Application, First Publication No. Hei 4-312942 discloses an OBIC current detection method for semiconductor devices.

The paper of Japanese Patent Application, First Publication No. Hei 5-136240 discloses OBIC observation for silicon semiconductor devices.

The paper of Japanese Patent Application, First Publication No. Hei 8-255818 discloses scanning-type OBIC current analysis using a scanning laser microscope.

The paper of Japanese Patent Application, First Publication No. Hei 10-170612 discloses inspection of defects in internal mutual wiring of semiconductor integrated circuits.

The paper of Japanese Patent Application, First Publication No. Hei 2-284439 discloses inspection of defects of semiconductor devices in manufacture of multilayer-wiring packages.

The paper of Japanese Patent Application, First Publication No. Hei 4-369849 discloses a semiconductor integrated circuit device, which is constructed to allow accurate measurement of electric potentials of aluminum wires located under oxide films.

The paper of Japanese Patent Application, First Publication No. Hei 5-47929 discloses automatic arrangement and wiring in layout designs of semiconductor integrated circuits.

The paper of Japanese Patent Application, First Publication No. Hei 5-243535 discloses design of semiconductor integrated circuits whose wiring patterns can be corrected with ease.

The paper of Japanese Patent Application, First Publication No. Hei 8-316281 discloses inspection of defects in patterns of multilayer wiring.

Now, FIGS. 8 and 9 show examples of configurations for the conventional device and method of nondestructive inspection (hereinafter, simply referred to as nondestructive inspection device and nondestructive inspection method), wherein same parts are designated by same reference symbols. A laser 1 generates a laser beam, which is narrowed down by an optical system 2 to produce a laser beam 3. Scanning is performed using the laser beam 3 on an observed area of a semiconductor device chip 4. The scanning is performed by polarization of the laser beam by the optical system 2 under control of a control image processing system 106.

In the above, an electric current is caused to occur and is extracted by a prober 115-1, which is subjected to probing to a bonding pad 14-1. The electric current is detected by a current variation detector 131 and is displayed on a screen of an image display device 7 under control of the control image processing system 106. Herein, variations of electric currents are displayed as an image representing luminance variations with respect to scan positions. Such an image is called a scan current variation image.

Concretely speaking, FIG. 8 shows an example of the configuration for the nondestructive inspection to let the current flow in a closed circuit. That is, a prober 115-2 is subjected to probing to a bonding pad 14-7, which is different from the bonding pad 14-1 connected to the current variation detector 131, and is grounded.

FIG. 9 shows an example of the configuration for the nondestructive inspection to let the current flow in an open circuit in a form of a transient current. So, all of bonding pads other than the bonding pad 14-1 connected to the current variation detector 131 are open. A capacitance (or capacity) component is required for the transient current to flow in the open circuit. In case of FIG. 9, such a capacitance component corresponds to a parasitic capacitance on the chip or a floating capacitance of a measurement system.

Next, operations of the nondestructive inspection will be described in detail. As described above, a difference between the configurations of FIGS. 8 and 9 merely lies in formation of the closed circuit or open circuit. So, the operations will be described without distinguishing between those configurations. Under the control of the control image processing system 106, the scanning is performed using the laser beam 3, which is originally generated by the laser beam generator 1 and is narrowed down by the optical system 2, on the observed area of the semiconductor device chip 4. Herein, the scan current variation image is subjected to illuminance display in response to the scanning in such a way that a current flowing into the current variation detector 131 is displayed "bright" while its reverse current is displayed "dark", for example. Incidentally, the display is made using the contrast between light and shade as well as gradation.

When a laser beam is irradiated on a position in proximity to a defect, thermoelectroinotive force is instantaneously caused to occur so that a current flows in the aforementioned circuit. In contrast, when the laser beam is irradiated on a non-defective area, the thermoelectromotive force is not caused to occur so that the current does not flow in the circuit. Therefore, the image display device 7 displays an image (called a scan current variation image) in which the contrast between light and shade appears in connection with the position in proximity to the defect. At the same time when the scan current variation image is obtained, or just before or after the scan current variation image is obtained, a scan laser microphotograph is taken with respect to an optical reflected image, which emerges in connection with the laser beam scanning.

Then, the general-use image processing technique is used to perform composition on the scan current variation image and scan laser microphotograph to produce a composite image composed of two images. Using such a composite image, it is possible to clearly recognize a position corresponding to the contrast between light and shade in the scan current variation image, so it is possible to specify a defect position on the semiconductor device chip 4. Incidentally, the aforementioned technique has an accuracy in detection of the defect position in an order of submicrons.

In order to clearly detect a type of the defect and a cause of occurrence of the defect which is detected nondestructively as described above, physically destructive analysis is normally performed, using the focusing ion beam method or electron microscope method, on defect positions. In other words, the conventional technology is used to clearly recognize the defect positions with the accuracy in positional detection in an order of sub-microns, so it is possible to efficiently perform physical analysis on micro defects, sizes of which are under the sub-micron order. As described above, the aforementioned conventional technology plays an important role in a series of analytical procedures for the fault analysis and defect analysis.

Each of FIGS. 8 and 9 shows only one chip for simplification of illustration. Of course, probing operations similar to the foregoing one are performed when one of the chips arranged on a wafer is selected and inspected.

When the inspection is performed after completion of post-processes of manufacture in which the chip is enclosed in the package, a pin (or pins) of the package is used instead of the probing to establish an electric connection. In this case, it is the normal course of action to perform the inspection by removing the packaging material on the surface of the chip. For convenience sake, the description will be given by way of an example of a single independent chip, which represents the single chip, each of chips on the wafer and packaged chip, for example.

To clarify the description, an explanation is given with respect to a construction of the chip which serves as a model and its important points. FIG. 10 is a perspective view showing limited parts of a chip, which are relevant to the present invention. Important points of the present invention are provision (or non-provision) of bonding pads, electric connections derived from the bonding pads independently, and manners of the electric connections derived from the bonding pads independently.

A model chip shown in FIG. 10 has twelve bonding pads, which are designated by reference symbols of 14-1 to 14-12 respectively. Of course, the present invention is not necessarily limited by a specific number of the bonding pads. It is an important point of the-present invention to distinguish between a surface and a back of the chip. FIG. 10 clearly shows a surface 4f corresponding to formation of components on a semiconductor substrate but does not show a back 4b on which the components are not formed. Incidentally, a description will be given with respect to causes in which a distinction between the surface and back plays an important role in operations of the inspection.

FIGS. 8 and 9 do not specifically show the scanning mechanism of the laser beam and the scanning-related mechanism of the image display device, which are known arts. To avoid complication, the following description does not clearly refer to explanation with regard to some elements of the invention corresponding to the known arts.

However, the following description refers to relationships between the scanning of the laser beam and images being produced, which are important elements of the invention. Herein, the conventional art concerns with the relationship between the scan laser microphotograph and scan current variation image, while the present invention concerns with the relationship between the scan laser microphotograph and scan magnetic image. Incidentally, the scan current variation image and scan magnetic image differ from each other with respect to only the types of signals used for the basis of the display, while they are fundamentally identical to each other with respect to other factors. So, the following description will be given by way of an example of the scan current variation image.

FIGS. 11A to 11E are conceptual diagrams, which are provided to show a relationship between the scanning of the laser beam and produced images, wherein parts equivalent to those shown in FIG. 8 are designated by the same reference symbols. There are provided two kinds of the produced images, i.e., the scan laser microphotograph and scan current variation image. Herein, the scan laser microphotograph is produced as follows:

In synchronization with the scanning using the laser beams, reflected beams are detected from laser irradiated points, by which reflection intensities are displayed in luminance in response to points of the scanning to produce an image.

Incidentally, the scan current variation image is produced as described before. Both of the scan laser microphotograph and scan current variation image are produced simultaneously, or they are produced sequentially without moving the semiconductor device chip which serves as a sample. Thus, it is possible to obtain the scan laser microphotograph and scan current variation image with respect to a specific position of the semiconductor device chip.

Normally, the contrast between light and shade appears only at some part(s) of the observed area of the chip with respect to the scan current variation image. So, by displaying the scan laser microphotograph and scan current variation image which overlap with each other on the screen, it is possible to clearly display a position, at which the contrast occurs with respect to the scan current variation image, on the scan laser microphotograph with a high accuracy. This eases physical analysis of defects, which is performed after the nondestructive inspection.

FIG. 11A shows movement of a laser scan position 201 on the semiconductor device chip. FIG. 11D shows coordinates 202 of a luminance display position of the scan laser microphotograph, which is displayed in a scan laser microphotograph display window 204 (see FIG. 11C) on the screen of the image display device 7. FIG. 11E shows coordinates 203 of a luminance display position of the scan current variation image, which is displayed in a scan current variation image display window 205 (see FIG. 11C) on the screen of the image display device 7. FIG. 11B shows the laser scan position 201, which is scanned using the laser beam 3 on the semiconductor device chip 4.

FIG. 11C shows the aforementioned windows 204, 205, which are displayed on the screen of the image display device 7 in response to the scanning. Herein, a reference symbol "7A" shows the screen of the image display device 7, on which the scan laser microphotograph, display window 204 and the scan current variation image display window 205 are displayed.

Now, a description will be given with respect to relationships between the scanning of the laser beam, scan laser microphotograph and scan current variation image with reference to FIGS. 11A to 11E. Movement of the laser scan position 201 on the semiconductor device chip 4 starts at a start point 201-1, from which the laser scan position 201 moves along a first scanning line in a horizontal direction toward an end point 201-2, which corresponds to an end of the first scanning line. Such horizontal movement of the laser scan position 201 is repeated five hundreds and twelve times, for example. So, the laser scan position 201 lastly moves along a last scanning line from its left-end point 201-3 to its right-end point 201-4.

The aforementioned scanning is performed continuously from the start point 201-1 to the end point 201-4 on the screen. Such scanning is performed at one time, normally, in a time duration which ranges from 0.1 second to 10 seconds. In synchronization with the scanning, detection is performed on reflected beams of the scan laser microphotograph, while detection is performed on current variations with respect to the scan current variation image. As described before, the scan laser microphotograph is displayed using luminance values, which are produced by converting detected light intensities and are displayed on the basis of positional correspondence. In addition, the scan current variation image is displayed using luminance values, which are produced by converting the detected current variations and are displayed on the basis of positional correspondence.

To clarify the concept of the positional correspondence, a description will be given with respect to relationships between scan areas, image display areas and observation magnifications. A ratio (yd/xd) between a width xd and a height yd of a scan area should be maintained constant in a displayed image. So, a ratio (yr/xr) between a width xr and a height yr of a scan laser microphotograph is identical to the aforementioned ratio (yd/xd). Similarly, a ratio (yi/xi) between a width xi and a height yi of a scan current variation image is identical to the aforementioned ratio (yd/xd).

The observation magnification is expressed as a ratio (xr/xd) between the width xd of the scan area and the width xr of the scan laser microphotograph or a ratio (xi/xd) between the width xd of the scan area and the width xi of the scan current variation image. Normally, in order to overlap the scan laser microphotograph and scan current variation image together, they are produced in a same size. For this reason, the magnification (xr/xd) is identical to the magnification (xi/xd). In addition, the ratio (yd/xd) between the width and height of the scan area is identical to the ratio between the width and height of the image. So, the magnification is identical to (yr/yd) and (yi/yd) as well.

Next, a description will be given with respect to correspondence between a point on the scan area and a point of the image being displayed. In general, the laser scan, is performed in an analog manner or a digital manner. Normally, the image display is performed in a digital manner. So, each position is expressed using coordinates corresponding to each pixel position. In many cases, resolution for the image display is represented by "(512 pixels)×(512 pixels)". So, the following description is made by way of an example in which the image display has a resolution of "(512 pixels)×(512 pixels)".

The start point 201-1 of the laser scan in the scan area (see FIG. 11A) corresponds to a start point 202-1 of the scan laser microphotograph (see FIG. 11D) and a start point 203-1 of the scan current variation image (see FIG. 11E) respectively. Coordinates (0, 0) are set to the aforementioned start points of the microphotograph and image. In addition, coordinates (511, 0) are set to end points of the microphotograph and image, which correspond to the end point 201-2 on the first scanning line of the laser scan in its scan area. Similarly, coordinates (0, 511) are set to start points of the microphotograph and image, which correspond to the start point 201-3 on the last scanning line of the laser scan in its scan area. Coordinates (511, 511) are set to end points (i,e., 202-4, 203-4) of the microphotograph and image, which correspond to the end point 201-4 on the last scanning line of the laser scan in its scan area. Thus, the image display is performed using a number of pixels (i.e., 512×512=262, 144), which are designated by the aforementioned coordinates (0, 0), (1, 0), . . . , (511, 511). Brightness of each pixel being displayed is normally designated by eight bits, which provide 256 steps in gradation.

The nondestructive inspection of the chip, which is performed using the aforementioned scan current variation image, has a variety of problems, which will be described below.

A first problem is that inspection cannot be performed on the semiconductor device chip, which is an inspected subject, after pre-processes of manufacture are completed so that bonding pads are attached to the chip.

In order to detect current variations which occur due to irradiation of the laser beam, the conventional art requires that the inspection device must be electrically connected to the semiconductor device chip. For this reason, the bonding pads should be formed on the semiconductor device chip in advance.

A second problem is that even if the inspection is performed after formation of the bonding pads is completed so that post-processes of manufacture are completed, many work steps and much cost are required for preparation in establishing electric connections because of a great number of bonding pads to which a current variation detector is connected.

In order to detect a defect which exists in the chip, it is required that a wire (or line) on which such a defect exists is electrically connected to the current variation detector. Therefore, in order to certainly perform the inspection, it is required for a human operator to electrically connect the current variation detector to all of the bonding pads, each of which has a possibility that a thermoelectromotive current flows therethrough. As a result, a great number of work steps and much cost are required for the preparation in establishing electric connections between the bonding pads and current variation detector.

In the case where the inspection is performed using the configuration of the closed circuit, it is necessary to select a bonding pad to configure the closed circuit. Combinations of the electric connections which can be established increase in proportion to the square of the number of bonding pads. So, as the number of bonding pads increases, a number of the combinations of the electric connections becomes enormous. In order to perform preparation regarding the electric connections being established every time the type of the chip, which is an inspected subject, is changed with new one, it is necessary to provide specifically designed instruments, and it is necessary to change the electric connections. This increases a number of work steps and an amount of cost being required for the preparation.

Another problem that the conventional art cannot solve is incapability of detecting short-circuit defects. The conventional art may be capable of detecting the voids, foreign matters and disconnection of wires. However, it is incapable of detecting short-circuits between wires. It may be possible to indirectly detect the short-circuit defects if defects causing the thermoelectromotive force exist on the same wires on which the short-circuit defects exist. However, there is a very small probability in which two kinds of the defects exist on the same wire.

SUMMARY OF THE INVENTION

It is an object of the invention to provide a device and a method for nondestructive inspection, by which productivity and reliability of semiconductor device chips are improved.

It is another object of the invention to enable nondestructive and non-contact inspection being performed before formation of bonding pads of the semiconductor device chips in semiconductor manufacturing processes.

It is a further object of the invention to enable efficient nondestructive inspection being performed without selecting bonding pads after formation of the bonding pads.

It is a still further object of the invention to provide a semiconductor device and its manufacturing method, which allow the nondestructive inspection device and method to detect short-circuit defects.

It is a still further object of the invention to provide a semiconductor device which is capable of increasing duration that a current flows due to occurrence of thermoelectromotive force caused by irradiation of a laser beam in proximity to a defect. So, it is possible to ease detection of a magnetic field, and it is possible to reduce manufacturing cost of the semiconductor device, thus, it is possible to improve productivity and reliability in manufacture of the semiconductor device.

In a first aspect of the invention, there is provided a nondestructive inspection device (or method) which is basically configured such that a laser beam having a specific wavelength is irradiated on a surface (or back) of a semiconductor device chip to scan. Herein, the laser beam is narrowed down in an irradiation size and is irradiated on a defect position. Then, the defect position is heated to cause a thermoelectromotive current, which transiently flows in the semiconductor device chip and which induces a magnetic field. A magnetic field detector such as SQUID detects a strength of the magnetic field, which is converted to a luminance value. The luminance value is set as luminance at a certain display position on a screen so as to produce a scan magnetic field image. A scanning laser microscope produces a scan laser microphotograph. Then, a display device displays a composite image consisting of the scan magnetic field image and the scan laser microphotograph, which are overlapped with each other, on the screen. Using the displayed composite image, it is possible to perform inspection on the semiconductor device chip as to whether a defect exists or not before formation of bonding pads in a nondestructive manner. Incidentally, the wavelength of the laser beam is set at 1300 nanometer for producing the scan magnetic field image and is set at 633 nano-meter for producing the scan laser microphotograph, for example. In addition, it is possible to provide at least one current circuit (e.g., closed circuit or open circuit) extracted from the semiconductor device chip, wherein one end of the current circuit is electrically connected to a bonding pad. Thus, it is possible to perform detection on the strength of the magnetic field, induced by the current flowing across the current circuit, with good detection sensitivity. Incidentally, the SQUID is cooled down in temperature using liquid nitrogen.

Further, the SQUID contains three detection coils, which are directed in three independent directions respectively.

In a second aspect of the invention, there is provided a semiconductor device wafer, which is suited to the nondestructive inspection and is configured to allow detection of a short-circuit defect without using additional electric connections. A thermoelectromotive force generator and its wires are formed on (or in) a semiconductor device wafer, wherein they are electrically connected to first-layer wires, which are formed in an insulating layer on a substrate. For example, the short-circuit defect lies between the first-layer wires. Now, a laser beam is irradiated on the thermoelectromotive force generator so that a thermoelectromotive current is caused to flow in a closed circuit along a current path, which is configured by the first-layer wires, short-circuit defect, thermoelectromotive force generator and its wires as well as vias. Due to the thermoelectromotive current flowing across the closed circuit, a magnetic field is induced and is detected by a detector, such as a SQUID. Then, the detected strength of the magnetic field is represented in luminance (brightness or color), by which a scan magnetic field image is produced and displayed on the screen of the image display device in accordance with the scanning of the laser beam. A scan laser microphotograph is produced based on reflected light simultaneously with the scanning of the laser beam or in connection with the scanning of the laser beam. A composite image, consisting of the scan magnetic field image and scan laser microphotograph which are overlapped with each other, is displayed on the screen, by which it is possible to specify a position of the short-circuit defect in the semiconductor device wafer.

In a third aspect of the invention, a nondestructive inspection is effected on a semiconductor integrated circuit, which is in an intermediate stage of manufacture before formation of bonding pads. Herein, the semiconductor integrated circuit is basically configured by a substrate, an insulating layer, a first-layer wire, a circuit via, an inspection via and a metal film, which is used for formation of a second-layer wire. On the substrate, the circuit via is provided to connect the first-layer wire and second-layer wire via the insulating layer. The inspection via is connected to the first-layer wire but is not connected to the second-layer wire. The metal film is formed on a relatively broad range of a surface area, which is broader than a region of the first-layer wire. In addition, a part of the first-layer wire corresponds to a thermoelectromotive force generating defect. When a laser beam is irradiated on a back of the semiconductor integrated circuit toward the thermoelectromotive force generating defect of the first-layer wire, a thermoelectromotive current is caused to occur and flows in a closed circuit, so that a magnetic field is induced. A detector detects a strength of the magnetic field, based on which defectiveness of the semiconductor integrated circuit is inspected. Because the nondestructive inspection can be performed on the semiconductor integrated circuit which is in an intermediate stage of manufacture, it is possible to feed back inspection results in early stages of manufacture. This contributes to improvements in productivity and reliability of the semiconductor devices. In addition, it is possible to reduce the total cost required for manufacture of the semiconductor devices.

BRIEF DESCRIPTION OF THE DRAWINGS

These and other objects, aspects, examples and embodiments of the present invention will be described in more detail with reference to the following drawing figures, of which:

FIG. 5 is a bottom view showing a back of a semiconductor device chip, which is inspected by the example 5, and its periphery;

FIG. 6 is a schematic illustration showing a configuration of a current path focusing board, which constructs example 6 of the embodiment A of the invention;

FIG. 7 is a schematic illustration showing a configuration of a current path focusing board, which constructs example 7 of the embodiment A of the invention;

FIG. 8 is a schematic diagram showing an example of a configuration employed for the conventional nondestructive inspection of the semiconductor device chip;

FIG. 9 is a schematic diagram showing another example of the configuration employed for the conventional nondestructive inspection of the semiconductor device chip;

FIG. 11A is a schematic illustration showing an example of a scan area on a semiconductor device chip;

FIG. 11B is a perspective view showing the semiconductor device chip which is scanned using a laser beam;

FIG. 11C shows an example of display on a screen of an image display device;

FIG. 11D shows an example of display of a scan laser microphotograph display window displayed on the screen of the image display device;

FIG. 11E shows an example of display of a scan current variation image display window displayed on the screen of the image display device;

DESCRIPTION OF THE PREFERRED EMBODIMENTS

This invention will be described in further detail by way of examples with reference to the accompanying drawings.

[A] Embodiment A

The embodiment A contains a variety of examples, which are designed for nondestructive inspection in accordance with the present invention.

FIGS. 1A, 1B, 2, 3 and 4 are schematic diagrams showing five examples of nondestructive inspection devices in accordance with embodiment A of the present invention, wherein parts equivalent to those shown in FIGS. 8 and 9 are designated by the same reference symbols, while same parts are designated by same reference symbols.

Now, examples 1, 2, 3 and 4 of the nondestructive inspection devices will be sequentially described with reference to FIGS. 1A, 2, 3 and 4. Herein, configurations of those examples are described first, then, operations will be described later.

Figure 1A:
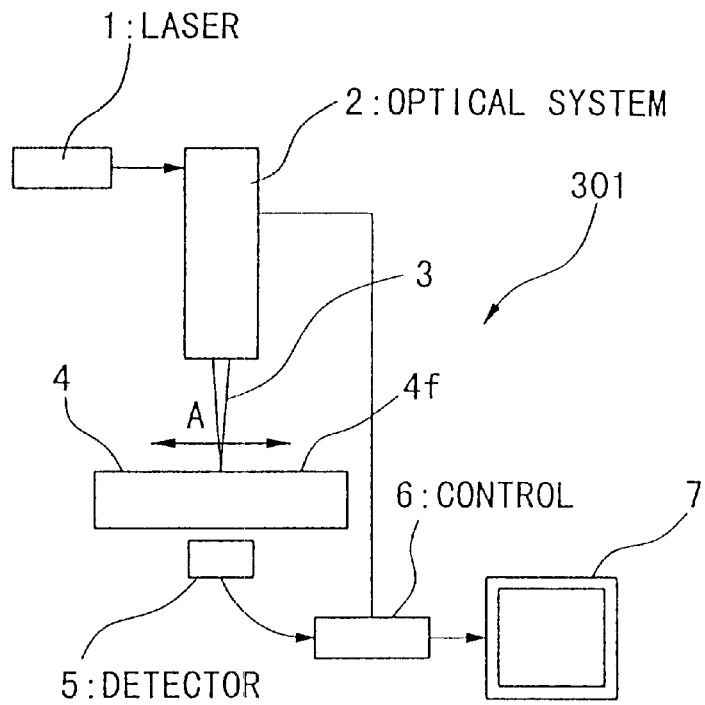
FIG. 1A is a schematic diagram showing a configuration of a nondestructive inspection device in accordance with example 1 in embodiment A of the invention.

A nondestructive inspection device 301 of the example 1 shown in FIG. 1A is configured as follows:

The laser 1 generates a laser beam, which is narrowed down in an irradiation size by the optical system 2 to produce a laser beam 3. The laser beam 3 is irradiated on a surface 4f of the semiconductor device chip 4 while being subjected to scanning in directions denoted by "A", so that a magnetic field is caused to occur and is detected by a magnetic field detector 5. Scanning of the laser beam 3 is performed by polarization of the laser beam inside of the optical system 2.

Under the control of the control image processing system 6, an output of the magnetic field detector is displayed in luminance on the screen of the image display device 7 in connection with a scan position of the laser beam 3. Thus, it is possible to obtain a scan magnetic field image, which is substantially an equivalence of the aforementioned scan current variation image produced in the conventional art.

The nondestructive inspection device 301 is equipped with a light receiving component, which is not shown in FIG. 1A. So, a scanning laser microscope is constructed using the laser 1, optical system 2 and light receiving component. Using such a scanning laser microscope, it is possible to produce a scan laser microphotograph of the semiconductor device chip 4.

The control image processing system 6 and image display device 7 cooperate together to produce a composite image composed of the scan magnetic field image and the scan laser microphotograph which is produced by the aforementioned scanning laser microscope.

Figure 2:
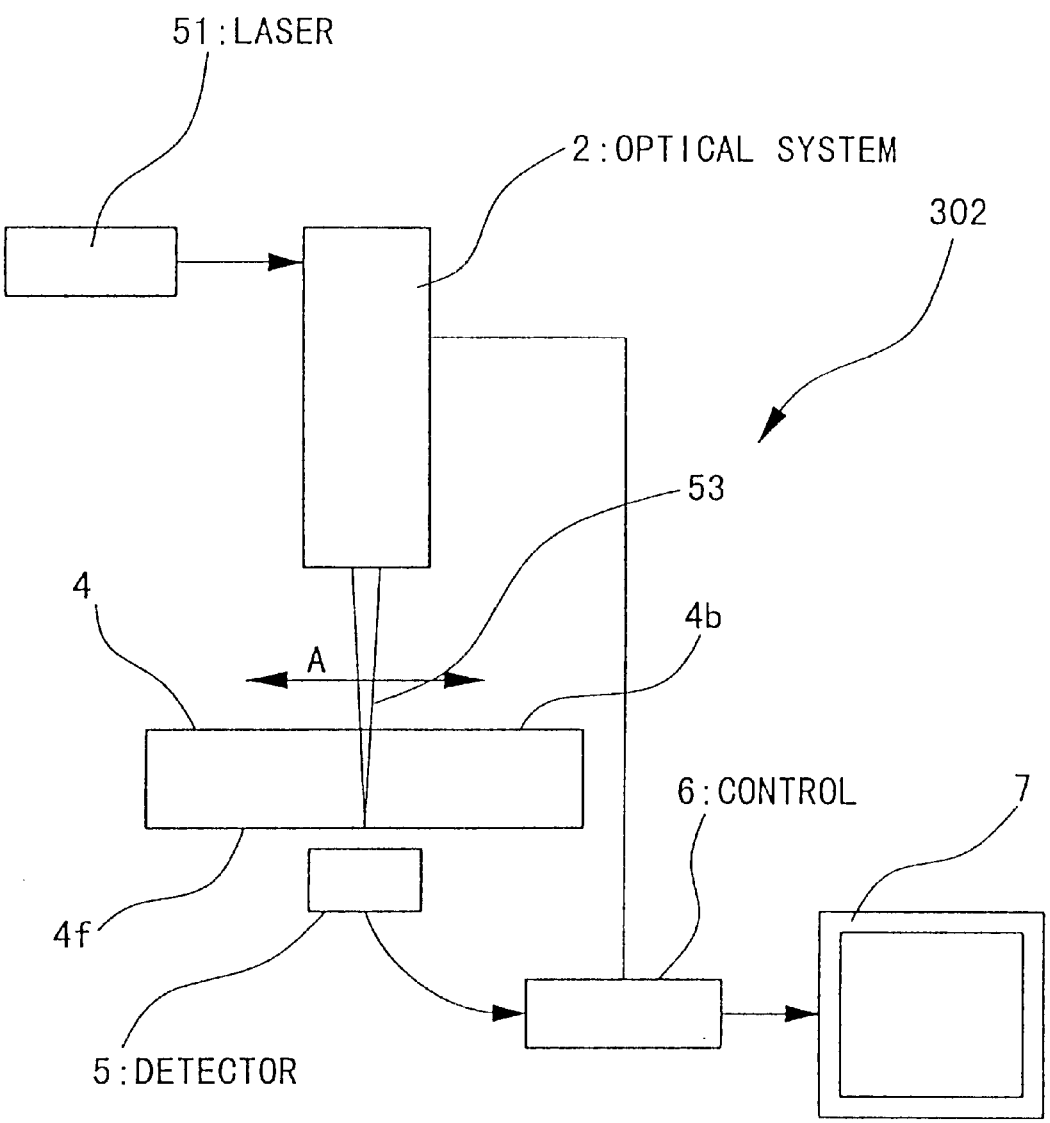
FIG. 2 is a schematic diagram showing a configuration of a nondestructive inspection device in accordance with example 2 of the embodiment A of the invention.

A nondestructive inspection device 302 of the example 2 shown in FIG. 2 performs inspection more effectively as compared with the example 1. The nondestructive inspection device 302 is basically identical to the nondestructive inspection device 301 except that a wavelength of the laser beam is set at 1300 nm (nano-meter), while the laser beam is irradiated on a back 4b of the semiconductor device chip 4.

There are three reasons for setting the wavelength of the laser beam at 1300 nm. Herein, two reasons are based on the fact that many of semiconductor device substrates are made of silicon (Si).

Now, the three reasons will be described below.

A first reason is that by setting the wavelength of the laser beam at 1300 nm, it is possible to heat a certain portion of the chip close to the surface of the substrate by the laser beam, which is irradiated on the back of the chip to transmit through the substrate.

In these days, the semiconductor devices normally employ multilayer wiring structures. In many cases, wires in upper layers have broader widths, with which wires in lower layers are covered up. In addition, many of the semiconductor devices employ structures in which chip surfaces are directed to installed surfaces of substrates while chip surfaces are covered up with leads of packages.

Due to installation and packaging of the chips described above, it is difficult to heat a number of wires by the laser beam which is irradiated on the chip surface. For this reason, it is necessary to irradiate the laser beam on the back of the chip. Therefore, it is an importation factor for the inspection device to have a capability in irradiating the laser beam on the back of the chip.

Laser beams whose wavelengths are 1100 nm or more are capable of transmitting through silicon materials of low densities, which are used for formation of the substrates, to a considerable extent. Therefore, it is possible to heat the wires, arranged in proximity to the surface of the chip, by the laser beam which is irradiated on the back of the semiconductor device chip. In case of He—Ne laser of 1152 nm, for example, the laser beam is capable of transmitting through the P-substrate having the wafer thickness of 625 nm at a transmission rate of 50%. In order to heat the wires, arranged in proximity to the surface of the chip, by irradiation of the laser beam on the back of the chip, it is necessary to use the laser beam whose wavelength is 1100 nm or more.

A second reason to use the laser beam whose wavelength is 1300 nm is to avoid occurrence of an OBIC current (i.e., "Optical Beam Induced Conductivity" current).

When a laser beam whose wavelength is under 1200 nm is irradiated on silicon material, an OBIC current is caused to occur, which acts as noise against a thermoelectromotive current. In the case of the He—Ne laser of 1152 nm (1.076 eV), electron-hole pairs are not formed due to transition of electrons (1.12 eV) between valence band and conduction band of the silicon material. So, the OBIC current is not caused to occur if impurities do not exist in the silicon material, or a small amount of the OBIC current is caused to occur if a small amount of impurities exists in the silicon material.

Transition occurs in accordance with impurity levels by which impurities are introduced. As for regions where impurities such as arsenic (As), boron (B) and phosphorus (P) are introduced in a density required for formation of transistors, energy under 1.076 eV is sufficient to cause the transition in accordance with levels of the impurities. In that case, the OBIC current is caused to occur in a certain extent to be detected. This OBIC current acts as noise against the thermoelectromotive current. To avoid such noise due to the OBIC current, it is necessary to use the laser beam whose wavelength is 1200 nm or more.

A third reason to use the laser beam whose wavelength is 1300 nm is to increase resolution in displaying the scan laser microphotograph and scan magnetic field image because the laser beam can be narrowed smaller as the wavelength becomes shorter.

The aforementioned three reasons indicate desired conditions for the nondestructive inspection in which wavelengths of laser beams are as short as possible and over 1200 nm. So, as the laser which meets the aforementioned conditions and which is sufficient for the practical use, it is effective to use the laser having a capability of producing the laser beam whose wavelength is 1300 nm or so.

Concretely speaking, it is preferable to use a diode laser whose output is 100 mW. In order to increase laser irradiation power so that the thermoelectromotive current is made intense, it is preferable to use a YLF laser whose output is 500 mW.

Two reasons are provided for irradiation of the laser beam on the back of the semiconductor device chip, as follows:

A first reason is to cope with chips of multilayer wiring structures and installed chips by irradiating the laser beam on the back of the chip.

A second reason is to arrange the magnetic field detection 5 in a side of the chip surface.

It is preferable to arrange the magnetic field detector in the side of the chip surface because of a relatively small distance between the magnetic field detector and a path in which the thermoelectromotive current flows, so it is possible to increase the strength of the magnetic field being sensed by the magnetic field detector. That is, it is possible to detect a smaller amount of the thermoelectromotive current.

Because of the independent reasons described above, it is preferable to irradiate the laser beam on the back of the chip while it is preferable to arrange the magnetic field detector in the side of the chip surface. Practically, such an arrangement in which the laser is arranged opposite to the magnetic field detector brings an easy way for configuration of the nondestructive inspection device.

Next, a description will be given with respect to a nondestructive inspection device 303 of the example 3 with reference to FIG. 3.

Different from the aforementioned nondestructive inspection device 302, the nondestructive inspection device 303 uses SQUID (i.e., Superconducting Quantum Interference Device) 55, which is accompanied with liquid nitrogen 9, heat insulators 8a, 8b and a magnetic shield member 10.

According to the technologies in these days, the SQUID is optimum for detecting a small magnetic field due to thermoelectromotive current because the SQUID is the most sensitive device used for magnetic field observation method. Classifications show that there are two types of SQUID, i.e., low-temperature SQUID using low-temperature superconductor such as niobium (Nb) and high-temperature SQUID using oxide superconductor. Herein, the low-temperature SQUID is disadvantageous in cost and maintenance because it requires high-level cooling using liquid helium. So, the nondestructive inspection device of the example 3 uses the high-temperature SQUID in which cooling using liquid nitrogen is enough.

As concrete materials for the high-temperature SQUID, there are provided YBCO (Y—Ba—Cu—O), HBCO (Ho—Ba—Cu—O), etc.

Figure 3:
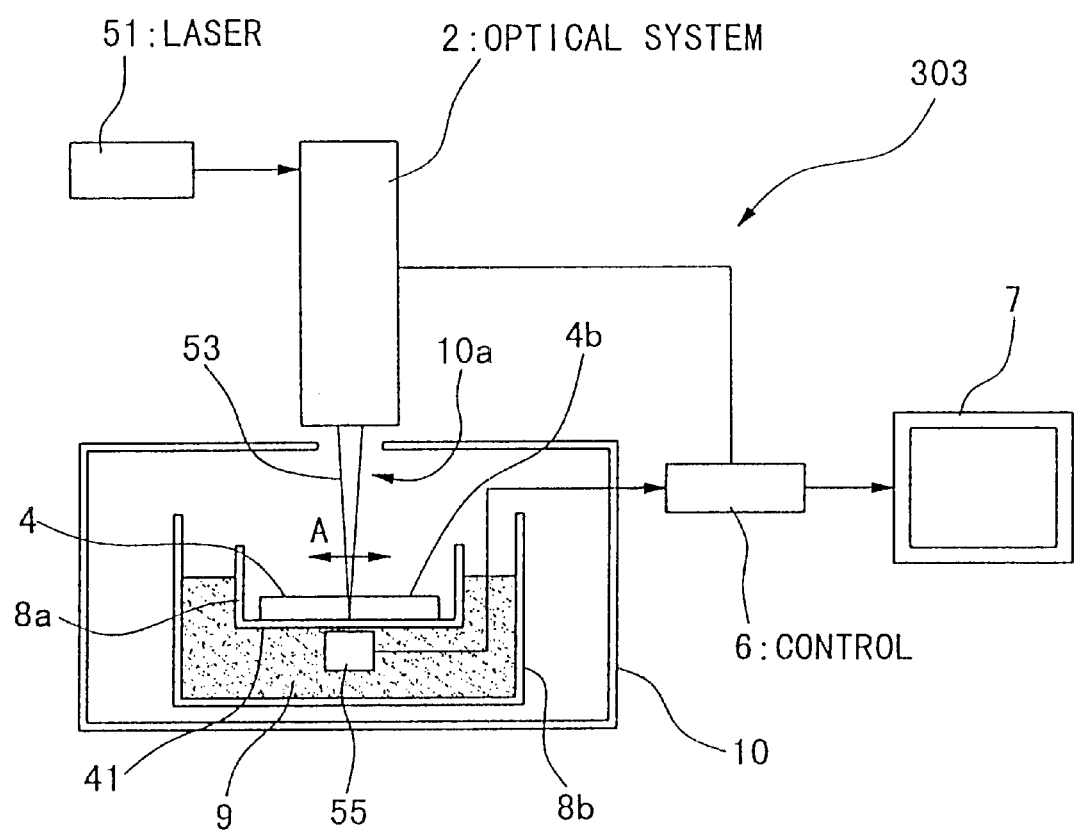
FIG. 3 is a schematic diagram showing a configuration of a nondestructive inspection device in accordance with example 3 of the embodiment A of the invention.

In FIG. 3, the liquid nitrogen 9 is required to cool down the SQUID 55; the heat insulator 8a is provided to insulate heat transfer between the liquid nitrogen 9 and the semiconductor device chip 4; and the heat insulator 8b is provided to insulate heat transfer between the liquid nitrogen 9 and its surroundings. As materials for the heat insulators, it is preferable to use styrene foam because the styrene foam can be easily cut in thin shapes while it has a high heat insulation effect.

In order to insulate magnetic field noise being entered from surrounding areas, it is necessary to cover the SQUID 55 and its accompanied members as a whole with a magnetic shield member 10 as perfectly as possible. FIG. 3 shows that the magnetic shield member 10 has a hole 10a through which the laser beam penetrates. Such a hole 10a does not influence the magnetic field shield effect of the magnetic shield member 10 so much.

Figure 4:
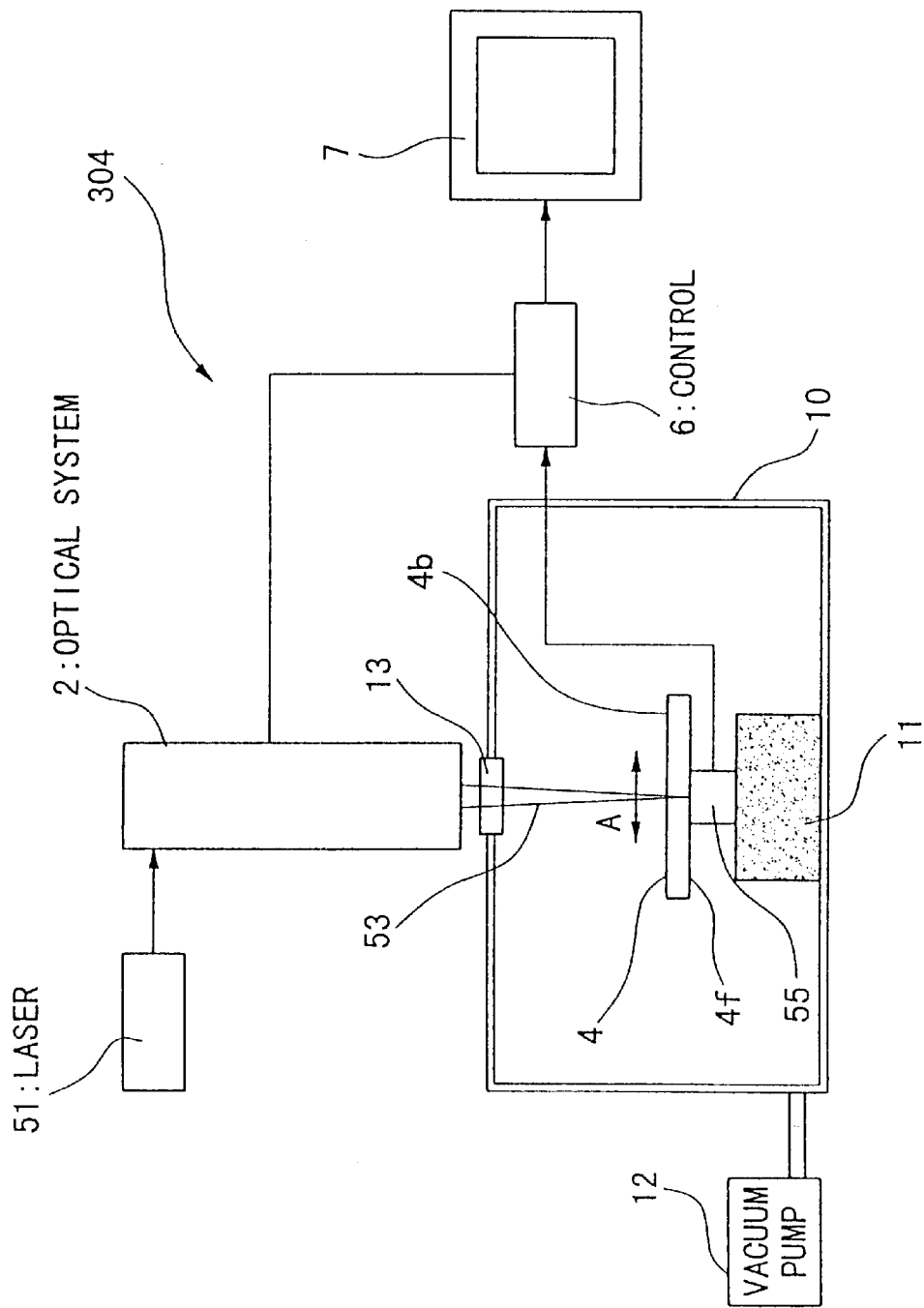
FIG. 4 is a schematic diagram showing a configuration of a nondestructive inspection device in accordance with example 4 of the embodiment A of the invention.

Next, a description will be given with respect to a nondestructive inspection device 304 of the example 4 with reference to FIG. 4. Different from the aforementioned nondestructive inspection device 303 of FIG. 3, the nondestructive inspection device 304 of FIG. 4 is characterized by using a cooler 11 for cooling the SQUID 55. By bringing the SQUID 55 into contact with the cooler 11, the SQUID 55 can be easily cooled down to be under the temperature of the liquid nitrogen (e.g., 77K). An airtight structure is constructed using the magnetic shield member 10 and a glass member 13 through which the laser beam transmits. In addition, the airtight structure is decompressed to the vacuum by a vacuum pump 12, so it is possible to avoid thermal diffusion (or heat radiation).

Next, a description will be given with respect to operations of the aforementioned nondestructive inspection devices in detail.

First, a description will be given with respect to basic operations which are commonly performed by the nondestructive inspection devices of the examples 1 to 4, then, descriptions will be given with respect to independent operations, which are independently performed by the examples respectively.

Incidentally, the descriptions of the operations are made under preconditions that different types of semiconductor device chips, each of which serves as an inspected subject, are provided and suited to different states (1) to (3), as follows:

(1) Chip on a wafer in the middle of pre-processes of manufacture;

(2) Chip on which pre-processes of manufacture and formation of bonding pads are completed, and (2-a) Chip whose quality (or defectiveness) is not inspected or which is mounted on a wafer;

(2-b) Chip which is certainly evaluated as a defective chip by inspection results or which is mounted on a wafer;

(3) Chip on which post-processes of manufacture are completed and which is enclosed in a package.

Now, the following description is given with respect to the common operations of the examples 1 to 4 with reference to FIG. 1A.

As described before, the laser 1 generates a laser beam, which is narrowed down in an irradiation size by the optical system 2 to produce a laser beam 3. The laser beam 3 is irradiated on the surface 4f of the semiconductor device chip 4 to scan. As the laser 1, it is possible to use the He—Ne laser of 633 nm, He—Ne laser of 1152 nm, diode laser of 1300 nm and YLF laser of 1300 nm. Because, those lasers are appropriate in performance and cost. Of course, different types of the lasers can be used to suit specific objects respectively.

The optical system 2 effects the scanning by performing polarization in longitudinal and lateral directions. Concretely, the optical system 2 performs the polarization using a galvano-mirror, an optoacoustic component, an optoelectronic component, etc. A diameter of a laser beam can be selected from a broad range by selecting an appropriate lens. However, a minimum diameter is limited to a wavelength or so due to a diffraction limit. If the optical system 2 is equipped with a common focus function, it is possible to actualize high spatial resolution in the scan laser microphotograph. For example, it is possible to actualize resolution of 400 nm or so by using the laser of 633 nm, or it is possible to actualize resolution of 800 nm by using the laser of 1300 nm.

An important factor in resolution of the scan magnetic field image is not the resolution of the scan magnetic field image itself, but it is the resolution of the scan laser microphotograph, which is produced with respect to a same position of the scan magnetic field image. This determines a defective position recognition accuracy. Reasons are as follows:

In order to detect a defect position on the chip, the normal image processing function is used to overlap the scan laser microphotograph with the scan magnetic field image. Herein, the scan laser microphotograph is displayed with 256 steps of gradation, while the scan magnetic field image is displayed in red color. An area regarding contrast of the scan magnetic field image which serves as a defective image can be adjusted smaller to be narrow down to a size of one pixel whose intensity in contrast is the greatest. Such a size can be made further smaller than a spatial resolution of the scan laser microphotograph.

As described above, the scan magnetic field image, whose size is narrowed down in contrast to one pixel, is overlapped with the scan laser microphotograph, so that it is possible to clearly recognize a defect position in the scan laser microphotograph. In short, the defect position recognition accuracy depends on the spatial resolution of the scan laser microphotograph.

In connection with the spatial resolution of the scan laser microphotograph, it is effective to employ some measures, as follows:

As described before, occurrence of the OBIC current causes the noise, by which it is difficult to directly detect the thermoelectromotive current. For this reason, it is preferable to use the laser whose wavelength is 1300 nm. This laser of 1300 nm has a characteristic of small attenuation in transmission of the silicon material. The aforementioned nondestructive inspection devices 302, 303 and 304 shown in FIGS. 2, 3 and 4 are designed using such a characteristic in such a way that the laser beam is irradiated on the back of the chip. Even if the laser beam of 1300 nm is used, it is possible to construct the nondestructive inspection device according to needs such that the laser beam is irradiated on the surface of the chip in order to avoid the noise caused by occurrence of the OBIC current.

However, the scan laser microphotograph may have a problem in spatial resolution if the laser beam of 1300 nm is used. In an aspect to improve the spatial resolution of the scan laser microphotograph, it is preferable to use the laser of 633 nm. So, there is a dilemma as to which type of the laser should be used. To eliminate such a dilemma, it is effective to employ some measures, as follows:

That is, both of the He—Ne laser of 633 nm and YLF laser of 1300 nm are provided in advance as the laser 1. Herein, the laser of 633 nm is used to produce the scan laser microphotograph, while the YLF laser of 1300 nm is used to produce the scan magnetic field image. The, both of the microphotograph and image are overlapped with each other on the screen. By employing such a measure, it is possible to detect a defect (or defects) of the chip with the spatial resolution of 400 nm, which corresponds to the resolution of the laser of 6.33 nm.

If the laser beam whose wavelength is 1300 nm is irradiated on the back of the chip to produce the scan magnetic field image, the scan laser microphotograph is originally produced by irradiating the laser beam of 633 nm on the surface of the chip, then, it is converted to a mirror image, which is overlapped with the scan magnetic field image. By employing such a measure, it is possible to improve the defect position recognition accuracy approximately two times higher that the accuracy which is obtained by using only the laser of 1300 nm.

If the defect position cannot be clearly recognized using the scan laser microphotograph which is produced by irradiating the laser beam on the surface of the chip, it is possible to modify the nondestructive inspection device(s) such that another scan laser microphotograph is produced by irradiating the laser beam on the back of the chip. That is, three images including two scan laser microphotographs and one scan magnetic field image are used and are overlapped with each other on the screen. Such modification may bring some improvement in defect position recognition with respect to some defect positions.

If the laser of 1300 nm is insufficient in power to actualize the desired spatial resolution for the scan laser microphotograph which is produced by irradiation of the laser beam on the back of the chip, it is possible to compensate attenuation of the laser beam transmitting through the silicon material by using a high-output laser. That is, it is possible to employ a measure in which the wavelength of the laser beam is made as short as possible. However, it is impossible to obtain a great effect in improvement of the spatial resolution, because the improvement of the spatial resolution depends on a ratio of waveforms, which is 1.3 times as high as the original resolution at best.

In the nondestructive inspection device 304 of FIG. 4, a laser beam 53 transmits through the glass member 13, through which it is irradiated on a surface of the semiconductor device chip 4. Herein, appropriate glass material is selected for the glass member 13 to be basically suited to a transmission factor of the laser beam whose wavelength is 1300 nm. In addition, the glass material is not required to have a high transmission factor with respect to the laser beam whose wavelength is 633 nm. Because, the laser beam of high power is required to generate a sufficient thermoelectromotive current, while the laser beam does not demand high power in producing the scan laser microphotograph. In conclusion, the glass material should be selected by the trade-off in consideration of the total cost of the nondestructive inspection device which includes the laser 1 and the light receiving component(s) constructing the scanning laser microscope.

Now, a reference is made back to the description regarding the operations of the nondestructive inspection device in conjunction with FIG. 1A. The laser beam 3 is irradiated on the surface of the semiconductor device chip 4 to scan in directions "A". Herein, a thermoelectromotive current flows across the circuit only when the laser beam is irradiated on a specific position in proximity to a defect which causes thermoelectromotive force. Normally, there exists no position at which a sensible amount of thermoelectromotive force is caused to occur in the semiconductor device chip, which is manufactured in a normal way. Defects which cause the thermoelectromotive currents are related to voids in wires, a variety of deposits in wires and foreign matters.

When the laser beam 3 is irradiated on the defect position on the semiconductor device chip 4, a thermoelectromotive current is caused to occur, so that a magnetic field is induced. Such an induced magnetic field is detected by the magnetic field detector 5. As for the high-sensitive magnetic measurement, it is possible to list four types of devices such as SQUID fluxmeter, flux-gate fluxmeter, nuclear magnetic resonance fluxmeter and semiconductor magnetic sensor (Hall element). Herein, the SQUID has a measurement range of super sensitivity, which ranges from 1 femto-tesla (fT) to 10 nano-tesla (nT). In contrast to the SQUID, the flux-gate fluxmeter and nuclear magnetic resonance fluxmeter have a measurement range which ranges from 0.1 nT to 0.1 milli-tesla (mT), while the semiconductor magnetic sensor has a measurement range which ranges from 1 nT to 1 T. So, they are inferior to the SQUID in sensitivity.

The inventor of the present invention has made experiments on sensitivities of the aforementioned devices. Results of the experiments show that under the current technology level, only the SQUID has required sensitivity for detecting the magnetic field, which is caused to occur in response to the thermoelectromotive current when the laser beam is irradiated on the defect position in the wire(s) of the semiconductor device chip.

The aforementioned examples use the high-temperature SQUID which is superior in cost and is easy to operate. However, if a higher sensitivity is required, it is preferable to use the low-temperature SQUID.

Next, operations of the nondestructive inspection devices using the high-temperature SQUID will be described with reference to FIGS. 3 and 4.

Normally, the high-temperature SQUID is soaked in the liquid nitrogen. In case of FIG. 3, it is necessary to maintain the semiconductor device chip 4 at some temperature close to ordinary temperature (or room temperature) by inserting the heat insulator 8a between the SQUID 55 and the semiconductor device chip 4. The inventor has made experiments on how much low temperature the semiconductor device chips are capable of resisting. Results of the experiments, which are verified in the past, show that the semiconductor device chips are proof against a specific temperature of –55 degrees Celsius or so.

Practical conditions for a test regarding the durability of the semiconductor device chip are used for repetition of a test cycle, being executed by ten to thousand times, as follows:

The semiconductor device chip is placed in a condition of +150 degrees Celsius for ten minutes. Then, the temperature is decreased to reach –55 degrees Celsius within fifteen minutes. So, the semiconductor device chip is placed in a condition of –55 degrees Celsius for ten minutes or more. Thereafter, the temperature is increased to reach +150 degrees Celsius within fifteen minutes. The semiconductor device chip is placed in a condition of +150 degrees Celsius for ten minutes or more.

As described above, the test has severe conditions. Even in such severe test, the semiconductor device chip shows a sufficient durability. For this reason, no problem may be caused even when the semiconductor device chip is exposed to low temperature for a short period of time in the inspection. Until now, there are no data that show limits in temperature resistance of the semiconductor device chip.

The nondestructive inspection device 303 of FIG. 3 makes a requirement in which the semiconductor device chip 4 is maintained at the temperature close to the ordinary temperature. Such a requirement is not made to secure the durability regarding the temperature resistance of the chip, but it is made to avoid frost being formed on the chip. The inventor has confirmed through experiments that styrene foam is effective for use in the heat insulator. Even if the styrene foam is made thin in thickness which is 3 mm or so, the chip can be maintained at the temperature at which no frost is formed on the chip.

The nondestructive inspection device 304 has no worry about formation of frost on the chip. So, there is no problem being caused even if the temperature of the semiconductor device chip 4 is decreased to –55 degrees Celsius at least.

To secure normal operation of the SQUID, it is necessary to maintain the temperature of the SQUID constant under a predetermined temperature. In the case of the nondestructive inspection device 303 of FIG. 3, the SQUID is soaked in the liquid nitrogen. So, it is necessary to adequately fill up a container of the SQUID with liquid nitrogen in such a manner that an amount of the liquid nitrogen 9 is maintained at a sufficient amount in which the SQUID 55 is fully soaked. If the inspection is continuously performed for a long time, it is convenient to use an automatic supply device which automatically supplies the container of the SQUID with the liquid nitrogen. As the automatic supply device of the liquid nitrogen, it is possible to use "EDX" (i.e., energy-distributed X-ray analysis device), which offers sufficient practical-use results in elemental analysis.

The nondestructive inspection device 304 of FIG. 4 uses the cooler 11 to cool down the SQUID 55. There are two merits in use of the cooler. A first merit is to stabilize operation of the SQUID because as compared with the liquid nitrogen in which the SQUID is soaked, the cooler is capable of cooling down the SQUID to a lower temperature. A second merit is to reduce a distance between the semiconductor device chip 4 and the SQUID 55. In general, the strength of the magnetic field, which is induced by the thermoelectromotive current, becomes greater as a distance from a current path becomes smaller. Therefore, if the distance between the semiconductor device chip 4 and the SQUID 55 is short, it is possible to perform detection of the magnetic field whose strength is relatively great. Thus, it is possible to improve defect detection sensitivity.

In the case of the nondestructive inspection device 303 of FIG. 3 in which the SQUID is soaked in the liquid nitrogen, the liquid nitrogen 9 and the heat insulator 8a exist between the semiconductor device chip 4 and the SQUID 55. On the other hand, in the case of the nondestructive inspection device 304 of FIG. 4 in which the SQUID is cooled down by the cooler, vacuum space lies between the semiconductor device chip 4 and the SQUID 55. In this case, it is possible to approach them extremely close to each other.

Directions and strengths of magnetic fields depend on lengths and directions of current paths. Due to possible existence of a defect, it is impossible to predict a direction in which the current flows. For this reason, it is necessary to perform detection on the magnetic fields with respect to all the directions. The SQUID 55 contains detection coils which actually detect the magnetic fields. Herein, the detection coils are set in three independent directions. So, the SQUID 55 is constructed to have a capability of detecting the magnetic fields with respect to the three directions independently.

It is not necessarily required that three independent images are displayed as the scan magnetic field images. That is, the nondestructive inspection device is capable of sufficiently meeting the demands by displaying a single scan magnetic field image, which is displayed in response to luminance corresponding to an absolute value of a sum of three vectors, for example.

The strength of the magnetic field becomes more intense as the detector is placed more closer to a current path in which a thermoelectromotive current flows. For this reason, it is preferable that the detection coils of the SQUID 55 are placed close to the semiconductor device chip 4.

The magnetic field detector 5 produces an electric signal in response to a strength of the magnetic field detected thereby. Such an electric signal is supplied to the control image processing system 6. The control image processing system 6 converts the signal to a luminance value, by which an image corresponding to a scan position is displayed on the screen of the image display device 7. If a sufficient S/N ratio is not obtained by one scan operation, images are repeatedly produced by multiple scan operations and are accumulated. If a sufficient SIN ratio is not obtained by the multiple scan operations, the laser beam is subjected to modulation while the signal is amplified by a lock-in amplifier, so that it is possible to remarkably improve the S/N ratio.

Next, descriptions will be sequentially given with respect to operations specifically applied to different types of semiconductor device chips respectively.

(1) Chip on a wafer in the middle of pre-processes of manufacture

As for the chip of this type, it is necessary to perform detection as to which chip on the wafer is defective. So, at an initial stage, the diameter of the laser beam is made as large as possible to scan a broad area on the wafer. In some case, it is possible to irradiate the laser beam on the chips on the wafer at once, instead of scanning the wafer with the laser beam. In this case, a slit having a same size of the chip is provided for irradiation of the laser beam. Using such a slit, it is possible to irradiate the laser beam accurately with a size of the chip or with an internal size of the chip excluding bonding pads. Thus, it is possible to make a decision as to whether a defect exists or not with respect to each chip. So, a brief inspection is completed by making a decision as to whether the chip is well manufactured one or a defective one.

In order to accurately locate a defect which exists in a defective chip found by the aforementioned brief inspection, the laser beam is gradually narrowed down in irradiation size so as to gradually narrow down a scan range. Thus, a defect position will be finally narrowed down to an area whose size is in an sub-micron order.

(2-a) Chip on which pre-processes of manufacture are completed but whose defectiveness is not inspected or which is mounted on a wafer As for the chip of this type, it is necessary to perform inspection whose operations are similar to the foregoing inspection (1). In some cases, however, it is impossible to perform defect inspection sufficiently by using only the thermoelectromotive current which occurs inside of the chip. So, it is desirable to perform inspection in connection with example 5 or other examples, which will be described later.

(2-b) Chip on which pre-processes of manufacture are completed but which is certainly evaluated as a defective chip through the inspection results or which is mounted on a wafer As for the chip of this type, inspection is required to narrow down the defect position and find the cause of the defect. In this case, it is necessary to perform only a latter part of the operations of the foregoing inspection (1). Like the foregoing chip (2-a), it is desirable to perform inspection in connection with the example 5 or other examples with respect to the chip (2-b).

(3) Chip on which post-processes of manufacture are completed and which is enclosed in a package As for the chip of this type, a decision as to whether the chip is normally manufactured one or defective one has been already made by electric measurement. Due to the problem of testability, it cannot be said that the decision is correct with 100%. So, it is possible to make a correct decision by treating the chip as one which is not evaluated in defectiveness. Therefore, it is necessary to perform basically the same operations of the foregoing inspection (1) with respect to the chip of this type. Even in the case of the chip (3), which is similar to the foregoing chip (2-a), it is sometimes impossible to perform the defect inspection-sufficiently by using only the thermoelectromotive current which occurs inside of the chip. So, it is desirable to perform inspection in connection with the example 5 or other examples.

Particularly in the case of the chip which is enclosed in the package, as compared with the chip which is not enclosed in the package, it is possible to easily perform the inspection in connection with the example 5 and other examples.

Next, nondestructive inspection devices of examples 5 to 7 will be described in detail with reference to FIG. 1B and FIGS. 5 to 7.

Figure 1B:
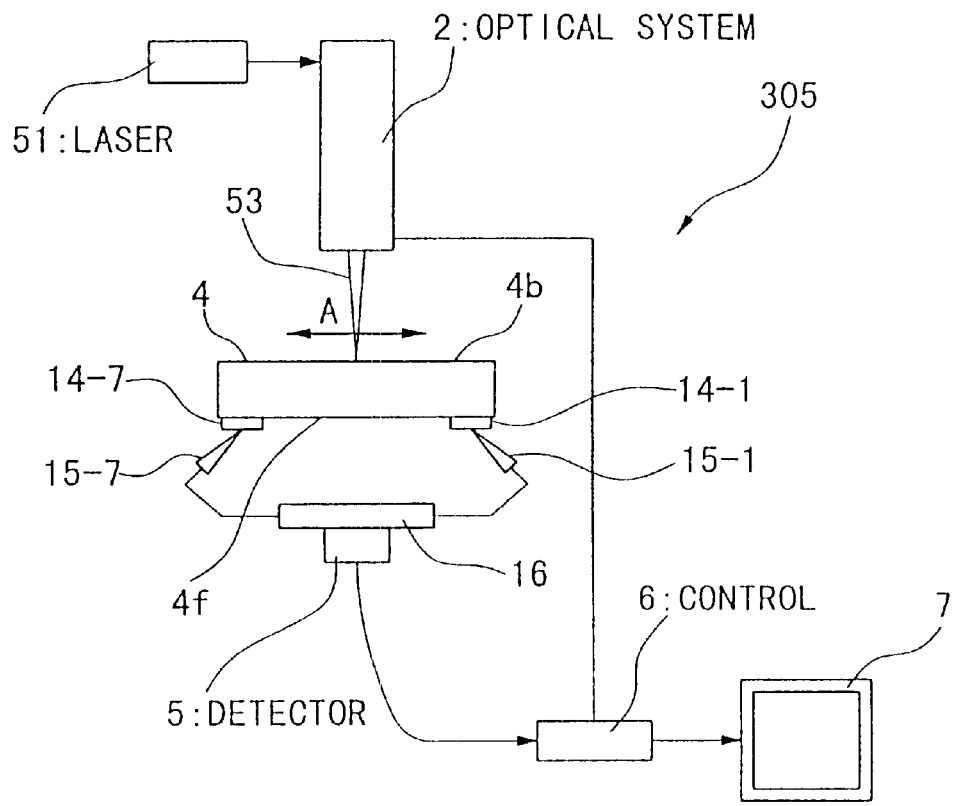
FIG. 1B is a schematic diagram showing a configuration of a nondestructive inspection device in accordance with example 5 of the embodiment A of the invention.

FIG. 1B is a schematic diagram showing a configuration of a nondestructive inspection device of the example 5. FIG. 5 is a bottom view showing a back of a semiconductor device chip 4, which is inspected by the example 5, and its periphery. FIG. 6 is a schematic illustration showing a configuration of a current path focusing board, which constructs the example 6. FIG. 7 is a schematic illustration showing a configuration of a current path focusing board, which constructs the example 7. In FIGS. 1B and 5, parts equivalent to those shown in FIGS. 2 to 4 are designated by the same reference symbols, hence, the description thereof will be omitted.

Now, configurations of nondestructive inspection devices of examples 5 to 7 will be described with reference to FIG. 1B and FIGS. 5 to 7.

Different from the foregoing nondestructive inspection device 301 of FIG. 1A, a nondestructive inspection device 305 of FIG. 1B is not designed such that the magnetic field induced by the thermoelectromotive current is not directly detected by the magnetic field detector, which is arranged in proximity to the semiconductor device chip 4.

In FIG. 1B, current paths, which extend from the semiconductor device chip 4 to the bonding pads 14 and probers 15, are focused (or concentrated) at one position by a current path focusing board 16. So, the thermoelectromotive current is detected using the magnetic field detector 15 in proximity to the current path focusing board 16.

Figure 10:
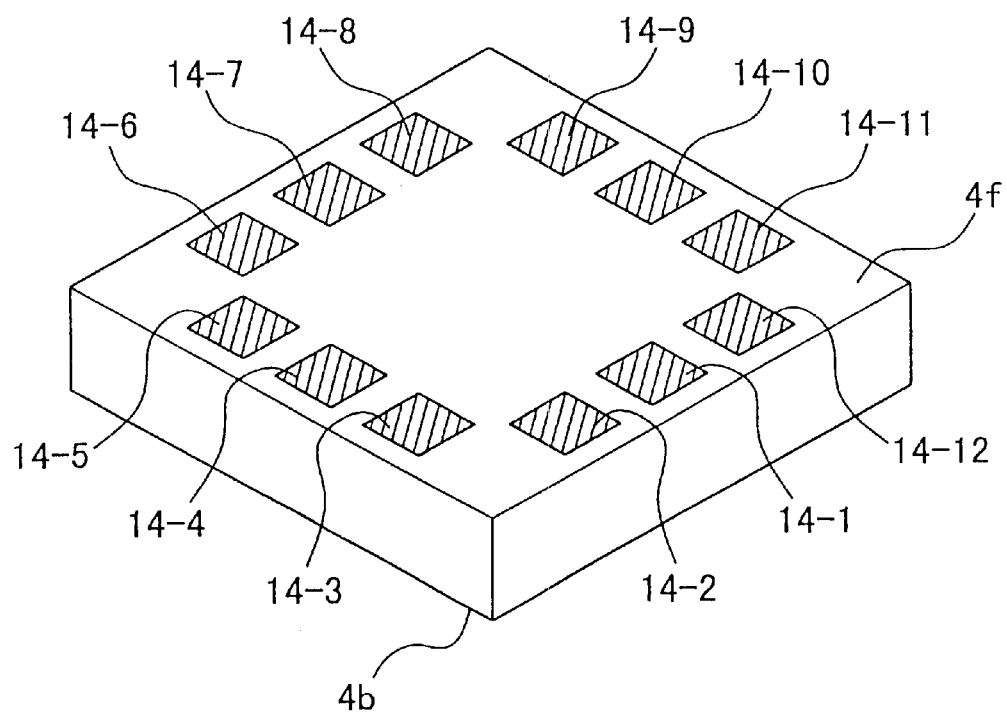
FIG. 10 is a perspective view showing an appearance of a semiconductor device chip, which serves as a model of a subject inspected by the present invention.

All of the current paths, which are connected to all of the bonding pads 14-1 to 14-12 by using the probers 15, are focused on the current path focusing board 16 shown in FIG. 5. Incidentally, the example 5 uses the aforementioned model chip shown in FIG. 10. So, a number of pads is twelve, which is relatively a small number. However, the present invention is not necessarily limited in such a number.

The example 6 is a modification of the example 5, wherein it employs a specifically designed current path focusing board 16 shown in FIG. 6, which is configured such that metal wires 16b are arranged on an insulating substrate 16a. Herein, all the wires connected to connection terminals 16c, which are connected to the probers respectively, are focused at a single focusing point 16d and are short-circuited. Due to such a configuration of the example 6, a thermoelectromotive current certainly flows into a closed circuit, which passes the focusing point 16d. So, the magnetic field detector is arranged in proximity to the focusing point 16d to measure a magnetic field. Incidentally, the connection terminals 16c are respectively connected to the probers 15, which are respectively connected to the bonding pads 14-1 to 14-12.

The example 7 is another modification of the example 5, wherein it is designed to employ a specifically designed current path focusing board 17 shown in FIG. 7. Herein, wires 17b are arranged on an insulating substrate 17a and are connected to connection terminals 17c, which are respectively connected to the probers. Different from the aforementioned current path focusing board 16 shown in FIG. 6, the current path focusing board 17 is designed such that all the wires 17b, connected to the connection terminals 17c, are not short-circuited at a focusing point 17d. That is, a thermoelectromotive current flows in an open circuit. Of course, the magnetic field detector is arranged in proximity to the focusing point 17d to measure the magnetic field.

Next, a description will be given with respect to operations of the examples 5 to 7. Herein, the description is made mainly with respect to differences by which the examples 5 to 7 differ from the foregoing examples 1 to 4.

In the nondestructive inspection device 305 of FIG. 1B, a laser beam 53 is irradiated on a defect position of the semiconductor device chip 4, in which a thermoelectromotive current is caused to occur. The thermoelectromotive current flows into the current path focusing board 16 through the bonding pad 14 and the prober 15.

Suppose that the laser beam 53 is irradiated on a certain defect position on the semiconductor device chip 4, wherein a thermoelectromotive current flows through a limited current path. Therefore, the thermoelectromotive current flows through a limited path within paths on the current path focusing board 16. Normally, the current flows through one of the paths into which the current is capable of easily flowing.

However, it is impossible to predict such a path in which the current actually flows. Therefore, the examples 5 to 7 are basically similar to the foregoing examples 1 to 4 in that the strength and direction of the magnetic field being caused to occur cannot be predicted. In the examples 5 to 7, the magnetic field is caused to occur in very small strength, which is similar to the foregoing examples 1 to 4. So, like the foregoing examples 1 to 4, the example 5 employs the SQUID as the magnetic field detector 5. In the SQUID, the detection coils for detection of the magnetic fields are respectively arranged in three directions, which are perpendicular to each other with right angles, for example. Incidentally, the examples 5 to 7 should cool down the SQUID by some method, which is similar to the methods (and structures) used in the foregoing examples 1 to 4.

Next, a description will be given with respect to merits in measurement of the magnetic field, which is measured by extracting the thermoelectromotive current from the semiconductor device chip 4.

In general, the magnetic field being caused due to the flow of current becomes intense due to two causes. That is, the magnetic field becomes intense when the detector is arranged close to the current path, while it becomes intense when a length of the current path is long. The examples 5 to 7 are designed such that the thermoelectromotive current is extracted from the semiconductor device chip 4, so the magnetic field is measured based on the extracted current which is introduced into the board being arranged externally from the chip. Thus, it is possible to make the magnetic field being detected more intense with respect to both of the two causes because the detector can be arranged close to the current path while the current path can be elongated.

First, a description will be given with respect to one cause, which is the length of the current path. The current paths which exist inside of the semiconductor device chip normally have short lengths, which are in an micro-meter order, so that they cannot be controlled in shape and size. In that case, magnetic fields which occur around the above current paths are mutually weakened each other, so they are hard to be detected with ease. On the other hand, it is possible to elongate lengths of the current paths in a centimeter order or more by extracting the wires. In this case, it is possible to control the current paths such that magnetic fields which occur around the current paths are not weakened each other. In other words, it is possible to detect the magnetic fields at a position at which the magnetic fields are not weakened each other. In the case of the current paths shown in FIG. 6, there exist positions at which magnetic fields are weakened each other, while there exist other locations at which magnetic fields are strengthened each other. Thus, it is possible to detect the magnetic fields at the positions at which the magnetic fields are strengthened each other.

Next, a description will be given with respect to another cause, which is the distance between the current path (or wire) and magnetic field detector. In the case of the examples 1 to 4 which use the SQUID, it is impossible to approach the SQUID to the current path in such a way that the SQUID is substantially brought in contact with the current path. Because, the semiconductor device chip does not normally have sufficient durability at an operating temperature of the SQUID. In the case of the examples 5 to 7, it is not difficult to manufacture the current path focusing boards 16, 17 to have sufficient durability at the operating temperature of the SQUID. For this reason, it is possible to approach the SQUID to the current path in such a way that the SQUID is substantially brought into contact with the current path. As described above, the examples 5 to 7 are advantageous in an aspect of the distance between the current path and magnetic field detector.

As described above, the examples 5 to 7 are designed such that the current path is extracted outside of the semiconductor device chip 4, wherein the current path is set such that the magnetic field produced by the current path increases in strength. As a result, it is possible to detect a weak thermoelectromotive current having very small magnitude. So, there is an advantage in which a number of detectable defects is increased.

Next, a brief description will be given with respect to an example of experiments which are made with respect to the example 6. The experiments use a wiring layer of titanium silicide (TiSi) whose width is 0.21 $\mu$m and whose film thickness is 0.1 $\mu$m, in which silicon (Si) whose size is about 0.1 $\mu$m is deposited. A laser beam whose wavelength is 1300 nm is irradiated on Si, while a current path is extracted using a bonding pad and a prober. A high-temperature SQUID made of HBCO (Ho—Ba—Cu—O) is located about 3.5 mm apart from the current path. Thus, the inventor tries to detect a magnetic field of the current path by using the SQUID. Results of the experiments show that the magnetic field can be detected with a sufficient strength. In the experiments, the SQUID is cooled down in accordance with the example 3.

Next, operations of the example 7 will be described with reference to FIG. 7. In the example 7, the thermoelectromotive current flows in the open circuit. However, ends of open circuits are focused at the focusing point 17d. So, the example 7 has an advantage in which the magnetic field detector 5 can be arranged at one position in proximity to the focusing point 17d. Results of inspections performed by the conventional arts show that there exit detects, which can be easily detected, by using the open-circuit configurations rather than using the closed-circuit configurations. Therefore, it is practical and preferable to actually perform the inspections using the current path focusing boards of the examples 6 and 7 respectively.

Lastly, the embodiment A and its examples have a variety of effects and technical features, which can be summarized as follows:

(1) The nondestructive inspection device or method is basically configured such that a laser beam originally generated by a light source is irradiated on a semiconductor device chip so as to inspect it in a nondestructive manner. Herein, a magnetic field detector detects a strength of a magnetic field induced by a thermoelectromotive current, which is caused to occur in the semiconductor device chip by irradiation of the laser beam. So, inspection is performed, based on the detected strength of the magnetic field, as to whether a defect exists in the semiconductor device chip or not.

(2) In the aforementioned nondestructive inspection device or method, when the laser beam is irradiated on a defect position on the semiconductor device chip so that the defect position is heated, a current transiently flows along a current path due to thermoelectromotive force. As a result, a magnetic field is produced by the current path. Thus, a defect which exists in the semiconductor device chip is detected by detecting strength of the magnetic field.

(3) In short, the present embodiment and its examples are not designed like the conventional art which directly measures the current which is caused to occur due to thermoelectromotive force, but they are designed such that the magnetic field induced by the current is measured. For this reason, it is unnecessary to connect the current variation detector to the semiconductor device chip. Therefore, it is unnecessary to perform operations, which are required in the conventional art, such as selecting the bonding pads and connecting the current variation detector to the bonding pads. Thus, it is possible to remarkably reduce the cost as well as a number of work steps required for the inspection.

(4) It is possible to start detecting defects of the semiconductor device chips before formation of the bonding pads. So, it is possible to perform inspection on the semiconductor device chips in upstream processes of manufacture before formation of the bonding pads. Therefore, as compared with the conventional art, it is possible to feed back inspection results in the upstream processes of manufacture of the semiconductor device chips.

(5) The nondestructive inspection device or method is equipped with a single current circuit (or multiple current circuits) whose one end is electrically connected to a predetermined position on the semiconductor device chip. In addition, the magnetic field detector is arranged in proximity to the current circuit. So, the device or method detects the strength of the magnetic field which is caused by the current flowing across the current circuit.

(6) In the aforementioned nondestructive inspection device or method, the laser beam is irradiated on the defect position on the semiconductor device chip so that the defect position is heated. So, the current transiently flows in the semiconductor device chip due to the thermoelectromotive force. The current flows from the semiconductor device chip to the current circuit (or current path) to induce the magnetic field. Thus, the device or method detects the strength of the magnetic field so as to detect a defect which exists in the semiconductor device chip.

(7) As described above, the present embodiment and its examples are designed such that the current which transiently flows inside of the semiconductor device chip is extracted by the current circuit, which is arranged externally of the semiconductor device chip. Herein, it is possible to set the path of the current circuit in such a way that a strong magnetic field is caused by the current flowing across the current circuit. Thus, it is possible to detect such a strong magnetic field. Even if the magnetic field of a very small strength is induced by the current which transiently flows only the inside of the semiconductor device chip and is hard to be detected, it is possible to detect the defect of the semiconductor device chip with high sensitivity.

(8) Incidentally, the aforementioned current circuit is connected to the specific bonding pad. So, the inspection is performed after formation of the bonding pad. Different from the conventional art, it is unnecessary to select the bonding pad, so it is possible to remarkably improve a work efficiency in inspection.

[B] Embodiment B

The embodiment B contains a variety of examples, which provide structures of semiconductor devices suited to the nondestructive inspection according to the embodiment A of the invention.

Figure 12:
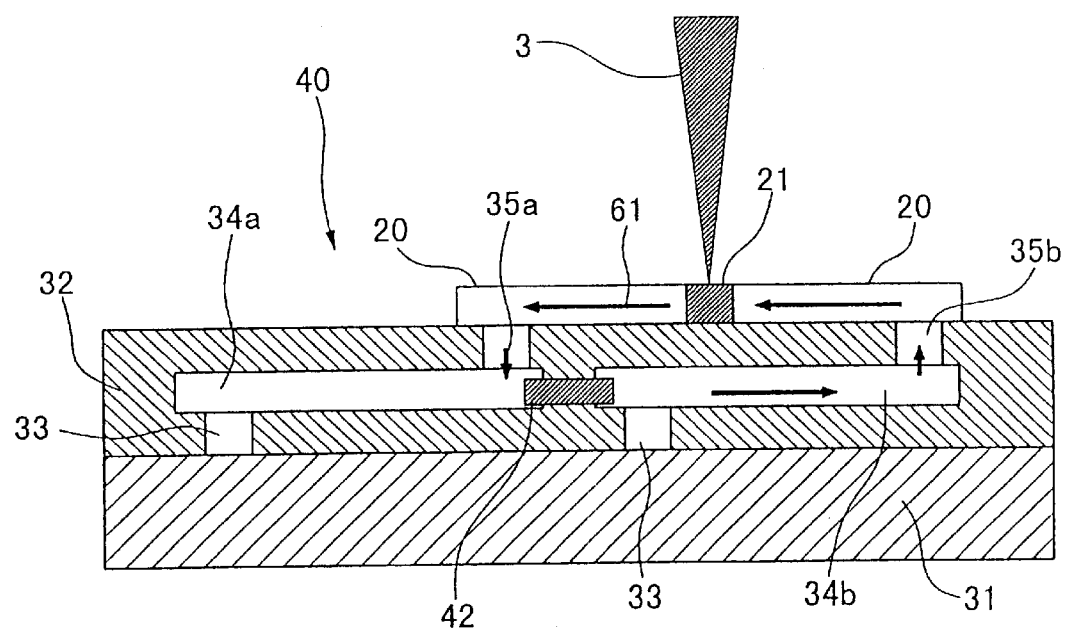
FIG. 12 is an enlarged fragmentary sectional view showing a construction of a semiconductor device wafer in accordance with example 1 of embodiment B of the invention.

FIG. 12 is an enlarged fragmentary sectional view showing an inspected area of a semiconductor device wafer 40, containing semiconductor device chips, in accordance with example 1 of the embodiment B of the invention. The semiconductor device wafer 40 is inspected by a nondestructive inspection device 102, which is similar to the foregoing nondestructive inspection device 301 shown in FIG. 1, for example.

First, a brief description will be given with respect to a configuration of the nondestructive inspection device 102 in conjunction with FIG. 1, wherein the foregoing semiconductor device chip 4 is replaced with the semiconductor device wafer 40.

The laser 1 generates a laser beam, which is narrowed down in an irradiation size by the optical system 2 to produce the laser beam 3. The laser beam 3 is irradiated on a surface of the semiconductor device wafer 40. This induces a magnetic field, which is detected by the magnetic field detector 5.

To obtain an image, the laser beam 3 is subjected to two-dimensional scanning. The scanning of the laser beam 3 is performed by polarization inside of the optical system 2. Instead of the scanning to move the laser beam 3, it is possible to move the semiconductor device wafer 40. That is, it is possible to actualize the same effect of the scanning to move the laser beam 3 by moving the semiconductor device wafer 40. In this case, a wafer stage (not shown) on which the semiconductor device wafer 40 is mounted is moved mechanically.

Output of the magnetic field detector 5 is supplied to the control image processing system 6, by which an image is displayed on the screen of the image display device 7 in response to luminance or pseudo color. Thus, it is possible to obtain a scan magnetic field image, which substantially corresponds to the aforementioned scan current variation image used by the conventional art.

Next, a description will be given with respect to a structure of the semiconductor device wafer 40 of the example 1 with reference to FIG. 12.

In the semiconductor device wafer 40 which is manufactured in accordance with manufacturing processes, first-layer wires 34a, 34b are formed on a silicon substrate 31 through an insulating layer 32. In addition, vias 35a, 35b are formed to be interconnected with the wires 34a, 34b respectively. Contact portions 33 are planted at two locations on the silicon substrate 31. Upper ends of the contact portions 33 are respectively connected to lower surfaces of the wires 34a, 34b in proximity to their first ends.

The vias 35a, 35b are formed on upper surfaces of the wires 34a, 34b in proximity to their second ends, which are opposite to the first ends.

An insulating layer 32 is formed on the first-layer wires 34a, 34b. Instead of forming second-layer wires on the insulating layer 32, the example 1 forms a wire 20 for formation of a thermoelectromotive force generation structure (or thermoelectromotive force generator). The wire 20 is elongated between the vias 35a and 35b. So, a lower surface of the wire 20 in proximity to its ends is connected to upper ends of the vias 35a, 35b. A thermoelectromotive force generator 21 is buried in a middle portion of the wire 20.

The first-layer wires 34a, 34b are elongated in substantially a straight manner in plan view. The example 1 contains a short-circuit defect 42, which exists between opposing ends of the wires 34a, 34b. So, the first-layer wires 34a, 34b are electrically short-circuited by the short-circuit defect 42.

When the laser beam 3 is irradiated on the thermoelectromotive force generator 21, a thermoelectromotive current flows along a path, shown by an arrow 61, in a closed circuit containing the short-circuit defect 42. Due to such a thermoelectromotive current, a magnetic field is induced and is detected by the magnetic field detector 5.

Next, a brief description will be given with respect to operations of the nondestructive inspection device 102, which operates basically in a similar manner of the foregoing nondestructive inspection device 301 of FIG. 1.

In the nondestructive inspection device 102, the optical system performs the scanning using the galvano-mirror, optoacoustic component and optoelectronic component by effecting polarization on the laser beam 3 in longitudinal and lateral directions.

If the scanned area is relatively large, the scanning using the laser beam 3 is inconvenient, so it is preferable to move the semiconductor device wafer 40 while fixing an irradiating position of the laser beam 3 and the magnetic field detector 5. In this case, the magnetic field detector 5 is capable of detecting the magnetic field at the position where the magnetic field is normally the strongest.

The scanning is performed on the laser beam 3, which is irradiated on the surface of the semiconductor device wafer 40. Herein, a flow of a thermoelectromotive current is caused under three conditions, as follows:

i) The laser beam 3 is irradiated on the thermoelectromotive force generator 21.

ii) The wire connected to the thermoelectromotive force generator 21 has a short-circuit defect 42.

iii) A current flows in a closed circuit in the configuration of FIG. 1.

Normally, there exists no position at which detectable thermoelectromotive force occurs on the semiconductor device wafer 40, which is manufactured in a normal way. The thermoelectromotive force is caused to occur at a position (or area) containing the aforementioned void(s) on the semiconductor device wafer 40. However, such an event does not construct any trouble for detection of the short-circuit defect 42 in accordance with the present example.

When the laser beam 3 is irradiated on the thermoelectromotive force generator 21, a thermoelectromotive current is caused to flow so that a magnetic field is induced. Thus, the magnetic field detector 5 detects the, magnetic field.

As for the magnetic field measurement method having high sensitivity, it is possible to employ the aforementioned devices such as the SQUID fluxmeter, flux-gate fluxmeter, nuclear magnetic resonance fluxmeter and semiconductor magnetic sensor.

Results of experiments which the inventor performs until now show that only the SQUID has a sufficient sensitivity in detecting the magnetic field induced by the thermoelectromotive current, which is caused to occur by irradiating the laser beam on the thermoelectromotive force generator 21 incorporated in the semiconductor device wafer 40.

Next, a description will be given with respect to operations of the semiconductor device wafer 40 with reference to FIG. 12.

When the laser beam 3 is irradiated on the thermoelectromotive force generator 21, a thermoelectromotive current flows in a closed circuit along a path whose direction is shown by arrows 61, as follows:

Thermoelectromotive force generator 21—via 35a—short-circuit defect 42—first-layer wire 34b—via 35b—thermoelectromotive force generator 21.

Such a closed-circuit current flows only when the short-circuit defect 42 exits in the closed circuit.

If no short-circuit defect exists, a transient current flows across the closed circuit. This current has a time constant which depends on parasitic capacitance and resistance as well as a time constant which depends on an irradiation time of the laser beam 3. So, the transient current must be attenuated in an extremely short period of time as compared with the aforementioned closed-circuit current. Therefore, as compared with a magnetic field induced by such transient current, a magnetic field induced by the current flowing across the closed circuit which contains the short-circuit defect 42 is further more intense to have long duration of occurrence. That is, it is possible to neglect the magnetic field induced by the transient current flowing across the closed circuit which does not contain the short-circuit defect 42.

When the short-circuit defect 42 exists in the closed circuit, the current flows along the path shown by the arrows 61. As a result, the magnetic field is induced and is detected by the magnetic field detector 5. Then, output of the magnetic field detector 5 is supplied to the control image processing system 6, by which an image displayed on the screen is enhanced with high luminance at a position which corresponds to the thermoelectromotive force generator 21. Thus, a human operator of the nondestructive inspection device 102 is capable of recognizing existence of a short-circuit defect, which exists between the first-layer wires 34a and 34b.

As described above, the present example offers detection of the short-circuit defect, which the conventional art cannot detect by merely performing inspection based on the thermoelectromotive force.

In addition, the present example provides a non-contact inspection with respect to the semiconductor device wafer 40. Therefore, it is possible to perform inspection before formation of bonding pads on the semiconductor device wafer 40 as shown in FIG. 12.

Next, a description will be given with respect to concrete examples of the thermoelectromotive force generator 21.

In general, metal materials such as aluminum, copper and gold, which are normally used for the semiconductor devices, have small thermoelectric power. So, those materials are not appropriate for formation of the thermoelectromotive force generator 21 because they cannot provide a sufficient S/N ratio.

Titanium silicide wires (abbreviated by "TiSi wires") formed on polysilicon are used as normal wires as well. Results of experiments which the inventor performs in the past show that the TiSi wires are capable of providing great thermoelectric power. So, they are suitable materials used for formation of the thermoelectromotive force generator 21.

Temperature gradient is required to produce thermoelectromotive force. Such temperature gradient can be actualized as follows:

The TiSi wire is partially reduced in width (or thickness) to provide a thin portion. Then, the laser beam 3 is irradiated on the TiSi wire in proximity to its thin portion.

Number and positions of thermoelectromotive force generators which are formed in semiconductor chips differ in response to situations (or stages of manufacture) in which the subject device is placed.

At an initial stage of development, it is preferable to install a considerable number of combinations of thermoelectromotive force generators in the semiconductor chips. Thus, it is possible to easily inspect short-circuit defects, so it is possible to feed back inspection results in an early stage of manufacture.

If every chip on the wafer has one or more short-circuit defects to be inspected, it is unnecessary to proceed to next steps of manufacture. So, it is necessary to analyze causes of the short-circuit defects, while corrections are made on layout designs and conditions of manufacture steps, which are relevant to the causes of the short-circuit defects. Thereafter, it is possible to start manufacture steps from the beginning. Thus, it is possible to make corrections on the manufacture more speedily than the conventional art, which performs defect analysis after formation of bonding pads.

If a chip which has no short-circuit is mounted on the wafer, it is necessary to remove the thermoelectromotive force generator 21 and its wire 20 from the semiconductor device chip 40 before proceeding to the next step of manufacture.

Incidentally, it is possible to form a dummy wire and a thermoelectromotive force generator in a unused area (or vacant area), like a gate array, which is not used as specific functions on the chip. So, it is possible to make a decision whether to proceed to the next step of manufacture by monitoring existence of a short-circuit defect on the chip. In this case, it is possible to proceed to the next step of manufacture while remaining the thermoelectromotive force generator and its wire as they are on the chip. Thus, it is possible to efficiently perform inspection and manufacture.

If the chip affords to have the aforementioned vacant area therein, it is possible to employ a further effective measure. That is, the thermoelectromotive force generator is not formed in an extra step which is provided in addition to the normal steps of manufacture. Instead, the thermoelectromotive force generator is formed in the vacant area as a part of the normal steps of manufacture, then, the wire is extended and is connected to the wires (e.g., first-layer wires 34a, 34b shown in FIG. 12) whose short-circuit defect (42) should be detected. According to such a measure, formation of the thermoelectromotive force generator can be completed by the normal steps of manufacture. So, it is possible to perform inspection without requiring extra cost for formation of the thermoelectromotive force generator and the like. Incidentally, details of the above measure will be described in detail.

In case of semiconductor device chips of a TEG structure (where "TEG" is an abbreviation for "Test Element Groups"), it is possible to employ the aforementioned measure(s) freely.

Conventionally, in order to perform an electric test on the semiconductor chip of the TEG structure, the semiconductor chip is equipped with probing pads for probing or boding pads from which electric currents are extracted using bonding wires.

According to the present example, the thermoelectromotive force generator is formed in the semiconductor chip so that the magnetic field detector 5 detects the thermoelectromotive current being caused to occur by irradiation of the laser beam. Therefore, the present example is capable of performing an electric test on the TEG structure without using the probing pads or bonding pads. In other words, it is possible to perform a test on the semiconductor chip without forming the bonding pads. In addition, the present example does not require manual operation for the probing. So, it is possible to reduce a number of steps in the test. Therefore, it is possible to reduce the manufacturing cost of the semiconductor devices. Further, it is possible to remarkably reduce the time for manufacturing the semiconductor devices.

Incidentally, it is possible to independently provide a single semiconductor device chip including the thermoelectromotive force generator 21, or it is possible to form such a semiconductor device chip on the wafer. In any cases, it is possible to detect the short-circuit defect 42 by using the thermoelectromotive force generator. Therefore, the present example is not necessarily limited to the state thereof in which it is independently provided or it is formed on the wafer.

Next, a description will be given with respect to nondestructive inspection performed on a semiconductor device wafer 44, which is designed in accordance with example 2 of the embodiment B.

The nondestructive inspection is performed by a nondestructive inspection device 104, which is similar to the foregoing nondestructive inspection device 302 shown in FIG. 2, wherein the semiconductor device chip 4 is replaced with the semiconductor device wafer 44. Specifically, FIG. 13A is a enlarged fragmentary sectional view showing an inspected region of the semiconductor device wafer 44, while FIG. 13B is an enlarged fragmentary plan view showing selected parts of the semiconductor device wafer 44.

Now, a description will be given with respect to a construction of the semiconductor device wafer 44, which is an inspected subject, with reference to FIGS. 13A and 13B. The semiconductor device wafer 44 is roughly similar to the aforementioned semiconductor device wafer 44 of FIG. 12, wherein same parts are designated by same reference symbols, hence, the description thereof will be omitted. Therefore, the construction of the semiconductor device wafer 44 will be described mainly with respect to differences by which the wafer 44 differ from the wafer 40.

The present example uses the laser beam 53 whose wavelength is 1.3 $\mu$m (or 1300 nm). This laser beam 53 is incident on a back (4f) of the semiconductor device wafer 44.

Figure 13A:
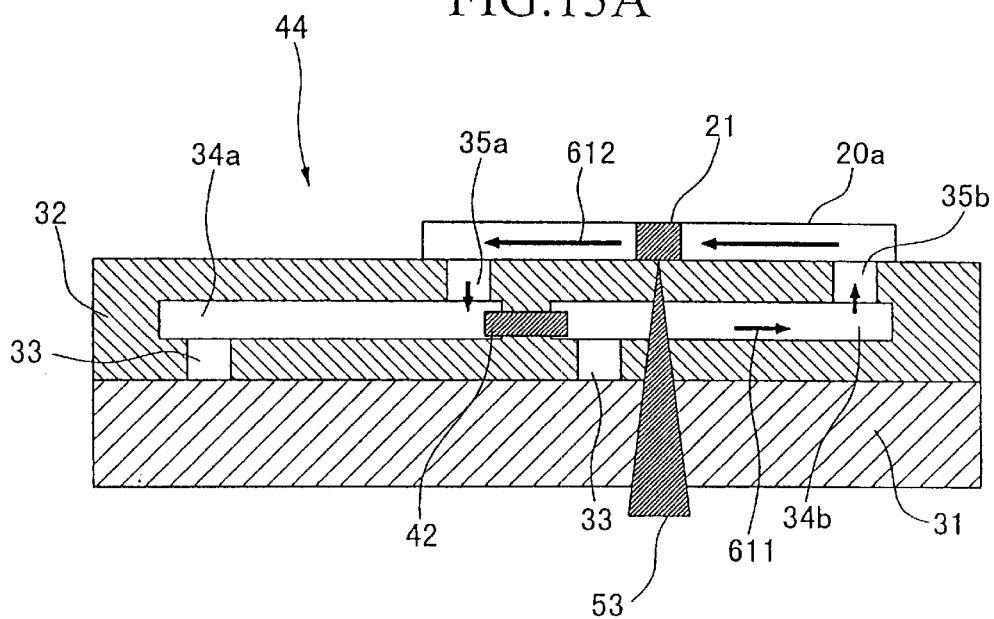
FIG. 13A is an enlarged fragmentary sectional view showing a construction of a semiconductor device wafer in accordance with example 2 of the embodiment B.
Figure 13B:
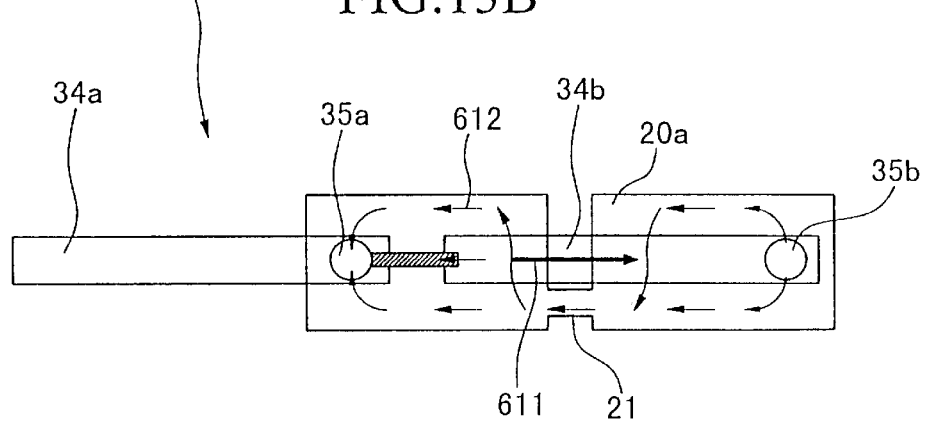
FIG. 13B is an enlarged fragmentary plan view showing selected parts of the semiconductor device wafer of the example 2.

As shown in FIGS. 13A and 13B, the thermoelectromotive force generator 21 is shifted in position from center of a wire 20a in order that the thermoelectromotive force generator 21 does not overlap with the first-layer wire 34b in a vertical direction, by which the laser beam 53, which is irradiated on the back of the wafer 44, is capable of reaching the thermoelectromotive force generator 21.

In addition, the wire 20a for formation of the thermoelectromotive force generator 21 is broadened in width as compared with the first-layer wire 34b. Reasons will be described later.

A supplementary explanation will be given with respect to use of the laser whose wavelength is 1300 nm.

Diameters of laser beams, which determine spatial resolution, can be selected from a broad range by appropriately selecting an objective lens. However, the minimum diameter is limited to the wavelength or so due to the diffraction limit.

By providing the optical system with the common focusing function or by using the objective lens whose NA (i.e., Numerical Aperture) is large, it is possible to improve the spatial resolution for the scan laser microphotograph. For example, it is possible to easily actualize a resolution of 400 nm or so with respect to the laser of 633 nm, while it is possible to easily actualize a resolution of 800 nm or so with respect to the laser of 1300 nm.

If the laser of 1300 nm cannot provide a sufficient spatial resolution for the scan laser microphotograph which is produced by irradiating the laser beam on the back of the semiconductor device wafer, it is possible to use another laser of a short wavelength while reducing the wafer in thickness to suppress attenuation of the laser beam.

For example, a laser beam whose wavelength is 633 nm is capable of transmitting through a wafer whose thickness is reduced to 15 µm with 60% of transmission factor. Therefore, it is possible to produce a scan laser microphotograph with a high spatial resolution by irradiating the laser beam on the back of the wafer.

However, even if the wafer is reduced in thickness, it is necessary to use a laser of a long wavelength for producing a scan magnetic field image. Namely, if the wafer (or inspected subject) is configured such that an OBIC current causes noise, in other words, if a current path is not configured using only wires but is configured to include a silicon portion, a magnetic field should be induced by irradiation of the laser beam whose wavelength is long to avoid occurrence of the OBIC current, so that the scan magnetic field image should be obtained by detecting such a magnetic field.

Next, a description will be given with respect to operations of the semiconductor device wafer 44 having the back to which the laser beam 53 is irradiated with reference to FIG. 13B.

The semiconductor device wafer 44 of the example 2 is designed such that the wire 20a is broadened in width as shown in FIG. 13B. Reasons will be described below.

As similar to the aforementioned example 1 of FIG. 12, when the laser beam 53 is irradiated on the thermoelectromotive force generator 21, a thermoelectromotive current is caused to flow along a current path in a closed circuit, as follows:

Thermoelectromotive force generator 21—wire 20a—via 35a—short-circuit defect 42—first-layer wire 34b—via 35b—wire 20a—thermoelectromotive force generator 21.

In FIGS. 13A and 13B, the current path is classified into two paths, i.e., a current path 611 related to the first-layer wire 34b and current paths 612 related to the wire 20a.

The current path 611 is relatively small in width, so magnetic fields induced by the current are localized along the wire 34b.

In contrast, the current paths 612 are distributed in a relatively broad range of area, so magnetic fields induced by the currents spread in a broad range of area.

A direction of the magnetic field induced by the current path 611 is opposite to a direction of the magnetic field induced by the current path 612 outside of the closed circuit, so those magnetic fields cancel each other. However, those magnetic fields differ from each other in distribution areas, so they do not cancel each other so much. For this reason, it is possible to detect the magnetic field(s).

Incidentally, if a width of the wire on which the short-circuit defect 42 should be detected is not narrow but is broad, it is preferable to reduce the wire 20a in width, which is reverse to the example 2.

Next, a description will be given with respect to concrete examples of the thermoelectromotive force generator 21.

According to results of experiments that the inventor perform in the past, it is preferable to use a TiSi wire as the wire 20a, which is partially reduced in width to provide the thermoelectromotive force generator 21.

Because, the material of TiSi has great thermoelectric power. In addition, it is possible to form a thin portion, which is made by partially reducing the TiSi wire in width and in which thermal conductivity is deteriorated. By irradiating the laser beam 53 on such a thin portion of the TiSi wire, it is possible to actualize a great temperature gradient and imbalances of temperature gradient between left and right sides of the thin portion with ease. As a result, it is possible to produce transiently great thermoelectromotive force, which causes a thermoelectromotive current.

The inventor performs experiments as follows:

Laser beams whose diameters are 0.4 µm are irradiated on the thermoelectromotive force generator 21, made of the TiSi wire, with irradiation power of 3 mW or so. Results of the experiments show that voltage of 10 mV or so is produced due to the thermoelectromotive force.

The above voltage value is capable of causing a sufficient amount of current inducing a magnetic field which can be detected by the high-temperature SQUID.

In the above example, the thermoelectromotive force generator 21 is formed as an integral part of the wire 20a. Instead, it is possible to form the thermoelectromotive force generator 21 and the wire for connecting the thermoelectromotive force generator 21 to an inspected subject with different materials respectively.

Figure 14A:
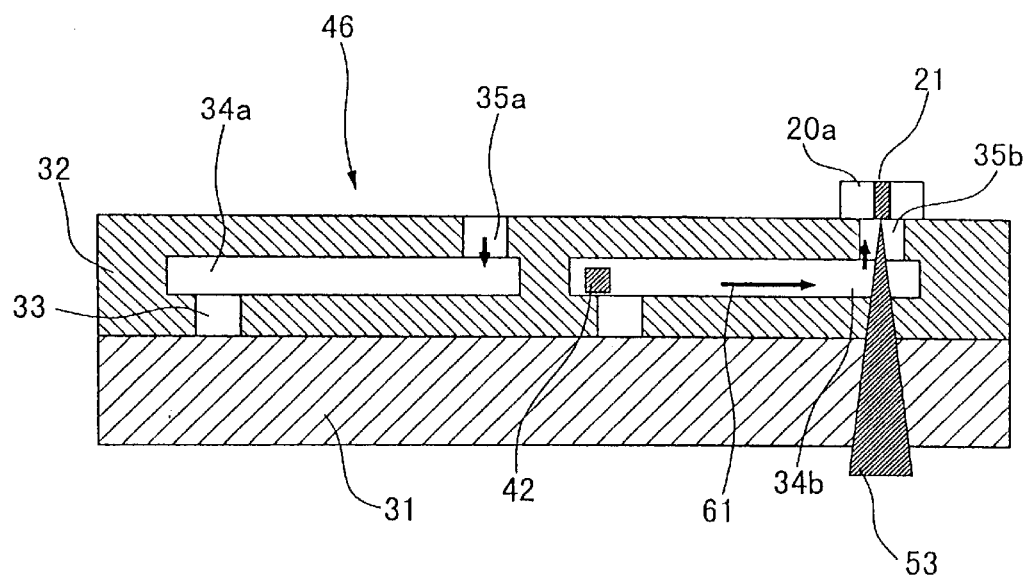
FIG. 14A is an enlarged fragmentary sectional view showing a construction of a semiconductor device wafer in accordance with example 3 of the embodiment B.
Figure 14B:
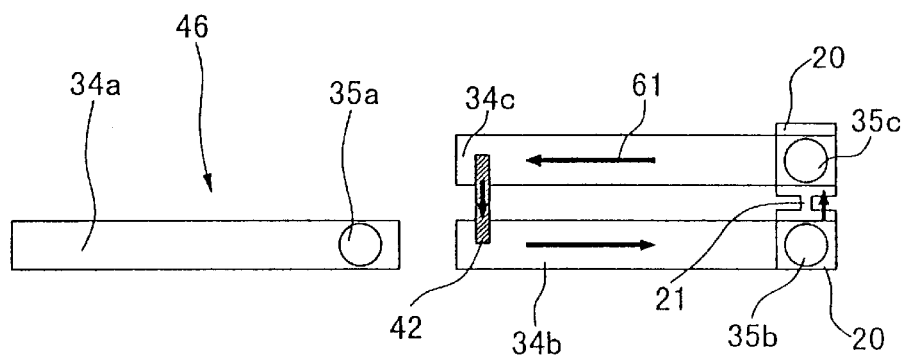
FIG. 14B is an enlarged fragmentary plan view showing selected parts of the semiconductor device wafer of the example 3.

Next, a description will be given with respect to a semiconductor device wafer 46 in accordance with example 3 of the embodiment B with reference to FIGS. 14A and 14B. Specifically, FIG. 14A is an enlarged fragmentary sectional view showing a construction of the semiconductor device wafer 46, which contains a semiconductor device chip being subjected to nondestructive inspection. In addition, FIG. 14B is an enlarged fragmentary plan view showing selected parts of the semiconductor device wafer 46.

Incidentally, the nondestructive inspection is performed on the semiconductor device wafer 46 by the aforementioned nondestructive inspection device 104.

The semiconductor device wafer 46 of the example 3 is characterized by that a first-layer wire 34c is arranged substantially in parallel to the first-layer wire 34b, which is located apart from the first-layer wire 34a. A prescribed interval of distance is placed between the wires 34b and 34c.

A short-circuit defect 42 lies between the first-layer wires 34b and 34c. In order to detect such a short-circuit defect 42, a thermoelectromotive force generator 21 is arranged in proximity to ends of the wires 34b, 34c as shown in FIGS. 14A and 14B. Specifically, two wires 20 for formation of the thermoelectromotive force generator 21 are respectively formed on the ends of the first-layer wires 34b, 34c via the insulating layer 32. Then, the thermoelectromotive force generator 21 is formed between the two wires 20 to be connected together thereby. Vias 35b, 35c are planted respectively on upper surfaces of the ends of the first-layer wires 34b, 34c. Upper ends of the vias 35b, 35c are connected to lower surfaces of the wires 20 respectively.

The semiconductor device wafer 46 shows that the short-circuit defect 42 exists at other ends of the first-layer wires 34b, 34c, which are opposite to the thermoelectromotive force generator 21, for example. In this case, when the laser beam 53 is irradiated on the thermoelectromotive force generator 21, a current is caused to flow along a current path, shown by arrows 61.

A magnetic field detector detects such a current to perform image processing, so that it is possible to produce a scan magnetic field image with respect to the short-circuit defect 42. So, the example 3 is capable of effectively detecting the short-circuit defect 42 being elongated in a width direction of the two wires, which are arranged in a side-by-side manner with a certain interval of distance. Thus, the example 3 is capable of obtaining a similar effect of the aforementioned example 1.

In addition, the example 3 is characterized by that the current flows in a closed circuit, which is formed on a plane in parallel with a surface of the wafer. Therefore, a magnetic field is induced to spread in a vertical direction. Such a magnetic field can be easily detected by an external device. Different from the foregoing example 2, the example 3 does not require a modification of structure in consideration of the width of the wire, for example.

Further, the example 3 is characterized by that as shown in FIG. 14B, the thermoelectromotive force generator 21 is arranged in a gap between the wires 34b, 34c. For this reason, it is possible to irradiate the laser beam 53 on the back of the semiconductor device wafer 46 as shown in FIG. 14A.

Figure 15A:
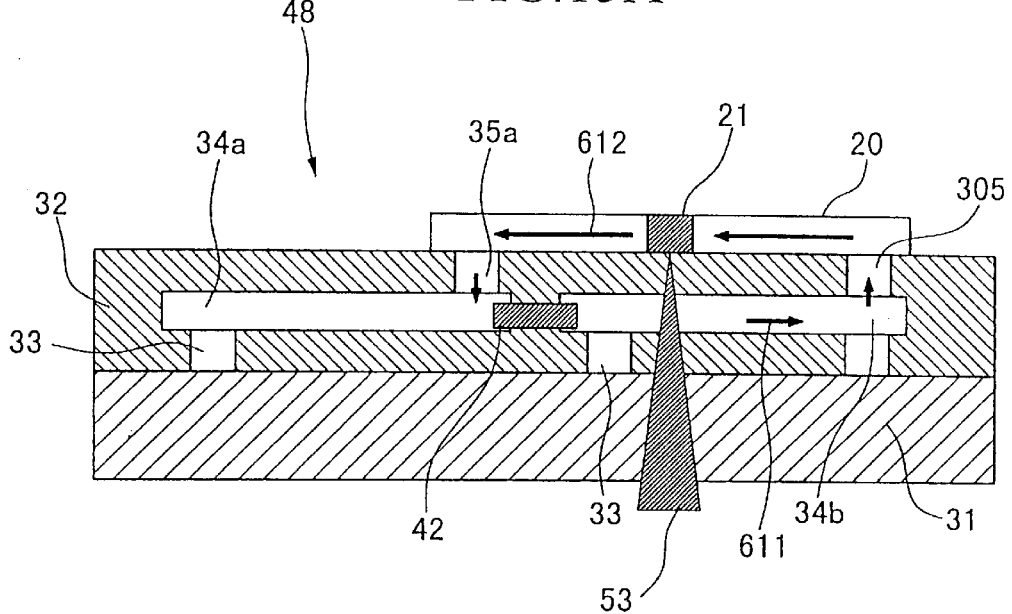
FIG. 15A is an enlarged fragmentary sectional view showing a construction of a semiconductor device wafer in accordance with example 4 of the embodiment B.
Figure 15B:
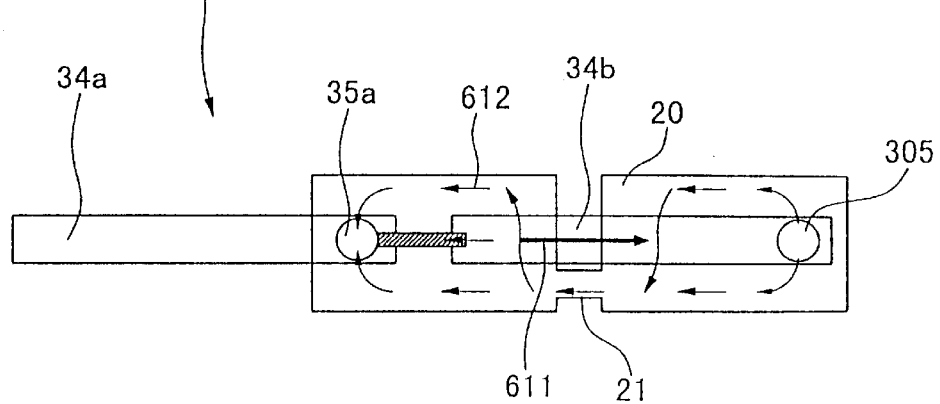
FIG. 15B is an enlarged fragmentary plan view showing selected parts of the semiconductor device wafer of the example 4.

Next, a description will be given with respect to a semiconductor device wafer 48 in accordance with example 4 of the embodiment B with reference to FIGS. 15A and 15B. Specifically, FIG. 15A is an enlarged fragmentary sectional view showing a construction of the semiconductor device wafer 48, which contains a semiconductor device chip being subjected to nondestructive inspection. In addition, FIG. 15B is an enlarged fragmentary plan view showing selected parts of the semiconductor device wafer 48.

Incidentally, the nondestructive inspection is performed on the semiconductor device wafer 48 by using the foregoing nondestructive inspection device 104, for example.

Different from the aforementioned example 2, the semiconductor device wafer 48 of the example 4 is characterized by that the first-layer wire 34b is provided to connect different diffusion layers in the substrate 31, so no via is provided for connection being established between the first-layer wire 34b and its upper wire. To establish connection between the diffusion layers, contact portions 33 being connected to the diffusion layers are formed under ends of the first-layer wire 34b.

In the example 4 in which no via is provided for connection between the first-layer wire 34b and its upper wire, an inspection via 305 is planted on an upper surface of one end of the first-layer wire 34b, for example. By forming such an inspection via 305 in the example 4, it is possible to form a construction substantially equivalent to the aforementioned semiconductor device wafer 44 of the example 2. As a result, the example 4 is capable of offering a similar effect of the example 2 by performing similar inspection of the example 2.

Incidentally, it is necessary to form the inspection via 305 at a position, which does not influence the upper wire. Thus, even if the upper wire is formed after the inspection is completed and after the thermoelectromotive force generator 21 and the wire 20 are removed from the semiconductor device wafer 48, there is no possibility in which the inspection via 305 is connected to the upper wire. That is, formation of the inspection via 305 at the selected position does not (badly) influence original functions of the semiconductor devices.

Next, a description will be given with respect to a semiconductor device wafer 50 in accordance with example 5 of the embodiment B with reference to FIGS. 16A and 16B.

Figure 16A:
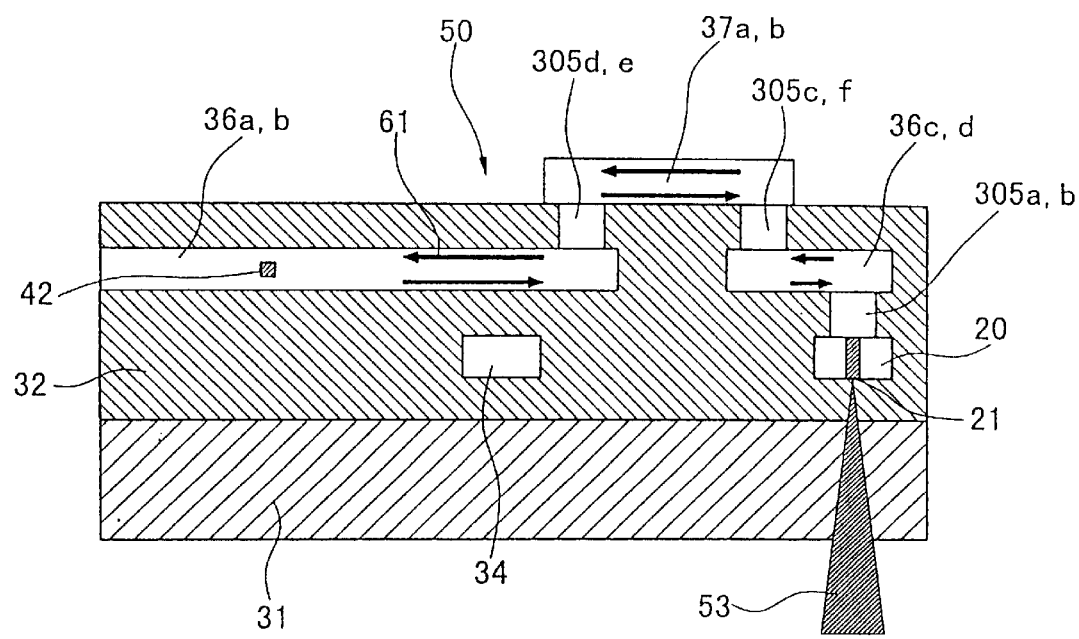
FIG. 16A is an enlarged fragmentary sectional view showing a construction of a semiconductor device wafer in accordance with example 5 of the embodiment B.

FIG. 16A is an enlarged fragmentary sectional view showing a construction of the semiconductor device wafer 50, which includes a semiconductor device chip being subjected to nondestructive inspection. In addition, FIG. 16B is an enlarged fragmentary plan view showing selected parts of the semiconductor device wafer 50.

Incidentally, the nondestructive inspection is performed on the semiconductor device wafer 50 by using the aforementioned nondestructive inspection device 104, for example.

In the semiconductor device wafer 50 of the example 5, a thermoelectromotive force generator 21 and its wires 20 are formed in a same layer of a first-layer wire 34 in accordance with its manufacturing process. As the material used for formation of the wires 20 and the thermoelectromotive force generator 21, it is preferable to use the aforementioned material of TiSi.

A wire which corresponds to an inspected subject is a second-layer wire. Specifically, two second-layer wires 36a, 36b are formed above the first-layer wire 34 via the insulating layer 32. Herein, the second-layer wires 36a, 36b are placed in a same level and are elongated substantially in parallel with each other. Incidentally, the second-layer wires 36a, 36b are further elongated in a leftward direction in FIGS. 16A, 16B. To accomplish original functions, those two wires 36a, 36b are electrically insulated from each other.

Figure 16B:
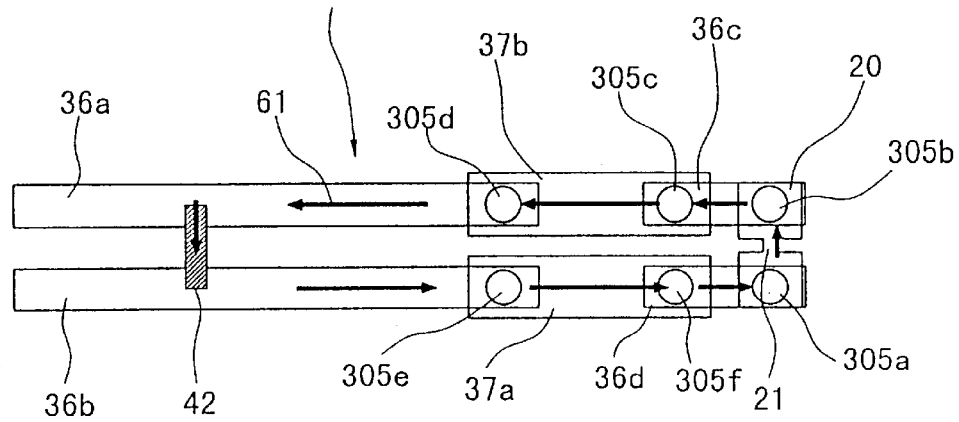
FIG. 16B is an enlarged fragmentary plan view showing selected parts of the semiconductor device wafer of the example 5.

As shown in FIG. 16B, the thermoelectromotive force generator 21 is arranged between the second-layer wires 36a, 36b. The wires 20 are elongated between the wires 36a, 36b to sandwich the thermoelectromotive force generator 21 therebetween.

Inspection vias 305a, 305b are planted on the wires 20 respectively. On the inspection vias 305a, 305b, inspection wires 36c, 36d are formed in accordance with the same manufacturing process of the second-layer wires 36a, 36b. The inspection wires 36c, 36d are located mutually apart from each other with a certain interval of distance, while they are elongated towards the second-layer wires 36a, 36b respectively. Lower surfaces of the inspection wires 36c, 36d are connected to upper surfaces of the inspection vias 305a, 305b respectively in proximity to ends thereof, which are above the thermoelectromotive force generator 21.

After formation of the second-layer wires, the insulating layer 32 is further formed. In addition, four inspection vias are formed to penetrate through the insulating layer 32 on the second-layer wires 36a, 36b and the inspection wires 36c, 36d respectively. Specifically, inspection vias 305d, 305e are formed on ends of the second-layer wires 36a, 36b respectively, while inspection vias 305c, 305f are formed on ends of the inspection wires 36c, 36d in proximity to the wires 36a, 36b respectively.

On an surface of the insulating layer 32, inspection wires 37a, 37b are formed substantially in parallel with each other. That is, the inspection wire 37b is formed to establish an electric connection between the inspection vias 305d, 305c, while the inspection wire 37a is formed to establish an electric connection between the inspection vias 305e, 305f.

The semiconductor device wafer 50 has a short-circuit defect 42, which lies between the second-layer wires 36a, 36b. In this case, when the laser beam 53 is irradiated toward the thermoelectromotive force generator 21 from the back of the semiconductor device wafer 50, a current is caused to flow along a current path shown by arrows 61 in a closed circuit, so that a magnetic field is induced. So, by detecting such a magnetic field, it is possible to produce a scan magnetic field image with respect to the short circuit defect 42. Thus, the example 5 is capable of offering the same effect of the aforementioned example 1.

In addition, the example 5 is characterized by that the wire 20 and the thermoelectromotive force generator 21 can be formed in accordance with the same manufacturing process of the first-layer wires, while the inspection wires 36c, 36d can be formed in accordance with the same manufacturing process of the second-layer wires. Thus, it is possible to minimize an increase of a number of extra steps of manufacture, which are used for formation of components (e.g., wires) for inspection.

However, the example 5 requires an extra step of manufacture used for formation of the inspection wires 37a, 37b. Those wires 37a, 37b can be formed using aluminum wires having a simple structure. Therefore, as compared with formation of the wire 20 in which the TiSi wire is newly formed, it is possible to minimize an increase of a number of steps of manufacture as a whole.

In addition, it is extremely easy to remove the aforementioned inspection wires 37a, 37b after inspection. Therefore, formation and removal of those wires do not substantially influence original functions of semiconductor devices.

Next, a description will be given with respect to a semiconductor device wafer 52 in accordance with example 6 of the embodiment B with reference to FIGS. 17A and 17B.

Figure 17A:
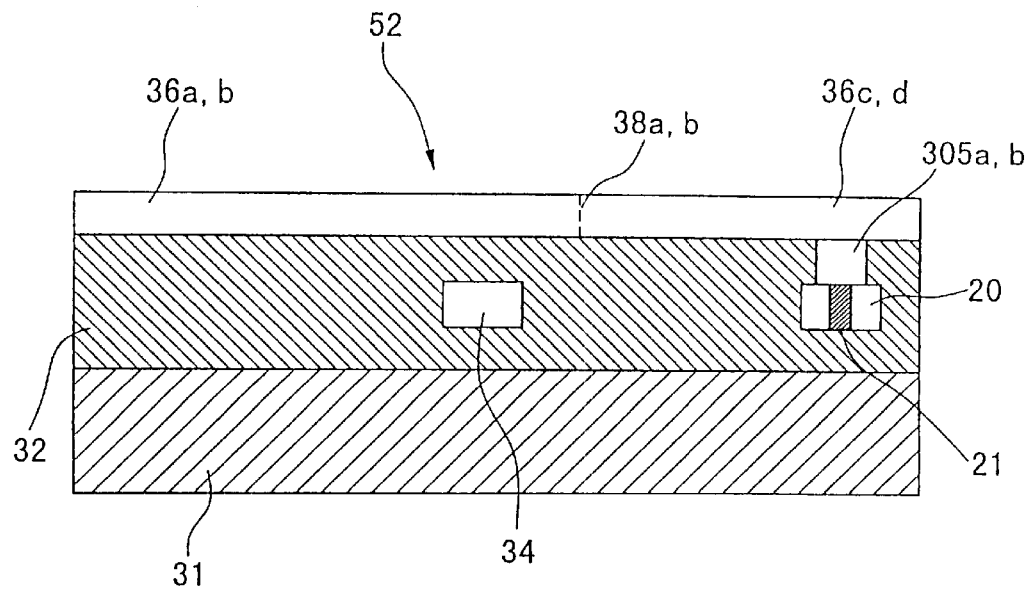
FIG. 17A is an enlarged fragmentary sectional view showing a construction of a semiconductor device wafer in accordance with example 6 of the embodiment B.
Figure 17B:
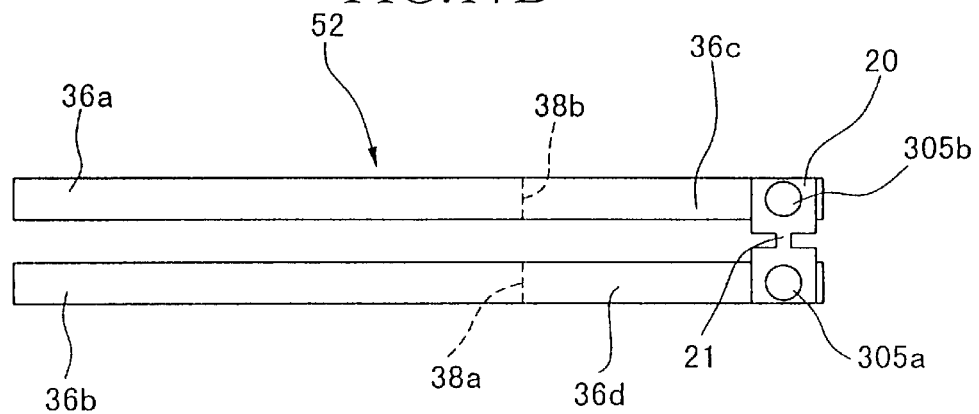
FIG. 17B is an enlarged fragmentary plan view showing selected parts of the semiconductor device wafer of the example 6.

FIG. 17A is an enlarged fragmentary sectional view showing a construction of the semiconductor device wafer 52, which includes a semiconductor device chip being subjected to nondestructive inspection. FIG. 17B is an enlarged fragmentary plan view showing selected parts of the semiconductor device wafer 52.

Incidentally, nondestructive inspection can be performed on the semiconductor device wafer 52 by using the aforementioned nondestructive inspection device 104, for example.

Different from the aforementioned semiconductor device wafer 50 of the example 5, the semiconductor device wafer 52 of the example 6 is characterized by that inspection wires are formed only in a same layer of second-layer wires which are subjected to inspection.

In the semiconductor device wafer 52, a thermoelectromotive force generator 21 and its wires 20 are formed in a same layer of the first-layer wire 34 in accordance with its manufacturing process. Then, like the aforementioned semiconductor device wafer 50, the second-layer wires 36a, 36b are formed via the insulating layer 32. As compared with the semiconductor device wafer 50, the second-layer wires 36a, 36b of the semiconductor device wafer 52 are elongated further more to form extended portions, which act as inspection wires 36c, 36d.

The inspection wires 36c, 36d are extended above the wires 20. So, the wires 20 are connected to ends of the inspection wires 36c, 36d by means of inspection vias 305a, 305b respectively.

Figure 19A:
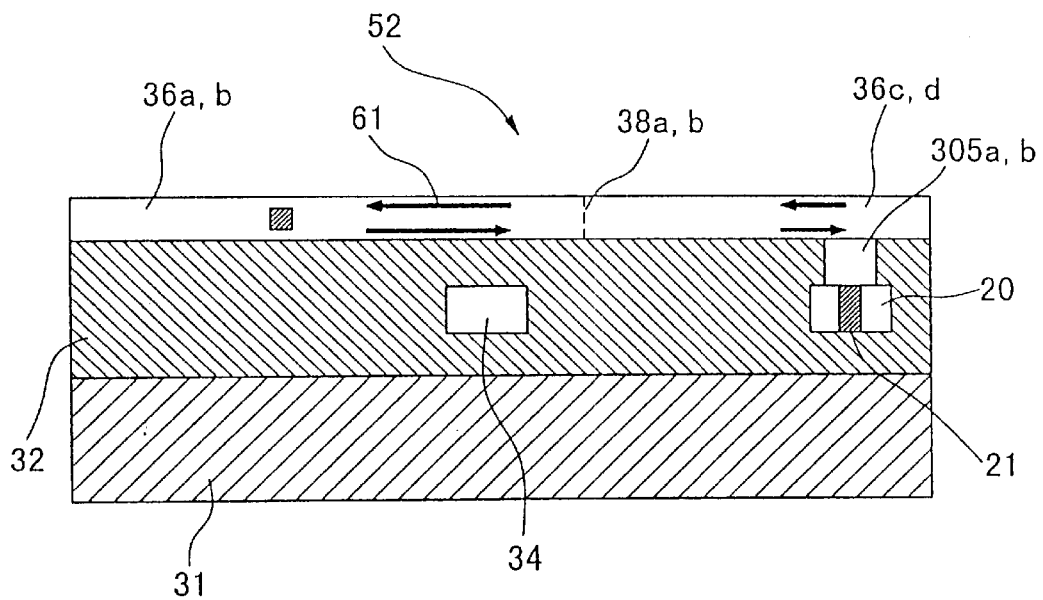
FIG. 19A is an enlarged fragmentary section view showing the semiconductor device wafer of the example 6 in which a current is caused to flow by irradiation of a laser beam on a thermoelectromotive force generator at an inspection mode.
Figure 19B:
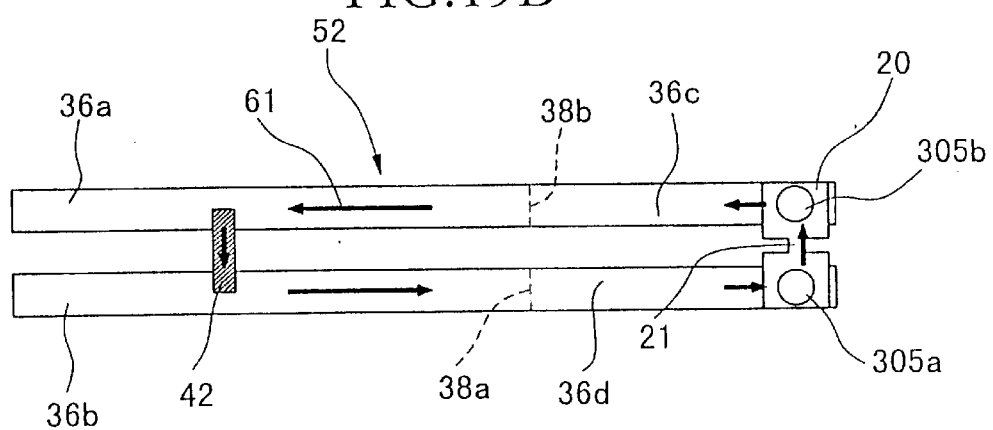
FIG. 19B is an enlarged fragmentary plan view showing parts of the semiconductor device wafer of the example 6 in which the current flows along a path in a closed circuit by way of wires.

As for the semiconductor device wafer 52, the human operator performs the prescribed procedures of inspection, which are similarly performed with respect to the foregoing example 2. Suppose that a short-circuit defect 42 exists between the second-layer wires 36a, 36b of the semiconductor device wafer 52 as shown in FIGS. 19A and 19B. In that case, when the laser beam 53 is irradiated on the thermoelectromotive force generator 21, a current is caused to flow along a current path, shown by arrows 61, by way of the wires. Thus, it is possible to detect the short-circuit defect 42. As a result, the example 6 is capable of offering the similar effect of the foregoing example 1.

Figure 18A:
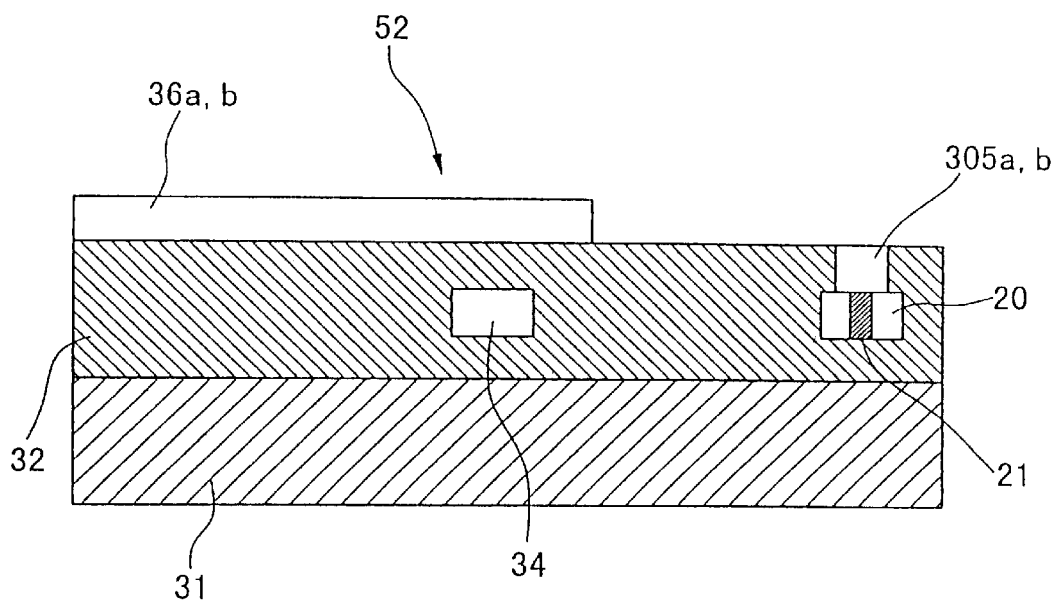
FIG. 18A is an enlarged fragmentary sectional view showing the semiconductor device wafer of the example 6 from which inspection wires are removed.
Figure 18B:
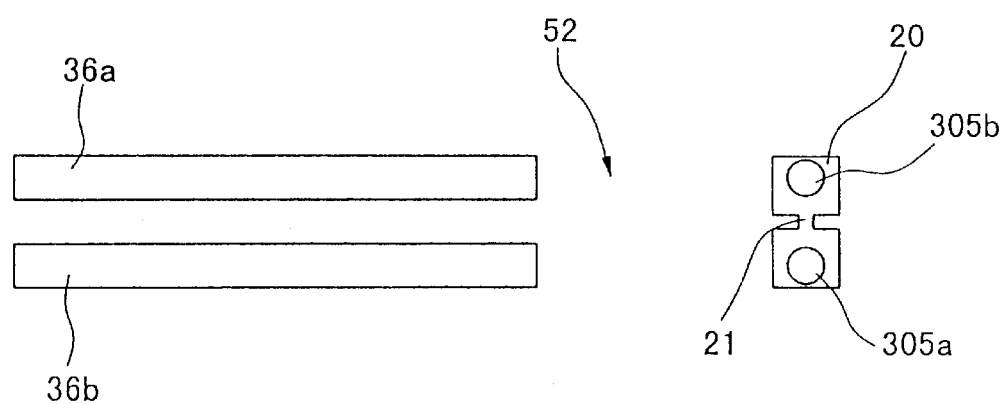
FIG. 18B is an enlarged fragmentary plan view showing parts of the semiconductor device wafer of the example 6 from which the inspection wires are removed.

In the semiconductor device wafer 52, boundaries 38a, 38b are placed between the second-layer wires 36a, 36b and the inspection wires 36c, 36d respectively. After completion of the inspection, the inspection wires 36c, 36d are removed from the semiconductor device wafer 52 by the boundaries 38a, 38b. As a result, the semiconductor device wafer 52 is partially changed in construction as shown in FIGS. 18A and 18B, which respectively correspond to FIGS. 17A and 17B.

As described above, the example 6 is characterized by that the inspection wires 36c, 36d are formed as the extending portions which extend from the second-layer wires 36a, 36b respectively. So, as compared with the example 5, the example 6 is very simple in steps of manufacture. In addition, the example 6 allows removal of the inspection wires 36c, 36d with ease.

Further, the example 6 is characterized by that wires used for inspection are not necessarily formed on the second-layer wires 36a, 36b which are subjected to inspection. Therefore, it is possible to immediately start the inspection after completion in formation of the second-layer wires 36a, 36b.

As shown in FIGS. 19A and 19B, a simple closed circuit is formed using the short-circuit defect 42, wherein a simple current path shown by the arrows 61 is established. Therefore, it is possible to detect the magnetic field, induced by the current flowing across the closed circuit, with ease. Thus, it is possible to produce a good scan magnetic field image.

Next, a description will be given with respect to a semiconductor device wafer 54 in accordance with example 7 of the embodiment B with reference to FIGS. 20A and 20B. Herein, FIG. 20A is a conceptual illustration showing a layout of the semiconductor device wafer 54 which contains a number of blocks each having a specific function, while FIG. 20B is a schematic illustration showing electric connections established between two blocks, which are repeatedly used for nondestructive inspection.

Incidentally, the nondestructive inspection is performed using the foregoing nondestructive inspection device 102, for example.

Different from the aforementioned examples, the semiconductor device wafer 54 of the example 7 is characterized by that an inspection tool area 120 containing a thermoelectromotive force generator 21 is arranged independently of an inspected area 100 containing inspected elements such as wires being inspected.

Figure 20A:
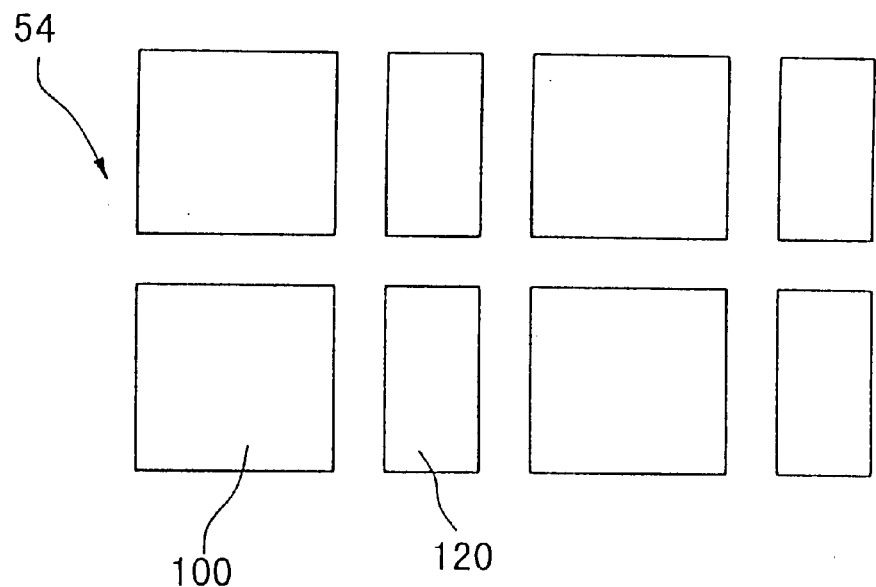
FIG. 20A is a conceptual illustration showing a layout of a semiconductor device wafer in accordance with example 7 of the embodiment B.
Figure 20B:
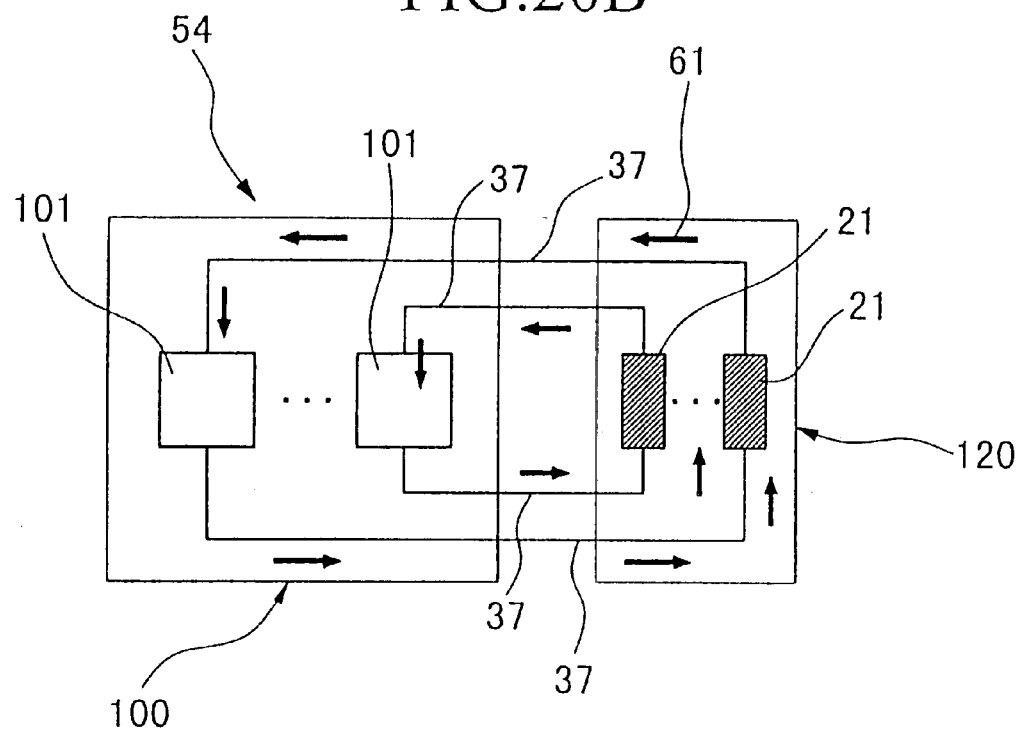
FIG. 20B is a schematic illustration showing a pair of areas, extracted from the layout of the semiconductor device wafer of the example 7, and their electric connections.

As shown in FIG. 20A, multiple pairs each consisting of a pair of one inspected area 100 and one inspection tool area 120 are arranged and aligned on the semiconductor device wafer 54. FIG. 20B shows a pair of the inspected area 100 and inspection tool area 120, which are extracted from the semiconductor device wafer 54. A number of thermoelectromotive force generators 21 are formed in the inspection tool area 120, while a number of inspected elements 101 are correspondingly formed in the inspected area 100. Then, each thermoelectromotive force generator 21 is correspondingly connected to each inspected element 101 by an inspection wire 37. Incidentally, the inspected element 101 contains inspected subjects such as two wires, which are arranged in proximity to each other.

Thus, the semiconductor device wafer 54 is subjected to inspection whose procedures are similar to the foregoing example 1. So, if a short-circuit defect lies between the two wires contained in the inspected element 101, when a laser beam is irradiated on the thermoelectromotive force generator 21, a current is caused to flow along a path, shown by arrows 61, in a closed circuit by way of the wires. Thus, it is possible to detect the short-circuit defect 42. Therefore, the example 7 is capable of offering the similar effect of the foregoing example 1.

As described before with respect to the examples 5 and 6, the thermoelectromotive force generator 21 can be formed to match with the wire(s) of the lowest layer. Therefore, it is possible to obtain a certain degree of freedom in design of semiconductor devices such as the gate array and TEG, in which a vacant area can be freely set. That is, the inspection tool area 120 containing the thermoelectromotive force generator 21 is formed on the semiconductor device wafer in advance, then, the inspected area 100 which is an area having original functions as the semiconductor devices is designed according to needs later.

As described above, the present example is capable of offering an effect, in which flexibility is increased with respect to design and manufacture of the semiconductor device wafer 54, in addition to the aforementioned effects.

Incidentally, the example 7 has a property in which the thermoelectromotive force generator 21 is arranged relatively apart from the inspected element 101. Therefore, it is preferable to set a layout, in which a correspondence relationship between the thermoelectromotive force generator 21 and the inspected element 101 can be easily grasped, so it is possible to discriminate the inspected element in which the short-circuit defect exists from other inspected areas with ease.

By using an appropriate inspection system, it is possible to obtain a positional recognition accuracy of 400 nm or so. With such an accuracy, it is possible to specify an irradiating position of the laser beam, i.e., a position of the thermoelectromotive force generator 21. Therefore, the inspected element 101 in which the short-circuit defect actually exists is discriminated based on the specified thermoelectromotive force generator 21. For this reason, it is preferable to provide a layout in which a correspondence relationship between the thermoelectromotive force generator 21 and the inspected element 101 can be easily grasped.

Concretely speaking, in the case of FIG. 20B, the thermoelectromotive force generators 21 are simply aligned from the right to the left, while the inspected elements 101 are correspondingly aligned from the left to the right. Thus, it is possible to clarify the correspondence relationships between them. Using such correspondence relationship(s), it is possible to certainly specify the inspected element 101, in which the short-circuit defect actually exists, on the basis of the thermoelectromotive force generator 21 which is specified by magnetic-field detection.

In the semiconductor device wafer 54 shown in FIG. 20A, the inspection tool areas, each containing the thermoelectromotive force generators, are arranged regularly in connection with the inspected areas. However, those areas are not necessarily arranged regularly. In other words, it is possible to freely arrange them in response to vacancy of the wafer.

As described above, the embodiment B and its examples provide a variety of effects, as follows:

(1) It is possible to detect the short-circuit defect, which cannot be detected by the conventional inspection operated based on the thermoelectromotive force.

(2) It is possible to perform the inspection in a non-contact manner with respect to substrates of semiconductor devices. So, the inspection can be performed before formation of bonding pads on the substrates of the semiconductor devices.

(3) As a result, it is possible to detect electric short-circuited points of the semiconductor devices in the initial stage of manufacture. So, it is possible to employ appropriate measures speedily. Thus, it is possible to remarkably improve yield and reliability of products.

[C] Embodiment C

Figure 27:
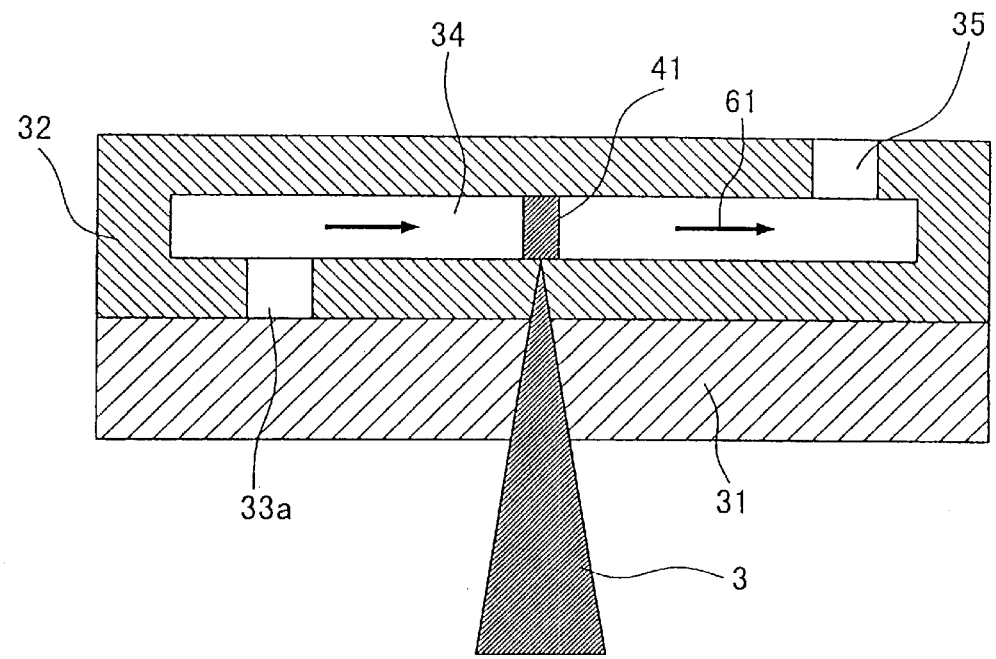
FIG. 27 is a sectional view showing a construction of a semiconductor device chip, which is in an intermediate stage of manufacture.

A nondestructive inspection method is actualized using the aforementioned nondestructive inspection device of FIG. 1A to perform nondestructive inspection on a semiconductor device chip 40 shown in FIG. 27, which is in an intermediate stage of manufacture, for example. Herein, the semiconductor device chip 40 is set upside down as compared with the foregoing semiconductor device chip 4 originally shown in FIG. 1A.

In the nondestructive inspection device, the laser 1 generates laser light, which is narrowed down in irradiation range by the optical system 2 to produce a laser beam 3. The laser beam 3 is irradiated on a back 40b (corresponding to a substrate) of the semiconductor device chip 40, which is not finished in manufacture. The laser beam 3 is converged on a wiring portion in proximity to a surface 40f of the semiconductor device chip 40. Using the laser beam 3, scanning is performed on the semiconductor device chip 40.

Incidentally, it is possible to obtain a good sensitivity in magnetic field detection by approaching the magnetic field detector 5 to a laser irradiated portion, i.e., a thermoelectromotive force generated portion as closely as possible. For this reason, the scanning is not performed by moving the laser beam 3. In other words, the scanning is performed on the semiconductor device chip 40 by fixing a positional relationship between the laser irradiated portion and the magnetic field detector 5.

In FIG. 27, an insulating layer 32 is formed on a silicon substrate 31. A first-layer wire 34 is connected to the silicon substrate 31 by a contact portion 33. A circuit via 35 is formed and is electrically connected to the first-layer wire 34.

Figure 28:
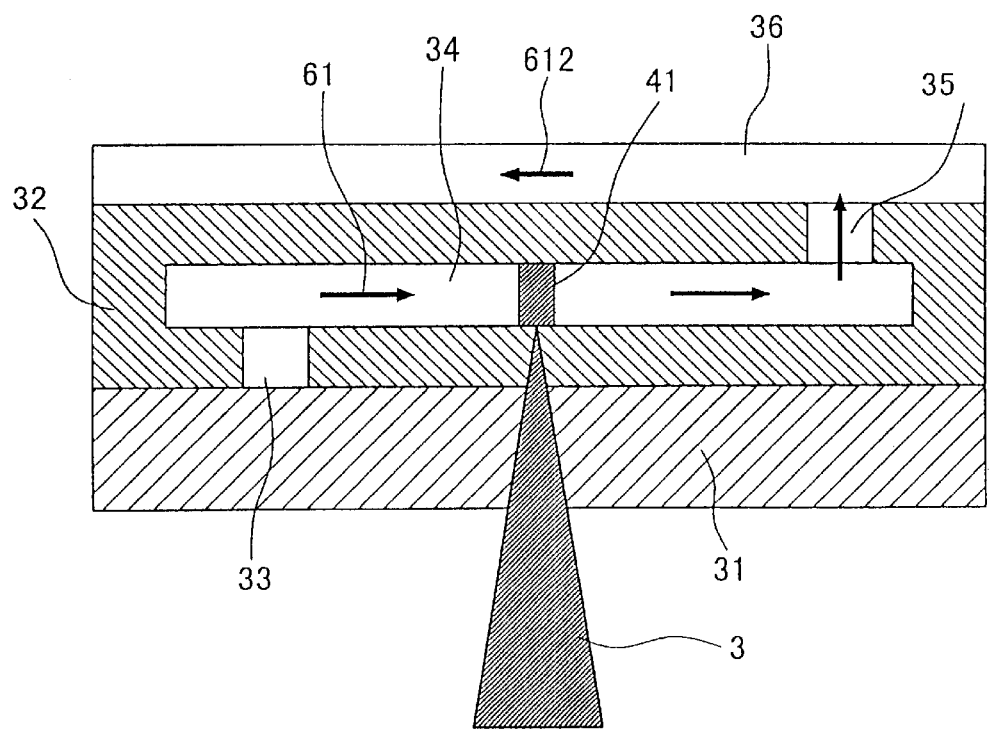
FIG. 28 is a sectional view showing a construction of a semiconductor device chip, which is in an intermediate stage of manufacture.
Figure 29:
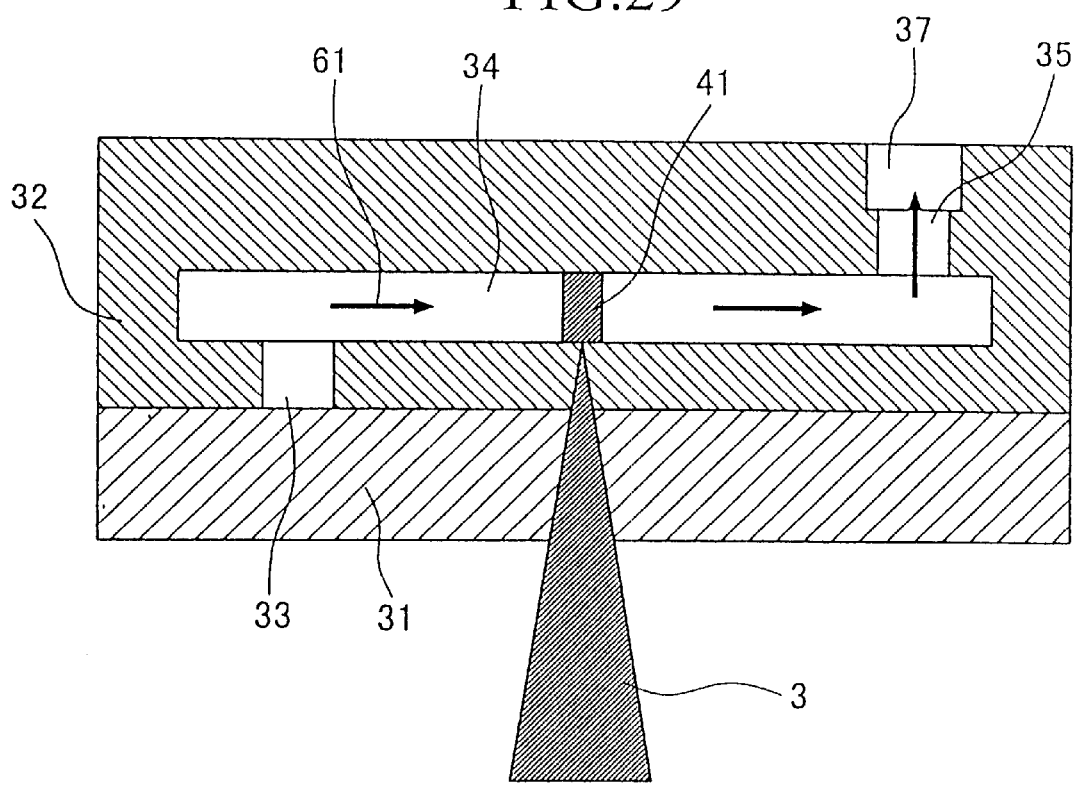
FIG. 29 is a sectional view showing a construction of a semiconductor device chip, which is in an intermediate stage of manufacture.

FIGS. 28 and 29 show other examples of semiconductor device chips, which are progressed in manufacture as compared with the semiconductor device chip 40 of FIG. 27.

Specifically, the semiconductor device chip of FIG. 28 is equipped with a metal film 36 which acts as a second-layer wire in addition to the aforementioned elements of the semiconductor device chip 40 of FIG. 27. Herein, the metal film 36 is formed on an overall surface of the semiconductor device chip 40. The semiconductor device chip of FIG. 29 is further progressed in manufacture, so that formation of a second-layer wire 37 is completed.

Each of the semiconductor device chips of FIGS. 27 to 29, which are in intermediate stages of manufacture respectively, contains a thermoelectromotive force generating defect 41. When the laser beam 3 is irradiated on the thermoelectromotive force generating defect 41, a thermoelectromotive 9 current is induced due to irradiation heating of the laser beam 3. Due to the thermoelectromotive current, a transient current flows across a open circuit in a current path shown by arrows 61 in FIGS. 27 to 29. As a result, a magnetic field is induced around the open circuit.

The magnetic field induced by the thermoelectromotive current is detected by the magnetic field detector 5. The control image processing system 106 produces illuminance values based on the detected magnetic field(s) to display an image on the screen of the image display device 7 in response to each laser scanning position. Thus, it is possible to obtain a scan magnetic field image, which represents distribution of the magnetic fields.

At the same time or in connection with the timing when the scan magnetic field image is produced, the device produces a scan laser microphotograph, which is an optical reflected image being formed in response to scanning to move the laser beam 3 or scanning to move the semiconductor device chip 40.

Thereafter, the normal image processing function is used to superimpose the scan magnetic filed image on the scan laser microphotograph, so that a composite image is displayed on the screen. Using such a composite image, it is possible to clearly recognize a position, at which contrast between light and shade emerges in the scan magnetic field image, on the scan laser microphotograph. Thus, it is possible to specify a position of a defect, which is a cause in occurrence of the thermoelectromotive current in the semiconductor device chip.

However, the aforementioned nondestructive inspection method has a drawback in which an enormous amount of cost is required to actualize the system. Because, the thermoelectromotive current, which is induced due to irradiation heating of the laser beam 3, flows only in the open circuit. The current flows in the open circuit in a relatively short duration. In that case, it is necessary to use a magnetic filed detector of high response speed, i.e., a magnetic filed detector whose cost is high.

Therefore, it is demanded to reduce a large amount of cost required for the nondestructive inspection for semiconductor integrated circuits.

Now, a description will be given with respect to a nondestructive inspection method as well as semiconductor device chips suited to such a nondestructive inspection method in detail.

Figure 21:
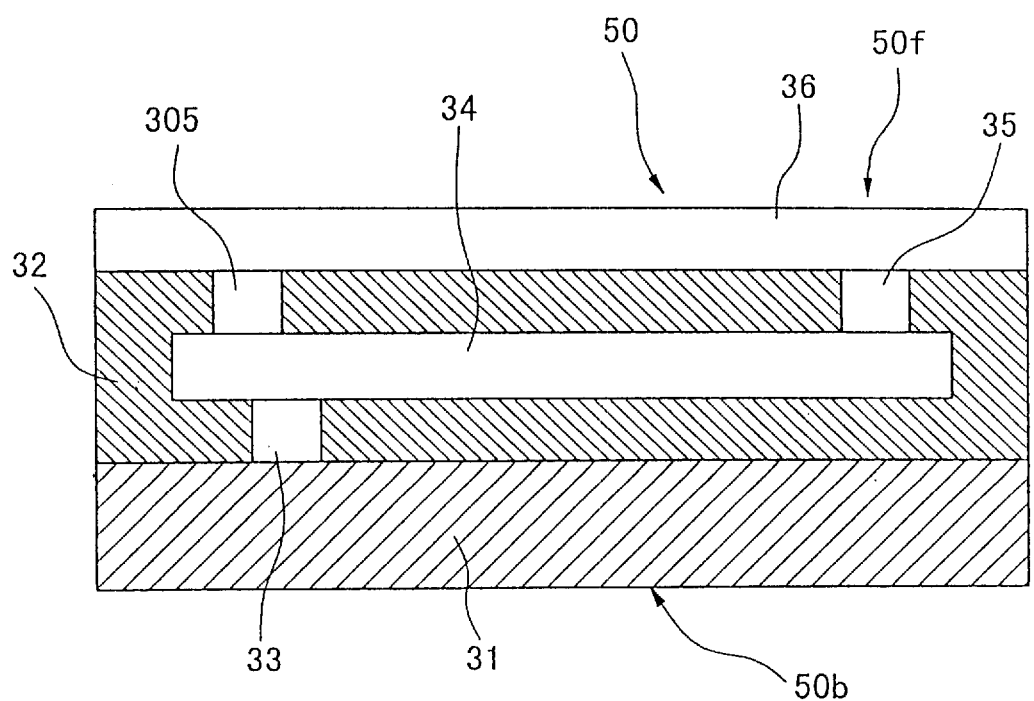
FIG. 21 is a sectional view showing a construction of a semiconductor device chip, which is in an intermediate stage of manufacture and which is suited to nondestructive inspection in accordance with embodiment C of the invention.

The aforementioned nondestructive inspection device of FIG. 1A is used to perform nondestructive inspection as to whether a defect is contained in a semiconductor device chip 50 shown in FIG. 21, which is in an intermediate stage of manufacture. A laser beam 3 having a wavelength of 1300 nm is originally generated by the laser 1 and is narrowed down in irradiation range by the optical system 2. Such a laser beam 3 is irradiated on a back 50*b* (corresponding to a substrate) of the semiconductor device chip 50, which is in an intermediate stage of manufacture. The laser beam 3 is converged on a wiring portion in proximity to a surface 50*f* of the semiconductor device chip 50. Using the laser beam 3, the scanning is performed on the semiconductor device chip 50.

Next, a description will be given with respect to a construction of the semiconductor device chip 50 with reference to FIG. 21. An insulating layer 32 is formed on a silicon substrate 31. A first-layer wire 34 is connected to the silicon substrate 31 by a contact portion 33. A circuit via 35 and an inspection via 305 are formed on the first-layer wire 34. Those vias 35 and 305 are independently connected to end portions of the first-layer wire 34. A metal film 36 for formation of a second-layer wire is formed on an overall surface of the semiconductor device chip 50 above the vias 35 and 305. The metal film 36 is electrically connected to the vias 35 and 305.

Figure 22A:
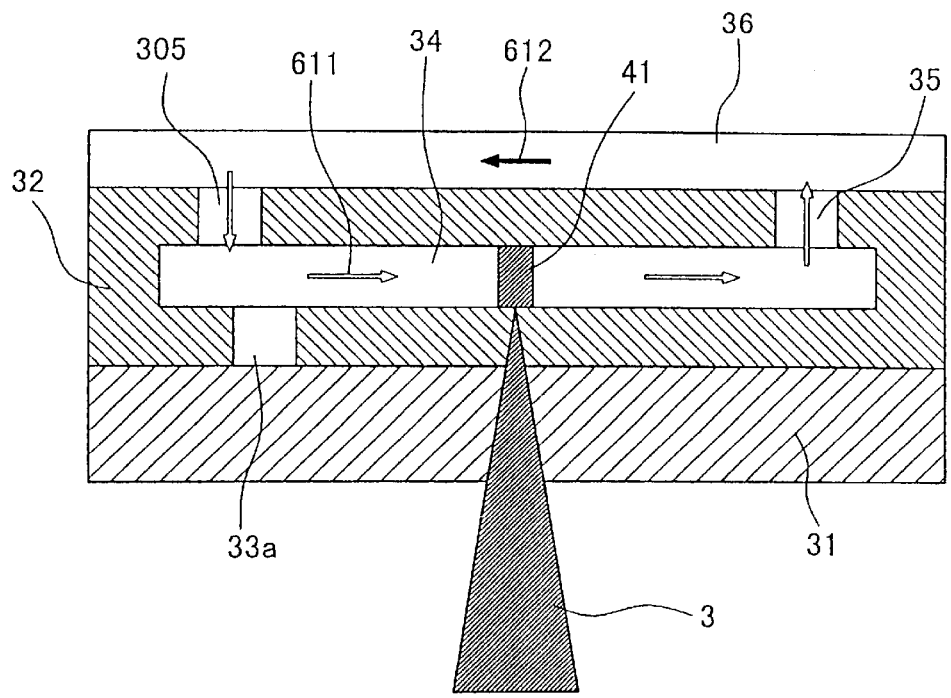
FIG. 22A is a sectional view showing the semiconductor device chip of FIG. 21 on which a laser beam is irradiated to cause a flow of a thermoelectromotive current.
Figure 22B:
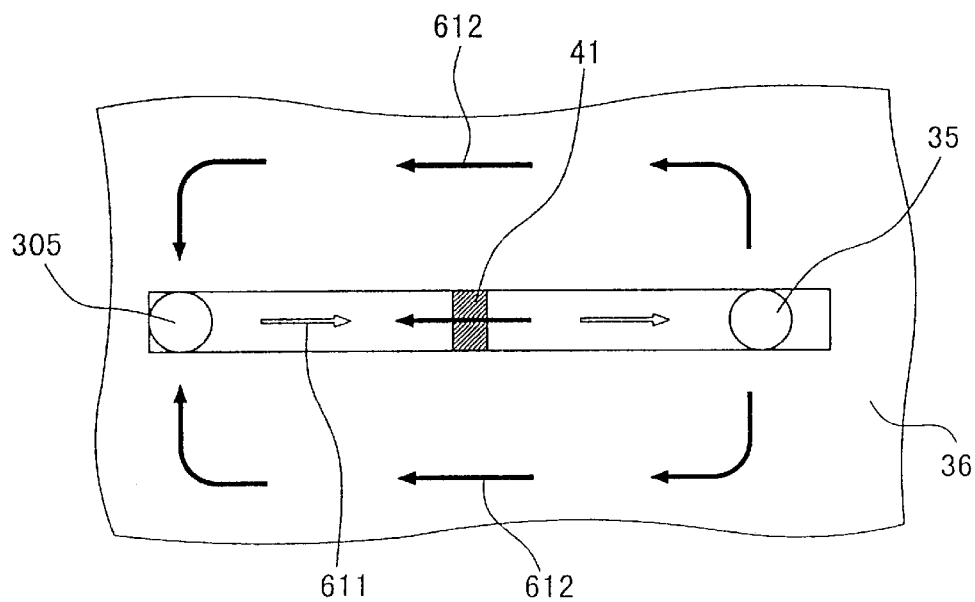
FIG. 22B is a fragmentary plan view showing selected parts of the semiconductor device chip of FIG. 21, in which the thermoelectromotive current flows.

Suppose that a thermoelectromotive force generating defect 41 exists in the semiconductor device chip 50 as shown in FIGS. 22A and 22B. When the laser beam 3 is irradiated on the thermoelectromotive force generating defect 41, a thermoelectromotive current is induced due to irradiating heating of the laser beam 3. The thermoelectromotive current flows along current paths, shown by arrows 611 and 612, in a closed circuit which is configured by the first-layer wire 34, circuit via 35, inspection via 305 and metal film 36.

As shown in FIGS. 22A and 22B, a current of the current path 611 flows in a narrow region corresponding to the first-layer wire 34, while a current of the current path 612 flows and spreads in a broad region corresponding to an overall area of the metal film 36. In addition, a direction of the current flowing the first-layer wire 34 is reverse to a direction of the current flowing the metal film 36.

Magnetic fields induced by the aforementioned currents are detected by the magnetic field detector 5. Then, a control image processing system 106 (which corresponds to the foregoing control image processing system 6 shown in FIG. 1A) produces luminance values based on the detected magnetic fields, by which images are displayed on the screen of the image display device 7 in response to laser scanning positions. Thus, it is possible to produce a scan magnetic field image, which represents distribution of the magnetic fields.

At the same time or in connection with the timing when the scan magnetic field image is produced, the device produces a scan laser microphotograph, which is an optically reflected image in response to the scanning to move the laser beam 3 or scanning to move the semiconductor device chip 50.

Thereafter, the normal image processing function is performed to superimpose the scan magnetic field image on the scan laser microphotograph, so a composite image is produced and displayed on the screen. Using such a composite image, it is possible to clearly recognize a position at which contrast between light and shade appears in the scan magnetic field image, on the scan laser microphotograph. Thus, it is possible to specify a position of a defect, which is a cause in occurrence of the thermoelectromotive current.

The aforementioned nondestructive inspection method basically works as follows:

A laser beam 3 is irradiated on the semiconductor device chip 50, which is in an intermediate stage of manufacture. So, a magnetic field is induced by a thermoelectromotive current, which is caused to occur in the semiconductor device chip 50 due to irradiation of the laser beam 3. A magnetic field detector detects a strength of the magnetic field, based on which an inspection is performed as to whether a defect exists in the semiconductor device chip 50 or not.

The aforementioned nondestructive inspection method does not require a current variation detector to be connected to the semiconductor device chip 50. Thus, it is possible to reduce a number of steps in work of the inspection, and it is possible to remarkably reduce the cost required for the nondestructive inspection.

In addition, it is possible to perform the inspection in upstream stages of manufacture before completion in formation of bonding pads. So, it is possible to feed back inspection results in early stages of manufacture in which added values are relatively small as compared with the conventional art.

Further, the semiconductor device chip 50 is constructed such that the metal film 36 for formation of the second-layer wire is formed after the circuit via 35 and the inspection via 305 are formed on the first-layer wire 34. This eases detection of the magnetic field. Reasons will be described below.

A current being caused due to thermoelectromotive force flows in the closed circuit, which is configured by the first-layer wire 34, circuit via 35, inspection via 305 and metal film 36. As compared with a current that flows in an open circuit, the above current may flow in the closed circuit for a long time. In addition, the current path 611 of the first-layer wire 34 is relatively narrow in width, so a magnetic field induced by the current flowing such a narrow current path 611 must be localized along the first-layer wire 34. In contrast, the current flowing the current path 612 of the metal film 36 spreads in a relatively broad range, so a magnetic field induced by the current is distributed in a broad range of area. The magnetic field induced by the current flowing the first-layer wire 34 is reverse to the magnetic field induced by the current flowing the metal film 36 in directions, so that those magnetic fields will cancel each other. However, as described above, they differ from each other in distribution ranges. Therefore, those magnetic fields may not cancel each other so much.

The present embodiment is designed to let a current being caused due to thermoelectromotive force flow across the closed circuit, by which it may be possible to increase an attenuation time of the current. In addition, different magnetic fields are induced by currents respectively flowing along different current paths in the closed circuit, but they do not cancel each other so much. So, it is possible to produce a magnetic field whose strength is high. Thus, it is possible to ease detection of the magnetic field. This will contribute to improvements in productivity and reliability of the semiconductor devices. In addition, it is possible to increase a number of situations in which magnetic fields induced by thermoelectromotive currents can be detected using a magnetic field detector whose response speed is slow, in other words, a magnetic field detector whose cost is not so high. Thus, it is possible to reduce the total cost required for the nondestructive inspection.

Figure 25:
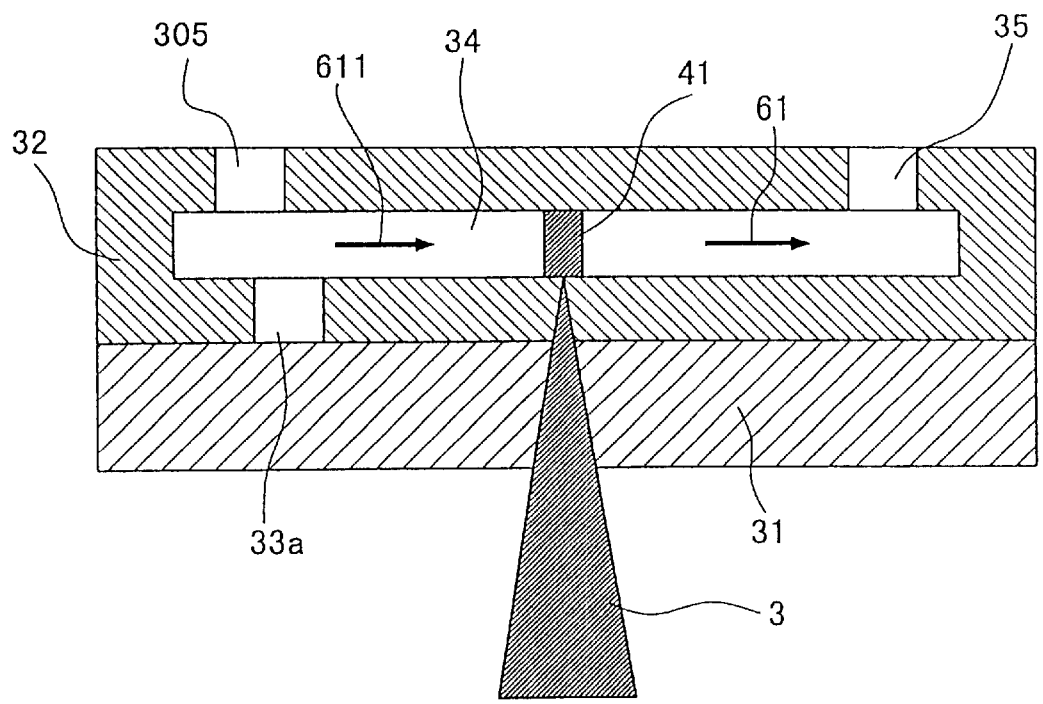
FIG. 25 is a sectional view showing a construction of a modified example of the semiconductor device chip, which is in an intermediate stage of manufacture.
Figure 26:
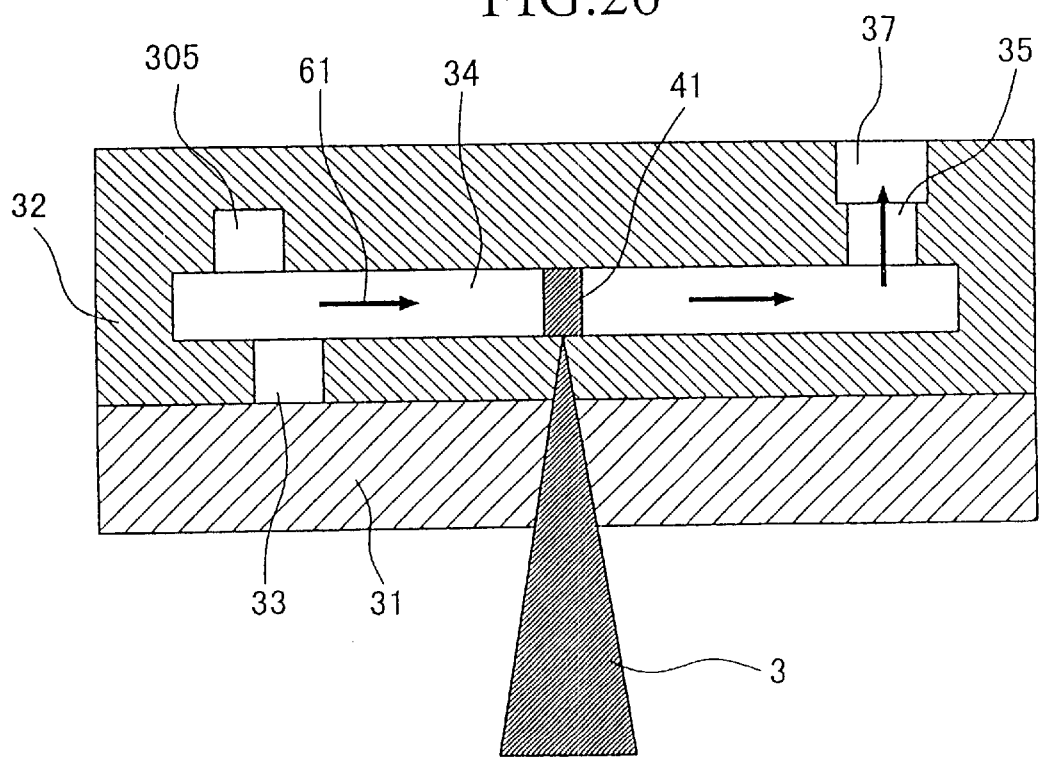
FIG. 26 is a sectional view showing a construction of a further modified example of the semiconductor device chip, which is in an intermediate stage of manufacture.

FIGS. 25 and 26 show other examples of semiconductor device chips, which are in intermediate stages of manufacture. When a laser beam 3 is irradiated on a back of the aforementioned semiconductor device chip, a current caused by thermoelectromotive force flows along a current path 61 of the first-layer wire 34, which does not correspond to a closed circuit. Therefore, such a current merely flows as a transient current, which is determined by parasitic capacitance as well as resistance of wiring and resistance of a thermoelectromotive force generating defect 41.

In some case, the above current flows along the current path 61 for an extremely short period of time. In order to detect a magnetic field induced by such current, it is necessary to prepare a magnetic field whose response speed is very fast and whose cost is high.

In order to form a closed circuit for the nondestructive inspection method, the semiconductor device chip 50 which is in an intermediate stage of manufacture is equipped with an inspection via 305. Herein, the inspection via 305 is connected to the first-layer wire 34 but is not connected to the second-layer wire. Therefore, the inspection via 305 does not (badly) influence original functions of the semiconductor device chip.

Figure 23:
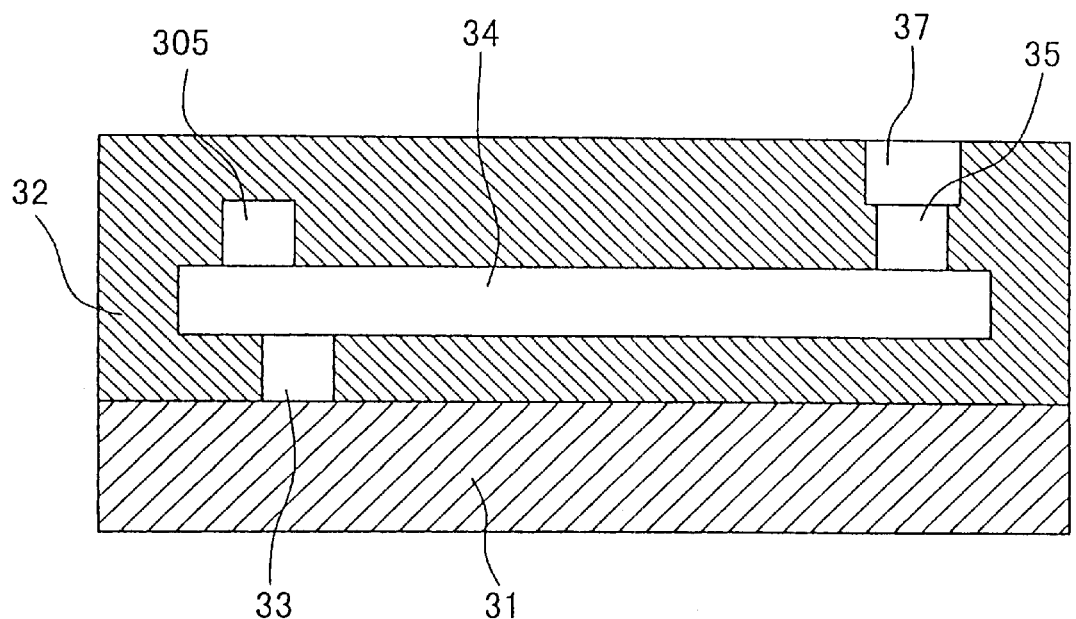
FIG. 23 is a sectional view showing a construction of the semiconductor device chip of FIG. 21, which is subjected to patterning to form a second-layer wire.

FIG. 23 shows a construction of the semiconductor device chip 50 of FIG. 21, which is subjected to patterning with respect to the metal film 36, so that a second-layer wire 37 is formed.

In the semiconductor device chip of FIG. 23 which is still in an intermediate stage of manufacture, the circuit via 35 is connected to the second-layer wire 37, which is arranged to be perpendicular to the first-layer wire 34 in elevation. In contrast to the circuit via 35, the inspection via 305 is not connected to the second-layer wire 37. Therefore, the inspection via does not (badly) influence original functions of the semiconductor device chip.

In the semiconductor device chip of FIG. 23, the circuit via 35 and the inspection via 305 are respectively connected to different end portions of the first-layer wire 34. So, it is possible to increase a length of the current path as maximally as possible. Thus, it is possible to increase a strength of a magnetic field being induced by a thermoelectromotive current flowing along the current path. Namely, it is possible to further ease detection of the magnetic field.

The nondestructive inspection method of the present embodiment is designed such that nondestructive inspection is performed on the semiconductor device chip 50, which is in the intermediate stage of manufacture and whose overall surface is covered with the metal film 36. So, it is possible to broaden an area of the current path in the metal film 36 as maximally as possible. Therefore, it is possible to broaden a range of distribution of the magnetic field being induced by the current flowing the current path at most. In other words, it is possible to increase differences between distribution ranges of magnetic fields, which are induced by the current of the first-layer wire 34 and the current of the metal film 36 respectively, as maximally as possible. Thus, it is possible to obtain a more intense magnetic field as a whole, so it is possible to ease detection of the magnetic field further more.

The nondestructive inspection method of the present embodiment is designed to use the laser beam. So, it is possible to efficiently heat a defective portion of the semiconductor device chip. Therefore, it is possible to produce thermoelectromotive force with a good sensitivity. Thus, it is possible to improve an accuracy in inspection of the semiconductor devices.

The present embodiment sets the wavelength of the laser beam 3 at 1300 nm. Therefore, it is possible to avoid occurrence of an OBIC current on the silicon substrate 31, which is a cause of the noise. Thus, it is possible to improve an accuracy of inspection of the semiconductor devices further more.

The laser beam whose wavelength is 1300 nm is capable of transmitting through the silicon substrate 31. So, it is possible to irradiate the laser beam 3 on the back (corresponding to the substrate) of the semiconductor device chip, while it is possible to arrange the magnetic field detector 5 in proximity to a surface 50f of the semiconductor device chip 50. Therefore, it is possible to perform magnetic field detection at a location at which the strength of the magnetic field is high. Thus, it is possible to further improve a detection sensitivity for the magnetic field.

Next, a description will be given with respect to another example of the nondestructive inspection method, which is performed on a semiconductor device chip shown in FIG. 24, which is in an intermediate stage of manufacture.

Figure 24:
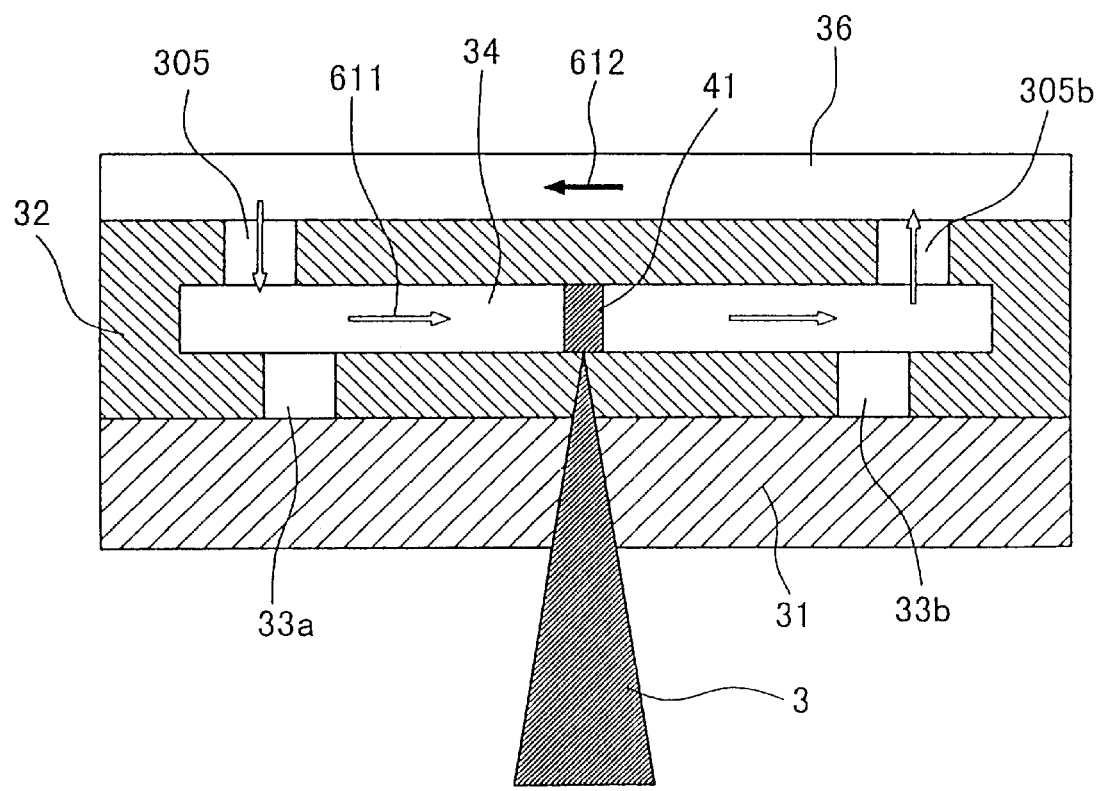
FIG. 24 is a sectional view showing a construction of another example of the semiconductor device chip, which is in an intermediate stage of manufacture.

In the semiconductor device chip of FIG. 24, two contact portions 33a and 33b are formed on the silicon substrate 31. So, the first-layer wire 34 is connected between diffusion layers by the contact portions 33a, 33b. In addition, the semiconductor device chip of FIG. 24 is not equipped with the circuit via 35 to be connected to the metal film 36.

The semiconductor device chip of FIG. 24 is characterized by providing two inspection vias 305a, 305b, which are connected to end portions of the first-layer wire 34 respectively.

Further, the semiconductor device chip of FIG. 24 contains a thermoelectromotive force generating defect 41. So, a thermoelectromotive current is caused to occur due to irradiation heating of the laser beam 3, which is irradiated on the thermoelectromotive force generating defect 41. The thermoelectromotive current flows in a closed circuit, which is configured by the first-layer wire 34, inspection vias 305a, 305b and metal film 36. Herein, the current flows in different directions shown by arrows 611, 612 in the closed circuit.

Like the aforementioned nondestructive inspection method, the present nondestructive inspection method is designed to inspect defectiveness of the semiconductor device chip. So, it is unnecessary to connect the foregoing current variation detector to the semiconductor device chip. Thus, it is possible to remarkably reduce a number of steps for work of inspection and an amount of cost.

As compared with the conventional art, it is possible to feed back inspection results in upstream stages of manufacture in which added values are small.

In addition, the present nondestructive inspection method is designed such that the metal film 36 is formed on the semiconductor device chip after formation of the inspection vias 305a, 305b. So, it is possible to ease magnetic field detection.

As compared with the current flowing in the open circuit, the thermoelectromotive current flows in the closed circuit, configured by the first-layer wire 34, inspection vias 305a, 305b and metal film 36, for a long time. In addition, the current path 611 of the first-layer wire 34 is relatively narrow in width, so a magnetic field induced by the current flowing along the current path 611 is localized along the first-layer wire 34. In contrast, the current flowing along the current path 612 of the metal film 36 is distributed in a relatively broad range of area, so a magnetic field induced by the current is distributed in a broad range of area as well. The magnetic field induced by the current flowing the first-layer wire 34 differs from the magnetic field induced by the current flowing the metal film 36 in directions, by which those magnetic fields cancel each other. However, those magnetic fields do not cancel each other so much because they have different distribution ranges.

Because the thermoelectromotive current flows in the closed circuit, it is possible to increase an attenuation time of the current. In addition, the magnetic fields, which are induced by the currents flowing across the closed circuit along different current paths, do not cancel each other so much. So, it is possible to produce a strong magnetic field as a whole. Therefore, it is possible to increase a number of situations in which magnetic field detection can be performed with ease. This contributes to improvements in productivity and reliability of the semiconductor devices. In addition, it is possible to perform inspection using the magnetic field detector whose response speed is fast and whose cost is relatively low. Thus, it is possible to reduce the total cost required for the inspection.

Further, the inspection vias 305a, 305b are arranged to be connected to end portions of the first-layer wire 34 respectively. So, it is possible to increase a length of the current path as maximally as possible. Therefore, it is possible to increase a strength of the magnetic field induced by the thermoelectromotive current. This eases the magnetic field detection further more.

The present nondestructive inspection method is performed on the semiconductor device chip, which is in an intermediate stage of manufacture and which is equipped with two wiring layers, i.e., first-layer wire and second-layer wire. Of course, it is possible to perform the nondestructive inspection on other semiconductor device chips, which are in intermediate stages of manufacture and which are equipped with a multilayer structure for wiring over two layers. In short, the present embodiment is not necessarily limited to a number of layers for wiring.

The present nondestructive inspection method is performed on the semiconductor device chip, which is equipped with a second-layer wire made of metal material. Of course, the nondestructive inspection can be ant performed on other semiconductor device chips whose second-layer wires are made of other materials such as silicide and polycrystalline silicon. In short, the present embodiment is not necessarily limited to materials used for the second-layer wires.

The present embodiment uses the laser beam for the inspection. Instead of the laser beam, it is possible to use an electron beam or ion beam.

In order to increase possibilities in detection of defects of the semiconductor device chips, it is preferable to equip a single semiconductor device chip with a number of inspection vias, which is increased as large as possible. That is, it is preferable to form a number of closed circuits, which is increased as large as possible.

As this invention may be embodied in several forms without departing from the spirit of essential characteristics thereof, the present embodiments and examples are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A semiconductor device for nondestructive inspection, comprising:
   a first conductor being formed on a substrate;
   a second conductor being formed on the substrate in proximity to the first conductor;
   a thermoelectromotive force generator being formed, on the substrate;
   a first wire for connecting a first end of the thermoelectromotive force generator to the first conductor;
   a second wire for connecting a second end of the thermoelectromotive force generator to the second conductor; and
   wherein the first wire and the second wire are formed using a same material to be integrally connected to each other by way of the thermoelectromotive force generator, a width of which is made smaller than the first and second wires.

2. A semiconductor device according to claim 1 wherein the material corresponds to titanium silicide.

3. A semiconductor device for nondestructive inspection, comprising:
   a first conductor being formed on a substrate;
   a second conductor being formed on the substrate in proximity to the first conductor;
   a thermoelectromotive force generator being formed, on the substrate;
   a first wire for connecting a first end of the thermoelectromotive force generator to the first conductor;
   a second wire for connecting a second end of the thermoelectromotive force generator to the second conductor; and
   wherein the first and second conductors correspond to wires respectively.

4. A semiconductor device for nondestructive inspection, comprising:
   a first conductor being formed on a substrate;
   a second conductor being formed on the substrate in proximity to the first conductor;
   a thermoelectromotive force generator being formed, on the substrate;
   a first wire for connecting a first end of the thermoelectromotive force generator to the first conductor;
   a second wire for connecting a second end of the thermoelectromotive force generator to the second conductor; and
   wherein the first and second conductors are elongated on the substrate by way of an insulating layer, while the first and second wires and the thermoelectromotive force generator are formed on the insulating layer above the first and second conductors.

5. A semiconductor device according to claim 4 wherein the first and second conductors are respectively connected to the first and second wires by means of vias, which penetrate through the insulating layer.

6. A semiconductor device for nondestructive inspection, comprising:
   a first conductor being formed on a substrate;
   a second conductor being formed on the substrate in proximity to the first conductor;

a thermoelectromotive force generator being formed, on the substrate;

a first wire for connecting a first end of the thermoelectromotive force generator to the first conductor;

a second wire for connecting a second end of the thermoelectromotive force generator to the second conductor; and wherein at least one the first and second conductors is elongated substantially in parallel with at least one of the first and second wires and is different from at least one of the first and second wires in width.

7. A semiconductor device for nondestructive inspection, comprising:

a first conductor being formed on a substrate;

a second conductor bring formed on the substrate in proximity to the first conductor;

a thermoectromotive force generator being formed, on the substrate;

a first wire for connecting a first end of the thermoelectromotive force generator to the first conductor;

a second wire for connecting a second end of the thermoelectromotive force generator to the second conductor;

wherein the first and second conductors are elongated in a first direction and arranged in parallel with each other, while the first and second wires and the thermoelectromotive force generator are arranged along a second direction that crosses the first direction.

8. A semiconductor device for nondestructive inspection, comprising:

a first conductor being formed on a substrate;

a second conductor being formed on the substrate in proximity to the first conductor;

a thermoelectromotive force generator being formed, on the substrate;

a first wire for connecting a first end of the thermoelectromotive force generator to the first conductor;

a second wire for connecting a second end of the thermoelectromotive force generator to the second conductor; and wherein first and second conductors are respectively connected to the first and second wires by way of inspection vias.

9. A semiconductor device for nondestructive inspection, comprising:

a first conductor being formed on a substrate;

a second conductor being formed on the substrate in proximity to the first conductor;

a thermoelectromotive force generator being formed, on the substrate;

a first wire for connecting a first end of the thermoelectromotive force generator to the first conductor;

a second wire for connecting a second end of the thermoelectromotive force generator to the second conductor; and wherein at least one of the first and second wires is composed of a plurality of wires, which are formed in different levels respectively.

10. A semiconductor device for nondestructive inspection, comprising:

a first conductor being formed on a substrate;

a second conductor being formed on the substrate in proximity to the first conductor;

a thermoelectromotive force generator being formed, on the substrate;

a first wire for connecting a first end of the thermoelectromotive force generator to the first conductor;

a second wire for connecting a second end of the thermoelectromotive force generator to the second conductor; and wherein at least one of the first and second wires are formed integrally together with one of the first and second conductors.

11. A semiconductor device for nondestructive inspection, comprising:

a first conductor being formed on a substrate;

a second conductor being formed on the substrate in proximity to the first conductor;

a thermoelectromotive force generator being formed, on the substrate;

a first wire for connecting a first end of the thermoelectromotive force generator to the first conductor;

a second wire for connecting a second end of the thermoelectromotive force generator to the second conductor; and wherein the thermoelectromotive force generator is arranged at a position, at which a laser beam irradiated on a back of the substrate reaches without being interrupted by a structural element.

12. A semiconductor device according to claim 11 wherein the structural element corresponds to a wire.

13. A semiconductor integrated circuit comprising:

a n-layer wire (where "n" is an integer arbitrarily selected) formed on a substrate;

a (n+1)-layer wire formed above the n-layer wire via an insulating layer;

a circuit via for connecting the n-layer wire and the (n+1)-layer wire together; and at least one inspection via formed on the n-layer wire, wherein the inspection via is connected to the n-layer wire but is not connected to the (n+1)-layer wire.

14. A semiconductor integrated circuit comprising:

a n-layer wire (where "n" is an integer arbitrarily selected) formed on a substrate;

a (n+1)-layer wire formed above the n-layer wire via an insulating layer;

at least two inspection vias formed on the n-layer wire, wherein the inspection vias are connected to the n-layer wire but are not connected to the (n+1)-layer wire, and wherein no circuit via for connecting the n-layer wire and the (n+1)-layer wire together is provided on the n-layer wire having the inspection vias.

15. A semiconductor integrated circuit according to claim 14 wherein end portions of the n-layer wire are connected to diffusion layers formed on the substrate.

16. A semiconductor integrated circuit according to any one of claims 13 to 15 wherein the inspection via is connected to an end portion of the n-layer wire.

17. A semiconductor device chip comprising:

a silicon substrate;

a first-layer wire formed above the substrate;

a contact portion for connecting the first-layer wire to a diffusion layer formed on the substrate;

a circuit via formed on a first end portion of the first-layer wire;

an inspection via formed on a second end portion of the first-layer wire; and a metal film, which is formed in a relatively broad range of a surface area and a selected area of which is used for formation of a second-layer wire, wherein the first end portion of the first-layer wire is connected to the metal film, corresponding to the formation of the second-layer wire, by the circuit via, while the second end portion of the first-layer wire is temporarily connected to the metal film, which does not correspond to the formation of the second-layer wire, by the inspection via.

18. A semiconductor device chip according to claim 17 wherein the first-layer wire is made of titanium silicide.

19. A semiconductor device chip according to claim 18 wherein a part of the first-layer wire corresponds to a thermoelectromotive force generating defect, to which a laser beam is to be irradiated.

* * * * *